United States Patent
Soci et al.

(10) Patent No.: US 9,711,760 B2
(45) Date of Patent: Jul. 18, 2017

(54) LIGHT-EMITTING DEVICE, METHOD OF FORMING AND OPERATING THE SAME

(71) Applicant: Nanyang Technological Unversity, Singapore (SG)

(72) Inventors: Cesare Soci, Singapore (SG); Xin Yu Chin, Singapore (SG); Daniele Cortecchia, Singapore (SG); Annalisa Bruno, Singapore (SG); Jun Yin, Singapore (SG); Francesco Maddalena, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 15/199,185

(22) Filed: Jun. 30, 2016

(65) Prior Publication Data
US 2017/0005296 A1    Jan. 5, 2017

(30) Foreign Application Priority Data

Jun. 30, 2015   (SG) .............................. 10201505194

(51) Int. Cl.
G09G 3/10      (2006.01)
H01L 51/52    (2006.01)
(Continued)

(52) U.S. Cl.
CPC .......... H01L 51/5296 (2013.01); H01L 27/32 (2013.01); H01L 51/0077 (2013.01);
(Continued)

(58) Field of Classification Search
None
See application file for complete search history.

(56) References Cited

U.S. PATENT DOCUMENTS

| | | | |
|---|---|---|---|
| 6,180,956 B1 | 1/2001 | Chondroudis et al. | |
| 2016/0226011 A1* | 8/2016 | Nazeeruddin | ......... H01L 51/442 |
| 2017/0054099 A1* | 2/2017 | Friend | ................. H01L 51/5012 |

OTHER PUBLICATIONS

Amat et al., "Cation-Induced Band-Gap Tuning in Organohalide Perovskites: Interplay of Spin-Orbit Coupling and Octahedra Tilting", Nano Letters 14, 2014, United States, pp. 3608-3616.
(Continued)

*Primary Examiner* — Anh Tran
(74) *Attorney, Agent, or Firm* — Wells St. John P.S.

(57) ABSTRACT

In various embodiments, a light-emitting device may be provided including an active structure including a halide perovskite layer. The light-emitting device may further include a first injection electrode and a second injection electrode electrically coupled to the active structure. The light-emitting device may additionally include a control electrode, and an insulator layer between the control electrode and the active structure. The first injection electrode may be configured to inject electrons into the active structure and the second injection electrode may be configured to inject holes into the active structure upon application of a potential difference between the first injection electrode and the second injection electrode. The control electrode may be configured to generate an electric field upon application of a voltage, thereby causing accumulation of the electrons and the holes in a region of the halide perovskite layer so that the electrons and the holes recombine, thereby emitting light.

20 Claims, 43 Drawing Sheets

(51) Int. Cl.
  H01L 51/50    (2006.01)
  H01L 27/32    (2006.01)
  H01L 51/56    (2006.01)
  H05B 33/08    (2006.01)
  H01L 51/00    (2006.01)
(52) U.S. Cl.
  CPC ...... *H01L 51/5012* (2013.01); *H01L 51/5056* (2013.01); *H01L 51/5072* (2013.01); *H01L 51/56* (2013.01); *H05B 33/0896* (2013.01)

(56) References Cited

OTHER PUBLICATIONS

Bergmann et al., "Real-Space Observation of Unbalanced Charge Distribution Inside a Perovskite-Sensitized Solar Cell", Nature Communications 5:5001, 2014, United Kingdom, pp. 1-9.
Bisri et al., "Outlook and Emerging Semiconducting Materials for Ambipolar Transistors", Advanced Materials 26, 2014, Germany, pp. 1176-1199.
Boix et al., "Current Progress and Future Perspectives for Organic/Inorganic Perovskite Solar Cells", Materials Today 17, 2014, Netherlands, pp. 16-23.
Burschka et al., "Sequential Deposition as a Route to High-Performance Perovskite-Sensitized Solar Cells", Nature 499, 2013, United Kingdom, pp. 316-319.
Capelli et al., "Organic Light-Emitting Transistors with an Efficiency That Outperforms the Equivalent Light-Emitting Diodes", Nature Materials 9, 2010, United Kingdom, pp. 496-503.
Chen et al., "Origin of the Different Transport Properties of Electron and Hole Polarons in an Ambipolar Polyselenophene-Based Conjugated Polymer". Physical Review B 84, 2011, United States, pp. 115211-1-115211-14.
D'Innocenzo et al., "Tuning the Light Emission Properties by Band Gap Engineering in Hybrid Lead Halide Perovskite", Journal of the American Chemical Society 136, 2014, United States, pp. 17730-17733.
Deschler et al., "High Photoluminescence Efficiency and Optically Pumped Lasing in Solution-Processed Mixed Halide Perovskite Semiconductors", Journal of Physical Chemistry Letters 5, 2014, United States, pp. 1421-1426.
Dong et al., "Electron-Hole Diffusion Lengths > 175 mm in Solution-Grown $CH_3NH_3PbI_3$ Single Crystals", Science 347, 2015, United States, pp. 967-970.
Edri et al., "Elucidating the Charge Carrier Separation and Working Mechanism of $CH_3NH_3PbI_{3-x}Cl_x$ Perovskite Solar Cells", Nature Communications 5:3641, 2014, United Kingdom, pp. 1-8.
Egger et al., "Perovskite Solar Cells: Do We Know What We Do Not Know?", Journal of Physical Chemistry Letters 6, 2015, United States, pp. 279-282.
Even et al., "Analysis of Multivalley and Multibandgap Absorption and Enhancement of Free Carriers Related to Exciton Screening in Hybrid Perovskites", Journal of Physical Chemistry C 118, 2014, United States, pp. 11566-11572.
Fang et al., "Photophysics of Organic-Inorganic Hybrid Lead Iodide Perovskite Single Crystals", Advanced Functional Materials, 2015, Germany, pp. 1-8.
Frost et al., "Atomistic Origins of High-Performance in Hybrid Halide Perovskite Solar Cells", Nano Letters 14, 2014, United States, pp. 2584-2590.
Frost et al., "Molecular Ferroelectric Contributions to Anomalous Hysteresis in Hybrid Perovskite Solar Cells", APL Materials 2, United States, pp. 081506-1-081506-10.
Gao et al., "Organohalide Lead Perovskites for Photovoltaic Applications", Energy and Environmental Sciences 7, 2014, United Kingdom, pp. 2448-2463.
Garrity et al., "Pseudopotentials for High-Throughput DFT Calculations", Computational Materials Science 81, 2014, Netherlands, pp. 446-452.
Giannozzi et al., "Quantum Espresso: A Modular and Open-Source Software Project for Quantum Simulations of Materials", Journal of Physics Condensed Matter 21, 2009, United Kingdom, pp. 1-19.
Gil-Escrig et al., "Efficient Photovoltaic and Electroluminescent Perovskite Devices", Chemical Communications 51, 2015, United Kingdom, pp. 569-571.
Giorgi et al., "Small Photocarrier Effective Masses Featuring Ambipolar Transport in Methylammonium Lead Iodide Perovskite: A Density Functional Analysis", Journal of Physical Chemistry Letters 4, 2013, United States, pp. 4213-4216.
Gonzalez-Pedro et al., "General Working Principles of $CH_3NH_3PbX_3$ Perovskite Solar Cells", Nano Letters 14, 2014, United States, pp. 888-893.
Green et al, "The Emergence of Perovskite Solar Cells", Nature Photonics 8, 2014, United Kingdom, pp. 506-514.
He et al., "Perovskites for Solar Thermoelectric Applications: A First Principle Study of $CH_3NH_3AI_3$ (A=Pb and Sn)", Chemistry of Materials 26, 2014, United States, pp. 5394-5400.
Heo et al., "Efficient Inorganic-Organic Hybrid Heterojunction Solar Cells Containing Perovskite Compound and Polymeric Hole Conductors", Nature Photonics 7, 2013, United Kingdom, pp. 486-491.
Hoye et al., "Enhanced Performance in Fluorene-Free Organometal Halide Perovskite Light-Emitting Diodes Using Tunable, Low Electron Affinity Oxide Electron Injectors", Advanced Materials 27, 2015, Germany, pp. 1414-1419.
Jeon et al., "Solvent Engineering for High-Performance Inorganic-Organic Hybrid Perovskite Solar Cells", Nature Materials 13, 2014, United Kingdom, pp. 897-903.
Juarez-Perez et al., "Photoinduced Giant Dielectric Constant in Lead Halide Perovskite Solar Cells", Journal of Physical Chemistry Letters 5, 2014, United States, pp. 2390-2394.
Kagan et al., "Organic-Inorganic Hybrid Materials as Semiconducting Channels in Thin-Film Field-Effect Transistors", Science 286, 1999, United States, pp. 945-947.
Kim et al., "Organolead Halide Perovskite: New Horizons in Solar Cell Research", Journal of Physical Chemistry C 118, 2014, United States, pp. 5615-5625.
Kojima et al., "Organometal Halide Perovskites as Visible-Light Sensitizers for Photovoltaic Cells", Journal of the American Chemical Society 131, 2009, United States, pp. 6050-6051.
Kutes et al., "Direct Observation of Ferroelectric Domains in Solution-Processed $CH_3NH_3PbI_3$ Perovskite Thin Films", Journal of Physical Chemistry Letters 5, 2014, United States, pp. 3335-3339.
Lee et al., "Efficient Hybrid Solar Cells Based on Meso-Superstructured Organometal Halide Perovskites", Science 338, 2012, United States, pp. 643-647.
Liu et al., "Efficient Planar Heterojunction Perovskite Solar Cells by Vapour Deposition", Nature 501, 2013, United Kingdom, pp. 395-398.
Luo et al., "Water Photolysis at 12.3% Efficiency Via Perovskite Photovoltaics and Earth-Abundant Catalysts", Science 345, 2014, United States, pp. 1593-1596.
Ma et al., "Nanoscale Charge Localization Induced by Random Orientations of Organic Molecules in Hybrid Perovskite $CH_3NH_3PbI_3$", Nano Letters 15, 2014, United States, pp. 248-253.
Mei et al., "Electrostatic Gating of Hybrid Halide Perovskite Field-Effect Transistors: Balanced Ambipolar Transport at Room-Temperature", MRS Communications 5, 2015, United States, pp. 297-301.
Mitzi et al., "Hybrid Field-Effect Transistor Based on a Low-Temperature Melt-Processed Channel Layer", Advanced Materials 14, 2002, Germany, pp. 1772-1776.
Mitzi et al., "Structurally Tailored Organic-Inorganic Perovskites: Optical Properties and Solution-Processed Channel Materials for Thin-Film Transistors", Chemistry of Materials 13, 2001, United States, pp. 3728-3740.
Muccini, "A Bright Future for Organic Field-Effect Transistors", Nature Materials 5, 2006, United Kingdom, pp. 605-613.
Nie et al., "High-Efficiency Solution-Processed Perovskite Solar Cells with Millimeter-Scale Grains", Science 347, 2015, United States, pp. 522-525.

(56) References Cited

OTHER PUBLICATIONS

Noh et al., "Chemical Management for Colorful, Efficient, and Stable Inorganic-Organic Hybrid Nanostructured Solar Cells", Nano Letters 13, 2013, United States, pp. 1764-1769.
Ravich et al., "Scattering of Current Carriers and Transport Phenomena in Lead Chacogenides" Physica Status Solidi B 43, 1971, Germany, pp. 11-33.
Salim et al., "Perovskite-Based Solar Cells: Impact of Morphology and Device Architecture on Device Performance", Journal of Materials Chemistry A 3, 2015, United Kingdom, pp. 8943-8969.
Shao et al., "Origin and Elimination of Photocurrent Hysteresis by Fullerene Passivation in $CH_3NH_3PbI_3$ Planar Heterojunction Solar Cells", Nature Communications 5, 2014, United Kingdom, pp. 1-7.
Shi et al., "Low Trap-State Density and Long Carrier Diffusion in Organolead Trihalide Perovskite Single Crystals", Science 347, 2015, United States, pp. 519-522.
Snaith et al., "Anomalous Hysteresis in Perovskite Solar Cells", Journal of Physical Chemistry Letters 5, 2014, United States, pp. 1511-1515.
Stoumpos et al., "Semiconducting Tin and Lead Iodide Perovskites with Organic Cations: Phase Transitions, High Mobilities, and Near-Infrared Photoluminescent Properties", Inorganic Chemistry 52, 2013, United States, pp. 9019-9038.
Stranks et al., "Electron-Hole Diffusion Lengths Exceeding 1 Micrometer in an Organometal Trihalide Perovskite Absorber", Science 342, 2013, United States, pp. 341-344.
Sutherland et al., "Conformal Organohalide Perovskites Enable Lasing on Spherical Resonators", ACS Nano 8, 2014, United States, pp. 10947-10952.
Swensen et al., "Light Emission from an Ambipolar Semiconducting Polymer Field-Effect Transistor", Applied Physics Letters 87, 2005, United States, pp. 253511-1-253511-3.
Tan et al., "Bright Light-Emitting Diodes Based on Organometal Halide Perovskite", Nature Nanotechnology 9, 2014, United Kingdom, pp. 687-692.
Toshinori et al., "Organic-Inorganic Field Effect Transistor with SnI-Based Perovskite Channel Layer Using Vapor Phase Deposition Technique", Proceedings of SPIE, vol. 5217, Organic Field Effect Transistors II, 2003, United States, pp. 43-54.
Umari et al., "Relativistic GW Calculations on $CH_3NH_3PbI_3$ and $CH_3NH_3SnI_3$ Perovskites for Solar Cell Applications", Scientific Reports 4, 2014, United Kingdom, pp. 1-7.
Unger et al., "Hysteresis and Transient Behavior in Current-Voltage Measurements of Hybrid-Perovskite Absorber Solar Cells", Energy and Environmental Sciences, 2014, United Kingdom, pp. 3690-3698.
Verlaak et al., "Numerical Simulation of Tetracene Light-Emitting Transistors: A Detailed Balance of Exciton Processes", Applied Physics Letters 85, 2004, United States, pp. 2405-2407.
Wang et al., "Density Functional Theory Analysis of Structural and Electronic Properties of Orthorhombic Perovskite $CH_3NH_3PbI_3$ ", Physical Chemistry Chemical Physics 16, 2014, United Kingdom, pp. 1424-1429.
Wang et al., "Qualifying Composition Dependent p and n Self-Doping in $CH_3NH_3PbI_3$ ", Applied Physics Letters 105, 2014, United States, pp. 163508-1-163508-5.
Wang et al., "Weak Electron-Phonon Coupling Contributing to High Thermoelectric Performance in n-Type PbSe", Proceedings of the National Academy of Sciences USA 109, 2012, United States, pp. 9705-9709.
Wehrenfennig et al., "High Charge Carrier Mobilities and Lifetimes in Organolead Trihalide Perovskites", Advanced Materials 26, 2014, Germany, pp. 1584-1589.
Wu et al., "Temperature-Dependent Excitonic Photoluminescence of Hybrid Organometal Halide Perovskite Films", Physical Chemistry Chemical Physics 16, 2014, United Kingdom, pp. 22476-22481.
Xiao et al., "Giant Switchable Photovoltaic Effect in Organometal Trihalide Perovskite Devices", Nature Materials 14, 2015, United Kingdom, pp. 193-198.
Xing et al., "Long-Range Balanced Electron- and Hole-Transport Lengths in Organic-Inorganic $CH_3NH_3PbI_3$", Science 342, 2013, United States, pp. 344-347.
Xing et al., "Low-Temperature Solution-Processed Wavelength-Tunable Perovskites for Lasing", Nature Materials 13, 2014, United Kingdom, pp. 476-480.
Zaumseil et al., "Electron and Ambipolar Transport in Organic Field-Effect Transistors", Chemical Reviews 107, 2007, United States, pp. 1296-1323.
Zhou et al., "Interface Engineering of Highly Efficient Perovskite Solar Cells", Science 345, 2014, United States, pp. 542-546.

\* cited by examiner

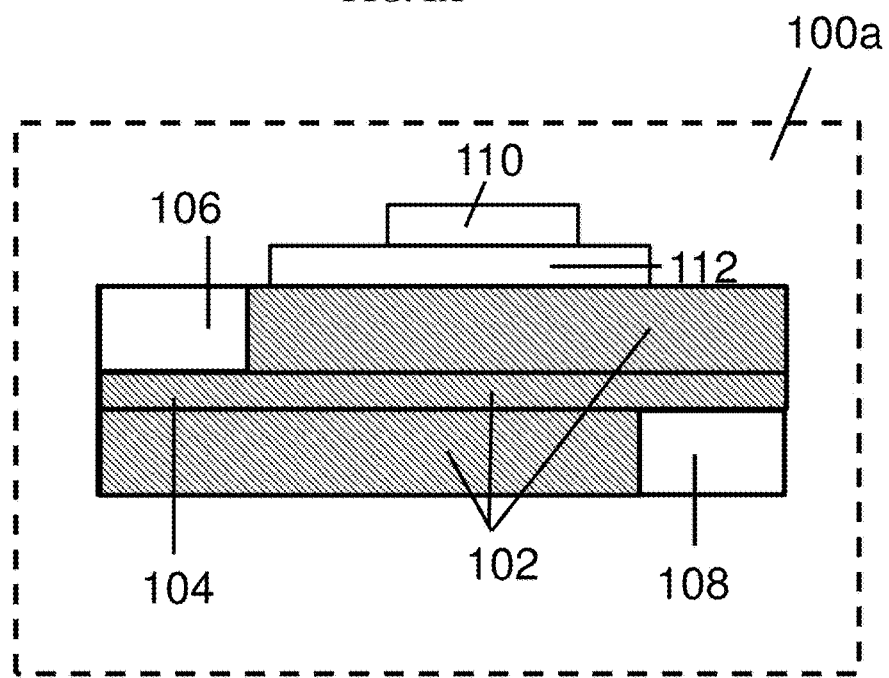

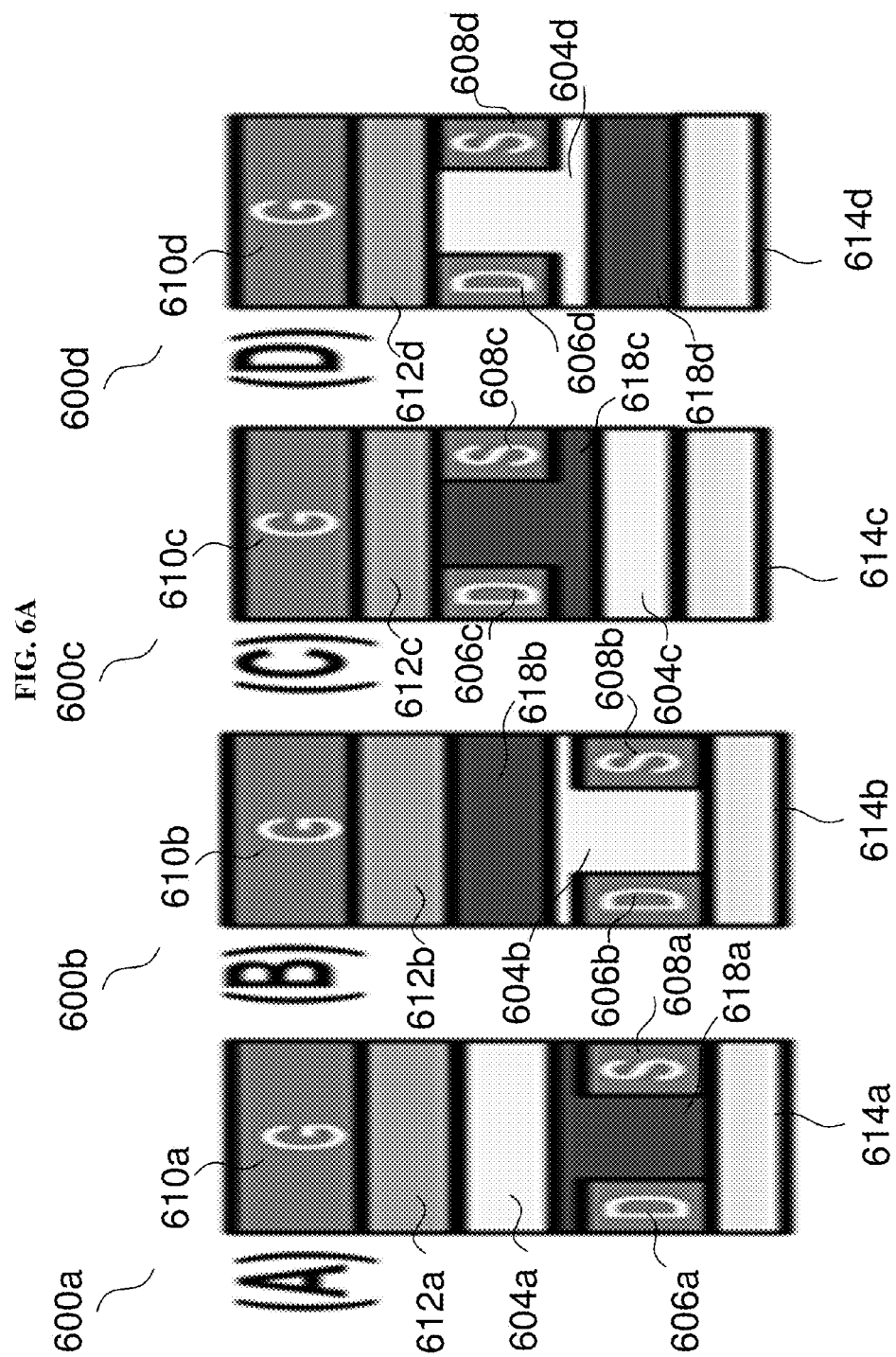

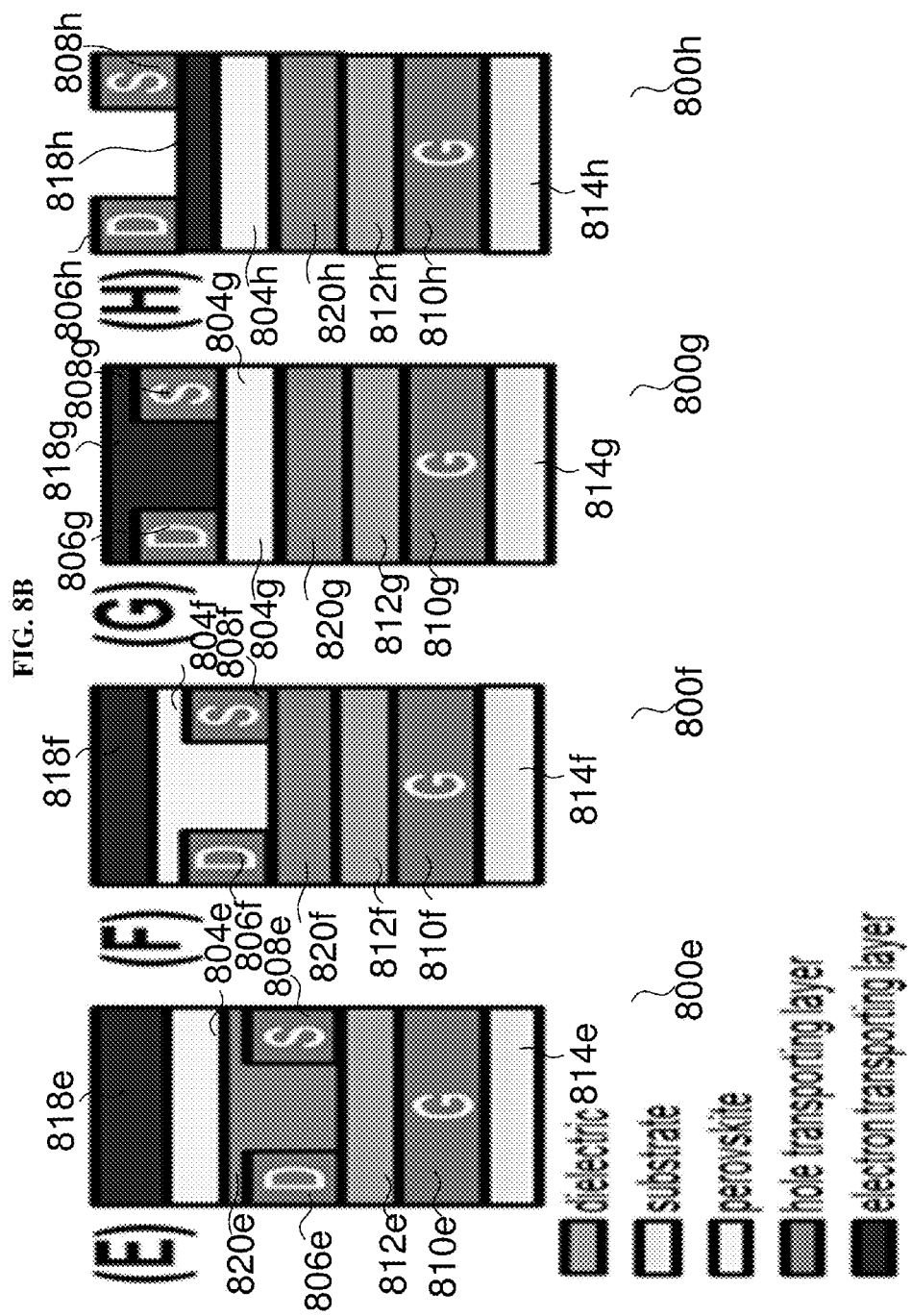

FIG. 15

1500 form an active structure comprising an emissive halide perovskite layer

1502 form a first injection electrode electrically coupled to the active structure

1504 form a second injection electrode electrically coupled to the active structure

1506 form a control electrode

1508 form an insulator layer between the control electrode and the active structure

1510

1700a

1700b

1700d

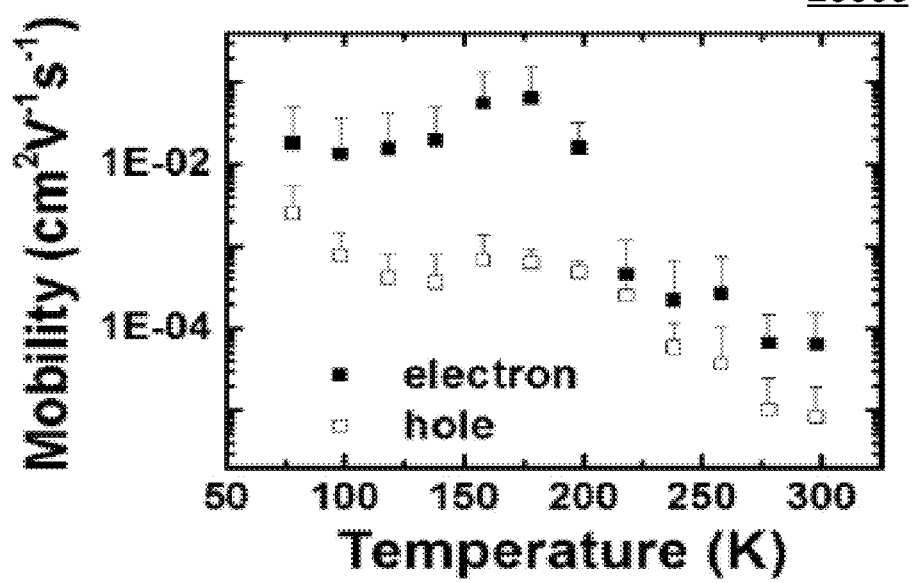

FIG. 20G

| Phase | | $m_e^*$ | $m_h^*$ | Reduced Masses |
|---|---|---|---|---|
| Tetragonal | Γ-X | 0.178 | 0.261 | 0.106 |
| | Γ-Z | 0.284 | 0.474 | 0.177 |
| | Γ-M | 0.129 | 0.284 | 0.089 |
| | Average | 0.197 | 0.340 | 0.124 |
| Orthorhombic | Γ-X | 0.289 | 0.344 | 0.157 |
| | Γ-Z | 0.189 | 0.370 | 0.125 |
| | Average | 0.239 | 0.357 | 0.143 |

| | Tetragonal | | Orthorhombic | |
|---|---|---|---|---|
| | Electron | Hole | Electron | Hole |
| $m_b^*$ | 0.197 | 0.340 | 0.239 | 0.357 |
| $m_l^*$ | 0.157 | 0.290 | 0.163 | 0.288 |
| $m^*$ | 0.166 | 0.304 | 0.173 | 0.291 |
| $E$ (eV) | 7.2 | 8.4 | 6.8 | 7.4 |
| $B$ (GPa) | 2.6 | 2.6 | 3.3 | 3.3 |

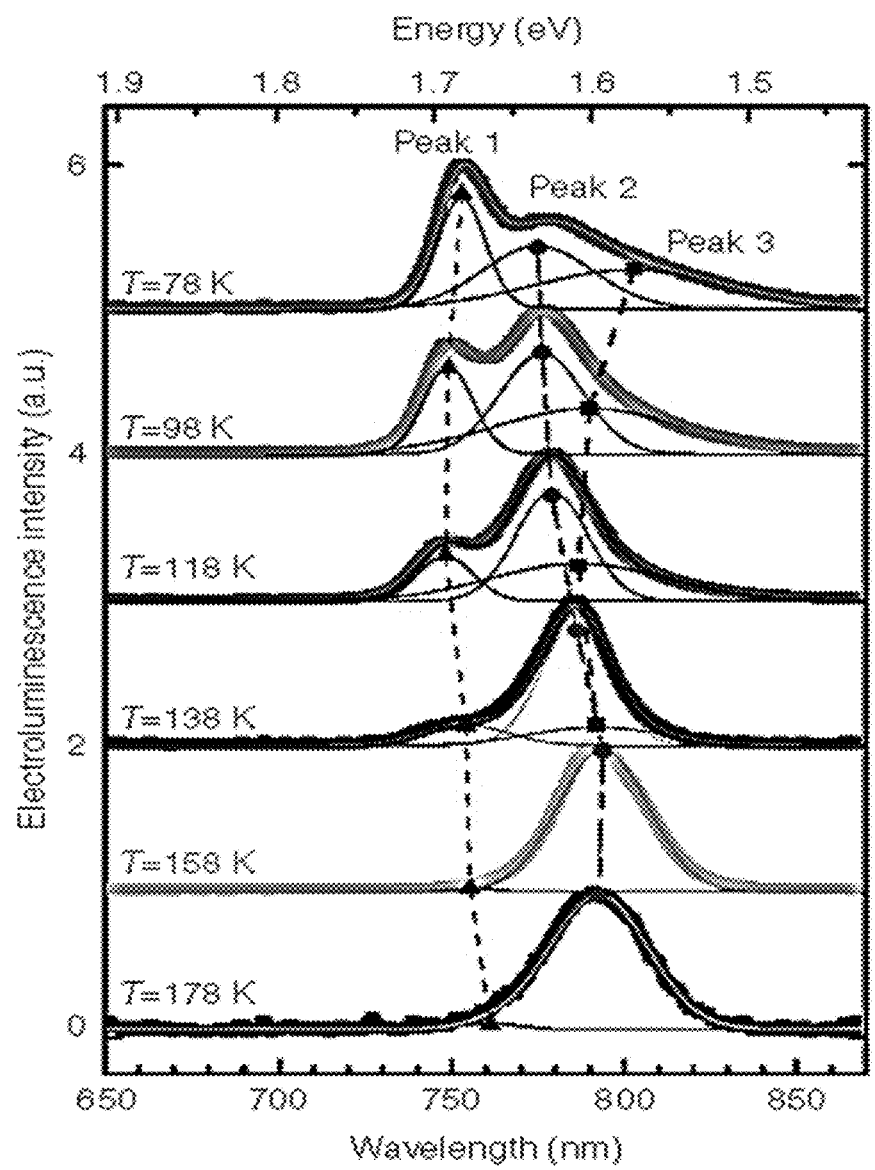

LIGHT-EMITTING DEVICE, METHOD OF FORMING AND OPERATING THE SAME

CROSS-REFERENCE TO RELATED APPLICATION

This application claims the benefit of priority of Singapore application No. 10201505194P filed Jun. 30, 2015, the contents of it being hereby incorporated by reference in its entirety for all purposes.

TECHNICAL FIELD

Various aspects of this disclosure relate to light-emitting devices, methods of forming light-emitting devices, and methods of operating light-emitting devices.

BACKGROUND

Organolead halide perovskites are emerging solution processable materials with outstanding optoelectronic properties. Among them, methylammonium lead iodide $CH_3NH_3PbI_3$ has proven to be an exceptional light harvester for hybrid organic-inorganic solar cells, which has achieved an impressive National Renewable Energy Laboratory (NREL)-certified power conversion efficiency of 22.1%, and remarkable performance in a variety of device architectures. Thanks to their cost-effectiveness and ease of processing, hybrid perovskites have naturally attracted a vast interest for applications beyond photovoltaic energy conversion, such as water splitting, light-emitting diodes and tunable, electrically pumped lasers.

SUMMARY

In various embodiments, a light-emitting device may be provided. The light-emitting device may include an active structure including an emissive halide perovskite layer. The halide perovskite layer may include a halide perovskite material. The light-emitting device may further include a first injection electrode electrically coupled to the active structure. The light-emitting device may also include a second injection electrode electrically coupled to the active structure. The light-emitting device may additionally include a control electrode. The light-emitting device may further include an insulator layer between the control electrode and the active structure. The first injection electrode may be configured to inject electrons into the active structure and the second injection electrode may be configured to inject holes into the active structure upon application of a potential difference between the first injection electrode and the second injection electrode. The control electrode may be configured to generate an electric field upon application of a voltage, thereby causing simultaneous accumulation of the electrons and the holes in a region of the halide perovskite layer so that the electrons and the holes recombine, thereby emitting light.

In various embodiments, a method of forming a light-emitting device may be provided. The method may include forming an active structure comprising an emissive halide perovskite layer. The halide perovskite layer may include a halide perovskite material. The method may also include forming a first injection electrode electrically coupled to the active structure. The method may further include forming a second injection electrode electrically coupled to the active structure. The method may additionally include forming a control electrode. The method may also include forming an insulator layer between the control electrode and the active structure. The first injection electrode may be configured to inject electrons into the active structure and the second injection electrode may be configured to inject holes into the active structure upon application of a potential difference between the first injection electrode and the second injection electrode. The control electrode may be configured to generate an electric field upon application of a voltage, thereby causing simultaneous accumulation of the electrons and the holes in a region of the halide perovskite layer so that the recombination of the electrons and holes at the region emits light.

In various embodiments, a method of operating a light-emitting device may be provided. The method may include, applying a potential difference between a first injection electrode of the light-emitting device and a second injection electrode of the light-emitting device so that the first injection electrode injects electrons and the second injection electrode injects holes into an active structure of the light-emitting device electrically coupled to the first injection electrode and the second injection electrode. The method may further include, applying a voltage to a control electrode of the light-emitting device, the light-emitting device comprising an insulator layer between the control electrode and the active structure, to generate an electric field thereby causing simultaneous accumulation of the electrons and the holes in a region of an emissive halide perovskite layer comprised in the active structure, wherein the halide perovskite layer comprises a halide perovskite material, so that the recombination of the electrons and the holes at the region emits light.

BRIEF DESCRIPTION OF THE DRAWINGS

The invention will be better understood with reference to the detailed description when considered in conjunction with the non-limiting examples and the accompanying drawings, in which:

FIG. 1A is a schematic illustrating a light-emitting device according to various embodiments.

FIGS. 6A and 6B are schematics illustrating various embodiments of the vertical single heterojunction perovskite light-emitting field-effect transistor.

FIGS. 8A and 8B are schematics illustrating various embodiments of the vertical double heterojunction perovskite light-emitting field-effect transistor with a top electron transport layer (ETL).

FIG. 15 is a schematic illustrating a method of forming a light-emitting device according to various embodiments.

FIG. 20C is a plot of mobility (square centimetres per volt second or $cm^2V^{-1}s^{-1}$) as a function of temperature (kelvins or K) showing the average mobilities and error bars obtained by averaging across the 4 devices according to various embodiments.

FIG. 20G is a table showing estimated effective mass for electron and hole of $CH_3NH_3PbI_3$ calculated from band structure including spin-orbital coupling effect according to various embodiments.

FIG. 20H is a table showing the required parameters for calculating mobilities. Band ($m_b$*), conductivity ($m_I$*) and density of state (m*) effective mass, electron (hole)-phonon coupling ($\Xi$), and bulk modulus (B).

FIG. 21A is a plot of electroluminescence (arbitrary unit or a.u.) as a function of wavelength (nanometres or nm)/energy (electron-volts or eV) illustrating low-temperature electroluminescence (EL) spectra of $CH_3NH_3PbI_3$ light-emitting field-effect transistor according to various embodiments.

DETAILED DESCRIPTION

Figure 1B:
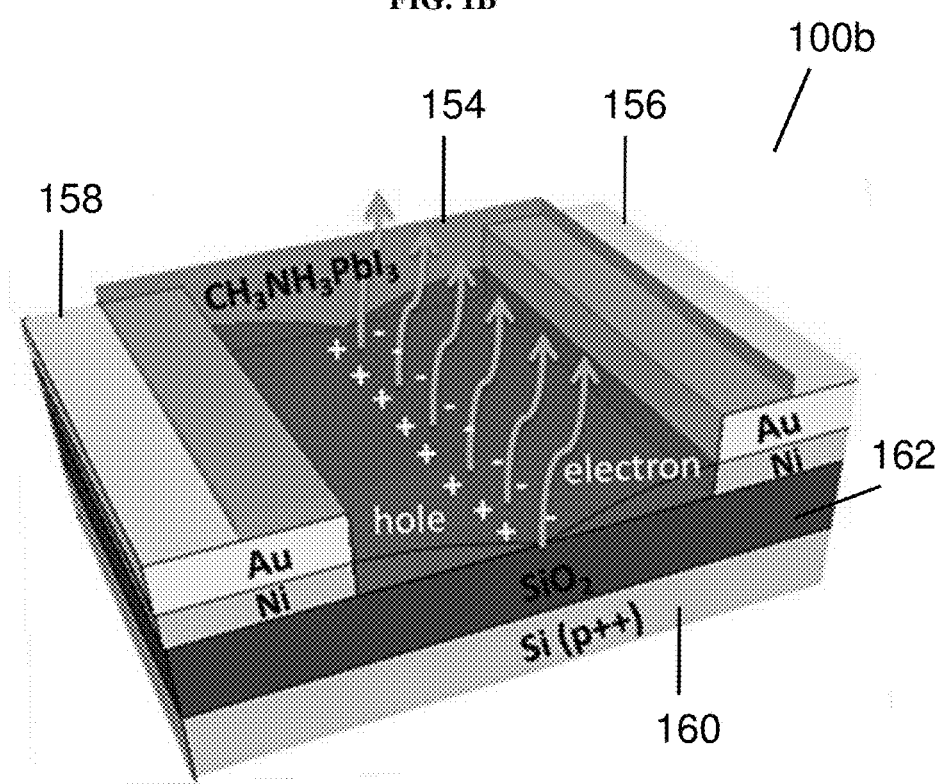
FIG. 1B is a schematic illustrating a perspective view of a light-emitting device having a bottom gate bottom contact configuration according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, a first layer over a second layer may refer to the first layer on the second layer, or may refer to the first layer separated from the second layer by one or more intervening layers.

In the context of various embodiments, the term "about" or "approximately" as applied to a numeric value encompasses the exact value and a reasonable variance.

As used herein, the term "and/or" includes any and all combinations of one or more of the associated listed items.

So far, transport parameters of perovskite materials were mostly deduced from the study of photovoltaic devices, which indicated ambipolar transport, of holes and electrons within the perovskite active region, and long electron-hole pair diffusion length.

First-principle calculations for this class of materials predict that hole mobility is up to 3,100 $cm^2V^{-1}s^{-1}$ and electron mobility is 1,500 $cm^2V^{-1}s^{-1}$ with concentration of $10^{16}$ $cm^{-3}$ at 400 K, and high-frequency mobility of 8 $cm^2V^{-1}$ $s^{-1}$ was determined in $CH_3NH_3PbI_3$ spin-coated thin film by THz spectroscopy, a remarkably high value for solution-processed materials. A combination of resistivity and Hall measurement further revealed that the mobility of about 66 $cm^2V^{-1}s^{-1}$ is achievable in $CH_3NH_3PbI_3$. Recent publications on organolead halide perovskite single crystals also reported extremely low trap densities, leading to a noticeable enhancement of photogenerated carrier lifetime and mobility.

However, very recently ion drift was shown to play a dominant role on charge transport properties, stimulating an ongoing debate about the carrier character and the origin of anomalous hysteresis, together with the role of polarization, ferroelectric and trap-state filling effects in organolead halide perovskite devices investigated at room temperature.

Despite the rapid advancement of optoelectronic applications, a big gap remains in understanding the fundamental transport properties of organolead halide perovskites, namely charge carrier character, mobility and charge transport mechanisms. To fill this gap, studies of basic field-effect transistor (FET) devices are urgently needed. Historically, related tin(II)-based 2D hybrid perovskites have attracted major interest for FET fabrication because of their attractive layered structure, with demonstrated field-effect mobilities up to 0.62 $cm^2V^{-1}$ $s^{-1}$ and $I_{on}/I_{off}$ ratio above $10^4$. Improvement of mobility can be achieved by substitution of organic cation in hybrid perovskite, yielding FET saturation-regime mobility as high as 1.4 $cm^2V^{-1}$ $s^{-1}$, and nearly an order of magnitude lower linear-regime mobility. Further improvement was demonstrated through melt processed deposition technique, where saturation and linear mobilities of 2.6 and 1.7 $cm^2V^{-1}$ $s^{-1}$ with $I_{on}/I_{off}$ of $10^6$ were achieved. Conversely, only rare examples of 3D hybrid perovskites FETs can be found in the literature, with limited hole mobility of the order of about $10^{-5}$ $cm^2V^{-1}$ $s^{-1}$ in the case of $CH_3NH_3PbI_3$ and strong hysteresis due to ionic transport, which so far have hindered the development of FET applications.

Nonetheless, high photoluminescence efficiency and widely tunable band gap from visible to infrared make $CH_3NH_3PbI_3$ extremely attractive for the fabrication of solution processable light-emitting field-effect transistors (LE-FET), a device concept that may be integrated in heterogeneous optoelectronic systems, such as flexible electroluminescent displays or electrically pumped lasers.

Various embodiments seek to provide a light-emitting device with improved photoluminescence efficiency (compared to conventional light-emitting devices) and/or widely tunable band gap.

FIG. 1A is a schematic illustrating a light-emitting device 100*a* according to various embodiments. The light-emitting device 100*a* may include an active structure 102 including an emissive halide perovskite layer 104 including a halide perovskite material. The light-emitting device 100*a* may further include a first injection electrode 106 electrically coupled to the active structure 102. The light-emitting device 100*a* may also include a second injection electrode 108 electrically coupled to the active structure 102. The light-emitting device 100*a* may additionally include a control electrode 110. The light-emitting device 100*a* may further include an insulator layer 112 between the control electrode 110 and the active structure 102. The first injection electrode 106 may be configured to inject electrons into the active structure 102 and the second injection electrode 108 may be configured to inject holes into the active structure 102 upon application of a potential difference between the first injection electrode 106 and the second injection electrode 108. The control electrode 110 may be configured to generate an electric field upon application of a voltage, thereby causing simultaneous accumulation of the electrons and the holes in a region of the halide perovskite layer 104 so that the electrons and the holes recombine, thereby emitting light.

In other words, the light-emitting device 100*a* may include a change injection mechanism in which electrons and holes are injected into an active structure 102 including a halide perovskite layer 104. The charge injection mechanism may include a first injection electrode 106 for injection of electrons, and a second injection electrode 108 for injection of holes, when a potential difference is applied between the first injection electrode 106 and the second injection electrode 108. The control electrode 110 may be configured to generate an electric field through an insulator layer 112, upon application of a voltage so that the injected electrons and holes may accumulate at an area, e.g. interface between the halide perovskite layer 104 and the insulator layer 112, for recombination to take place in order to emit light.

For avoidance of doubt, FIG. 1A serves to provide a general illustration of certain features of the device 100a. The relative arrangement, shapes and/or relative sizes of various features illustrated in FIG. 1A are not intended to be limiting. The active structure 102, the halide perovskite layer 104, the first injection electrode 106, the second injection electrode 108, the control electrode 110 and/or the insulator layer 112 may have an arrangement with respect to one another different from that illustrated in FIG. 1A. Further, the active structure 102, the halide perovskite layer 104, the first injection electrode 106, the second injection electrode 108, the control electrode 110 and/or the insulator layer 112 may have a shape or relative size that differs from that depicted in FIG. 1A.

Reference numeral 102 points to the shaded areas in FIG. 1A. The active structure 102 may consist of only the halide perovskite layer 104, or may include the halide perovskite layer 104 with other layers, such as an ambipolar transport layer, a hole transport layer and/or an electron transport layer. While the active structure 102 in FIG. 1A points to three layers, the active structure 102 according to various embodiments may include one, two, three, or more layers.

There may be no restriction on the sequence and/or the values of applying biases to the first injection electrode, the second injection electrode and/or the control electrode. Injection of holes and electrons may occur as long as the injection conditions are met.

The injection of the holes and electrons into the device 100a may be simultaneous. The transport in the device 100a may be ambipolar. The injection of the holes and electrons into the device 100a may also be regulated by the potential difference (may also be referred to as potential bias) between the first injection electrode 106 and the second injection electrode 108. The holes and electrons may accumulate in parallel to each other on an interface between the halide perovskite layer 104 and the insulator layer 112. Recombination may take place in a small overlapping region between a region of hole accumulation and a region of electron accumulation, resulting in emission of light. The halide perovskite layer 104 may also be referred to as emissive layer 104.

In various embodiments, the light-emitting device 100a may be a perovskite light-emitting field-effect transistor (Pe-LEFET).

In various embodiments, the first injection electrode 106 may be a drain electrode, and the second injection electrode 108 may be a source electrode. In various other embodiments, the first injection electrode 106 may be a source electrode, and the second injection electrode 108 may be a drain electrode. It may be understood that in various embodiments as described herein, the drain electrode is configured to inject electrons into the active structure 102 and the source electrode is configured to inject holes into the active structure 102, while in various other embodiments, the drain electrode is configured to inject holes into the active structure 102 and the source electrode is configured to inject electrons into the active structure 102.

The control electrode 110 may be a gate electrode.

In various embodiments, at least a portion of the device 100a may be configured to allow at least a portion of light to pass through. In various embodiments, at least one side of the device 100a (having a sandwich-like planar structure) may be at least semi-transparent.

In various embodiments, the control electrode 110 may be configured to allow at least a portion of light to pass through. The control electrode 110 may be transparent or translucent. In various embodiments, the control electrode 110 may include a material such as indium-doped titanium oxide (no).

In various embodiments, the light-emitting device 100a may further include a substrate. The active structure 102, halide perovskite layer 104 (which forms at least a part of 102), the control electrode 110, the first injection electrode 106, and the second injection electrode 108 may be over the substrate. In various embodiments, the substrate may be configured to allow at least a portion of light to pass through. In various embodiments, the substrate or portion of the substrate may be transparent or translucent. The substrate may alternatively or additionally be flexible. The substrate may include polyethylene naphthalate (PEN), polyethylene terephthalate (PET), silicon, glass or paper.

In various embodiments, the light-emitting device 100a may be a single gated perovskite light-emitting field-effect transistor (Pe-LEFET).

In various embodiments, the light-emitting device 100a may be a splitting gated perovskite light-emitting field-effect transistor (Pe-LEFET). The light-emitting device 100a may further include a further control electrode. The insulator layer 112 may be between the further control electrode and the active structure 102. The provision of a second electrode may enhance carrier injection and/or induce a further transporting accumulation channel, allowing extra control over the carrier and recombination area.

In various embodiments, the light-emitting device 100a may be a double gated perovskite light-emitting field-effect transistor (Pe-LEFET). In various embodiments, the device 100a may include a further insulator layer. The active structure 102 may be between the insulator layer 104 and the further insulator layer. The further insulator layer may be between the further control electrode and the active structure 102.

In various embodiments, the active structure 102 may be between the first injection electrode 106 and the second injection electrode 108.

In various embodiments, the light-emitting device 100a may be a planar (lateral) heterojunction perovskite light-emitting field-effect transistor (Pe-LEFET). The active structure 102 may further include a semiconductor layer. The halide perovskite layer 104 and the semiconductor layer form a heterojunction. In various embodiments, the heterojunction (interface) may be between the first injection electrode and the second injection electrode. The semiconductor layer may be any one layer selected from a group consisting of a further halide perovskite layer, a hole transport layer, and an electron transport layer. A planar heterojunction structure may allow or help in the accumulation of electrons and holes at the heterojunction interface by introducing a proper energetic barrier to either holes or electrons. The halide perovskite layer 104 may be used as an emission layer, while the semiconductor layer may be used to carry charge carriers. An electron transport layer may be configured to carry electrons, while a hole transport layer may be configured to carry holes. The further halide perovskite layer may be configured to carry electrons and/or holes.

In various embodiments, the halide perovskite layer 104 and the semiconductor layer may form a vertical stacked arrangement. The vertical stacked arrangement structure may be easier to fabricate compared to lateral heterojunction structures. In various embodiments, the light-emitting device 100a may be a vertical single-heterojunction perovskite light-emitting field-effect transistor (Pe-LEFET). The semiconductor layer may be a hole transport layer, an electron transport layer, a hole and electron transport layer, or a bulk heterojunction.

In various embodiments, the light-emitting device 100a may be a vertical multi-heterojunction perovskite light-emitting field-effect transistor (Pe-LEFET). In various embodiments, the semiconductor layer may be an electron transport layer. The active structure may further comprise a hole transport layer. The halide perovskite layer 104 and the hole transport layer may form a further heterojunction.

In various embodiments, the halide perovskite layer 104 may be between the electron transport layer and the hole transport layer. In various embodiments, the electron transport layer may be over the hole transport layer, while in various other embodiments, the hole transport layer may be over the electron transport layer. The halide perovskite layer 104, the hole transport layer, and the electron transport layer may form a stacked arrangement.

In various embodiments, at least one of the first injection electrode 106 and the second injection electrode 108 may be in or may be in contact with at least one of the electron transport layer and the hole transport layer. In various embodiments, the device 100a may include either the first injection electrode 106 or the second injection electrode 108 at or in contact with the electron transport layer. In various embodiments, the device 100a may include either the first injection electrode 106 or the second injection electrode 108 at or in contact with the hole transport layer.

Various embodiments may provide a device 100a with the first injection electrode 106 and the second injection electrode 108 at or in contact with different layers of the active structure 102.

In various embodiments, the light-emitting device 100a may be a vertical perovskite light-emitting field-effect transistor (Pe-LEFET). In various embodiments, the first injection electrode 106 may be lateral to the control electrode 110, while the second electrode 108 may be over the control electrode 110. In various other embodiments, the second electrode 108 may be lateral to the control electrode 110, while the first electrode 106 may be over the control electrode 110. In various embodiments, the insulator layer 112 may be L-shaped. In various embodiments, the insulator layer 112 may include a first dielectric section between the first injection electrode 106 and the control electrode 110, and may further include a second dielectric section between the second injection electrode 108 and the control electrode 110, the second dielectric section substantially perpendicular to the first dielectric section. The halide perovskite layer 104 may be a top layer, and may be over a substrate. The halide perovskite layer 104 may extend from laterally to the control electrode 110 to over the control electrode 110. The charge carriers may be transported in a vertical channel extending between electrodes 106 and 108. In various embodiments, the vertical channel may be between the gate electrode 110 (or insulator layer 112) and one of the electrodes 106, 108 that is positioned or arranged laterally to the gate electrode 110. The use of the vertical channel may advantageously allow for a more compact Pe-LEFET, which may result in greater ease to be included in a substrate area. The vertical channel may additionally allow for a smaller channel length, which enables a smaller operating voltage.

In various embodiments, the light-emitting device 100a may have an air gap dielectric. In various embodiments, the insulator layer 112 may include or may be an air gap. The air gap may allow for a higher induced carrier density and a higher field-effect transport.

In various embodiments, the halide perovskite material may be an organic-inorganic hybrid material. In various other embodiments, the halide perovskite material may be an inorganic material.

In various embodiments, the halide perovskite material may have a formula selected from a group consisting of $ABX_3$, $ABX_4$, and $A_2BX_4$. A may be a cation selected from a group consisting of an organic ammonium cation, an organic cation derived from an aromatic compound, an inorganic cation, and a cation of any combination thereof. B may be a metal cation. X may be a halide anion selected from a group consisting of a chloride anion, a bromide anion, a fluoride anion, an iodide anion, an oxygen-halide anion, and an anion of any combination thereof.

The organic ammonium cation may be derived from $RNH_3$, where R is an aliphatic group, a cyclic group, or an aromatic group. The inorganic cation may be $Li^+$, $Na^+$, $K^+$, $Rb^+$, or $Cs^+$. In various embodiments, A may include both organic cations and inorganic cations.

For $ABX_3$, B may be a metal with valence+2, +4, or +6, i.e. B may be a metal cation $M^{2+}$, $M^{4+}$ or $M^{6+}$ (e.g. $Pb^{2+}/Sn^{2+}$, $Sn^{4+}$, $Cu^{6+}$). For $ABX_4$ or $A_2BX_4$, B may be a metal with valence +2, i.e. B may be a metal cation $M^{2+}$ (e.g. $Pb^{2+}/Sn^{2+}$).

X may be a halide anion such as $Cl^-$, $Br^-$, $F^-$, $I^-$, or an oxygen halide. In various embodiments, the halide perovskite material may include two or more different halides. For instance, the halide perovskite material may include chloride anions and bromide anions.

The halide perovskite material may be a hybrid material such as $CH_3NH_3PbI$. The halide perovskite material may be solution processable. The halide perovskite material may be of low cost and easy to produce, and may be used in solar cells.

The light emitted may be of any wavelength ranging between 10 nm to 1 mm.

In various embodiments, the halide perovskite layer 104 may have a plurality of halide perovskite nanostructures or nanostructured perovskite. The nanostructures may be quantum dots, nanowires, nanoplates etc. In various embodiments, the halide perovskite layer 104 may include two or more types of nanostructures. For instance the halide perovskite layer 104 may include a mixture of quantum dots and nanowires.

In various embodiments, the first injection electrode 106 and the second injection electrode 108 may include a same conductive material. Symmetric electrodes, with the first injection electrode 106 and the second injection electrode 108 having the same material may allow for efficient injection of holes and electrons into the active channel 102.

In various other embodiments, the first injection electrode 106 may include a first conductive material. In various embodiments, the second injection electrode 108 may include a second conductive material different from the first conductive material. Asymmetric electrodes, with the first injection electrode 106 and the second injection electrode 108 made of different materials, may allow for separate tuning of electronic work function to optimize hole injection and electron injection. The first injection electrode 106 or the second injection electrode 108 may include a low function metallic material. Low work function materials may be easier to be oxidized. A conductive inorganic metal oxide, such as zinc oxide, may be used as a low work function electrode, which may allow for better stability and/or longer lifetime for the fabricated devices.

In various embodiments, the light-emitting device 100a may include a suitable surface modifier on the first injection electrode 106 or the second injection electrode 108 for lowering the work function of the electrode 106, 108 to facilitate electron injection. The suitable surface modifier may be, for instance, polyethyleneimine (PEI) or polyethyleneimine ethyoxylate (PEIE).

In various embodiments, the insulator layer 112 may include a plurality of high-k dielectric sub-layers. An insulator layer 112 including multiple layers of high-k dielectric may achieve higher induced charge density and may have a low number of traps for better charge transport. A higher density of charge carriers and/or faster charge transport may be desirable to achieve higher rate of radiative recombination.

In various embodiments, the insulator layer 112 may include a suitable ferroelectric material, such as poly[(vinylidenefluoride-co-trifluoroethylene] (PVDF-TrFE). The ferroelectric material may allow for higher induced carrier density through polarization electric field that induces higher carrier concentration at the surface.

In various embodiments, the insulator layer 112 may be or may include an ionic gate dielectric. The insulator layer 112 may include a suitable polyelectrolyte material. The polyelectrolyte material may form a polarized electric field upon application of a voltage bias. The polarized electric field may allow a higher capacitance per unit, thus enabling a higher induced carrier density at the semiconductor-dielectric interface. The enhancement in carrier density may increase the recombination rate, and hence the emission rate.

In various embodiments, the insulator layer 112 may include suitable self-assembled molecules. The suitable self-assembled molecules may be selected from a group of hexamethyldisilazane, β-phenethyltrichlorosilane, tridecafluorooctyltrichlorosilane, octyltrichlorosilane, or any combination thereof. The suitable self-assembled molecules may passivate trap states of the surface of the insulator layer 110 to achieve a better charge transport. The passivation may be applied to the side of insulator layer 110 that is in contact with the active structure 102.

In various embodiments, the light-emitting device 100*a* may be operable at room temperature. In various embodiments, the light-emitting device 100*a* may be operable at temperatures below 35° C., or below 35° C., or below 30° C. or below 25° C. or below 20° C. In various embodiments, the light-emitting device may be configured to emit light at temperatures below 35° C., or below 35° C., or below 30° C. or below 25° C. or below 20° C.

A lower operating temperature may reduce hysteresis effects due to ionic transport/screening. Nevertheless, various embodiments may allow for operation at higher operating temperatures. Various embodiments may allow for operation at higher operating temperatures due to various features as described herein.

In various embodiments, a light-emitting array may be provided. The light-emitting array may include a plurality of light-emitting devices. Each light-emitting device may include an active structure including an emissive halide perovskite layer, the halide perovskite layer including a halide perovskite material. The first injection electrode may be electrically coupled to the active structure. The second injection electrode may be electrically coupled to the active structure. Each light-emitting device may further include a control electrode. Each light-emitting device may further include an insulator layer between the control electrode and the active structure. The first injection electrode may be configured to inject electrons into the active structure and the second injection electrode may be configured to inject holes into the active structure upon application of a potential difference between the first injection electrode and the second injection electrode. The control electrode may be configured to generate an electric field upon application of a voltage, thereby causing simultaneous accumulation of the electrons and the holes in a region of the halide perovskite layer so that the electrons and the holes recombine, thereby emitting light.

FIG. 1B is a schematic illustrating a perspective view of a light-emitting device 100*b* having a bottom gate bottom contact configuration according to various embodiments. The light-emitting device 100*b* may include an emissive halide perovskite layer 154. The halide perovskite layer 154 may include a halide perovskite material. The light-emitting device 100*b* may further include a first injection electrode 156 electrically coupled to the halide perovskite layer 154. The light-emitting device 100*b* may also include a second injection electrode 158 electrically coupled to the halide perovskite layer 154. The light-emitting device 100*b* may additionally include a control electrode 160. The light-emitting device 100*b* may further include an insulator layer 162 between the control electrode 160 and the halide perovskite layer 154. The first injection electrode 156 may be configured to inject electrons into the halide perovskite layer 154 and the second injection electrode 158 may be configured to inject holes into the halide perovskite layer 154 upon application of a potential difference between the first injection electrode 156 and the second injection electrode 158. The control electrode 160 may be configured to generate an electric field upon application of a voltage, thereby causing simultaneous accumulation of the electrons and the holes in a region of the halide perovskite layer 154 so that the electrons and the holes recombine, thereby emitting light.

Various embodiments describe specific arrangements of the drain electrode or/and source electrode in relation to other structural features. For avoidance of doubt, unless otherwise explicitly stated, it should be appreciated that the drain electrode and the source electrode may be interchangeable. In other words, it may be envisioned in at least some embodiments other than the embodiments described herein, references to the drain electrode may instead be references to the source electrode, and references to the source electrode may instead be references to the drain electrode.

Figure 2:
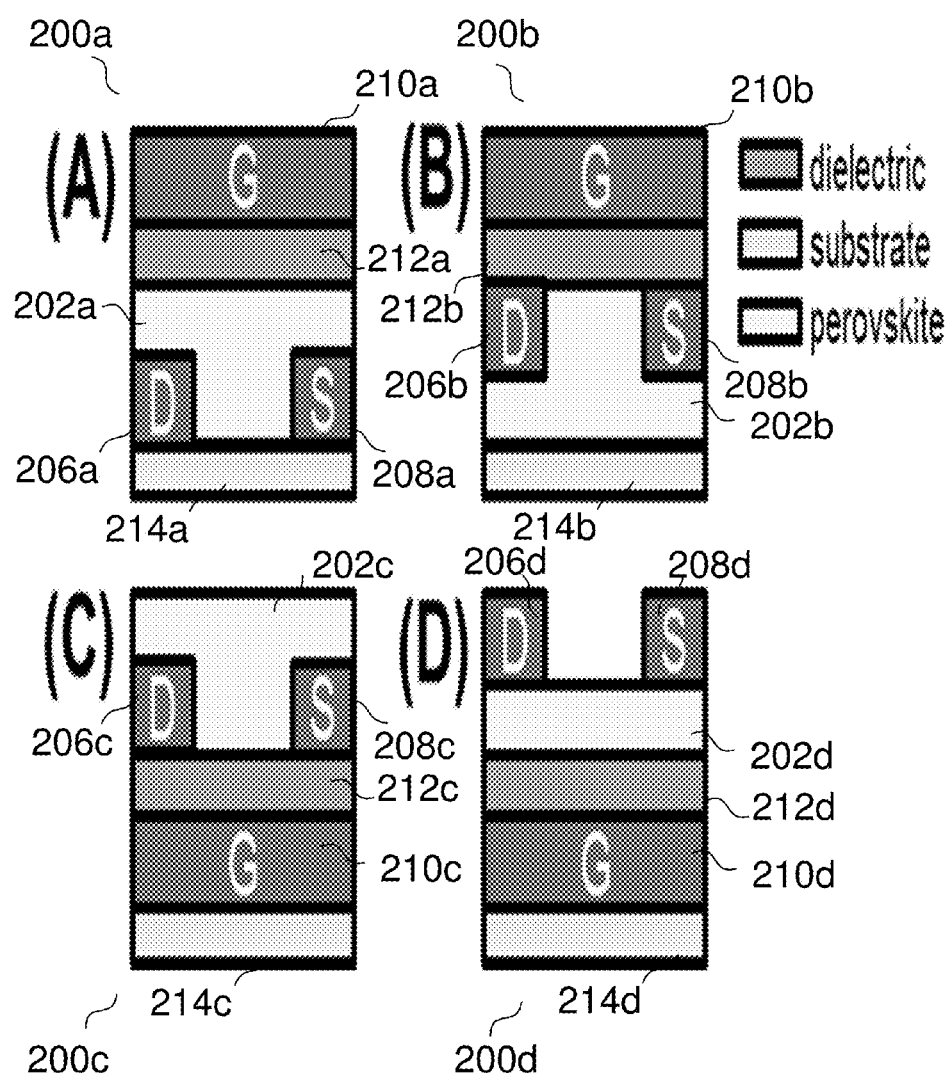
FIG. 2 is a schematic illustrating various embodiments of the light-emitting device having the single-gated configuration.

FIG. 2 is a schematic illustrating various embodiments of the light-emitting device. The light-emitting devices illustrated in FIG. 2 200*a-d* are single-gated perovskite light-emitting field-effect transistors (Pe-LEFET). The drain electrodes 206*a-d* and source electrodes 208*a-d* may be in contact with the active structure or the halide perovskite layer 202*a-d*. Each of the devices 200*a-d* may include a metal-insulator-semiconductor (MIS) structure including an active halide perovskite layer 202*a-d*, a gate electrode 210*a-d*, and an insulator layer 212*a-d*. The active structure in FIG. 2 may consist of only the halide perovskite layer. Accordingly, the active structure in FIG. 2 may be a single active layer. The devices may be named based on the relative position of the drain and source electrodes 206*a-d*, 208*a-d* as well as the gate electrode 210*a-d* in relation to the halide perovskite layer 202*a-d*.

Device 200*a* may be a top gate bottom contact (TGBC) structure including the halide perovskite layer 202*a* on a substrate 214*a*. The device 200*a* may have a drain electrode 206*a* and a source electrode 208*a* extending from an interface between the halide perovskite layer 202*a* and the substrate 214*a* into the halide perovskite layer 202*a*. The device 200*a* may further include an insulator layer 212*a* on the halide perovskite layer 202*a*, and a gate electrode 210*a* on the insulator layer 212a. The drain electrode 206a and the source electrode 208a may be on opposite lateral sides of the halide perovskite layer 202a.

Device 200b may be a top gate top contact (TGTC) structure including the halide perovskite layer 202b on a substrate 214b. The device 200b may have a drain electrode 206b and a source electrode 208b extending from an interface between the halide perovskite layer 202b and the insulator layer 212b into the halide perovskite layer 202b. The device 200b may further include an insulator layer 212b on the halide perovskite layer 202b, and a gate electrode 210b on the insulator layer 212b. The drain electrode 206b and the source electrode 208b may be on opposite lateral sides of the halide perovskite layer 202b.

Device 200c may be a bottom gate bottom contact (BGBC) structure including the gate electrode 210c on a substrate 214c. The device 200c may further include an insulator layer 212c on the gate electrode 210c, and a halide perovskite layer 202c on the insulator layer 212c. The drain electrode 206c and the source electrode 208c may extend from an interface between the insulator layer 212c and the halide perovskite layer 202c into the halide perovskite layer 202c. The drain electrode 206c and the source electrode 208c may be on opposite lateral sides of the halide perovskite layer 202c.

Device 200d may be a bottom gate top contact (BGTC) structure including the gate electrode 210d on a substrate 214d. The device 200d may further include an insulator layer 212d on the gate electrode 210d, and an halide perovskite layer 202d on the insulator layer 212d. The drain electrode 206d and the source electrode 208d may be on the halide perovskite layer 202d, and may be separated from each other.

The use of the planar structure in the TGTC and BGBC configurations may allow for direct carrier injection to the active material, while enhanced injection through a larger injection area may be obtained through the staggered structure in the BGTC and TGBC configurations.

Figure 3:
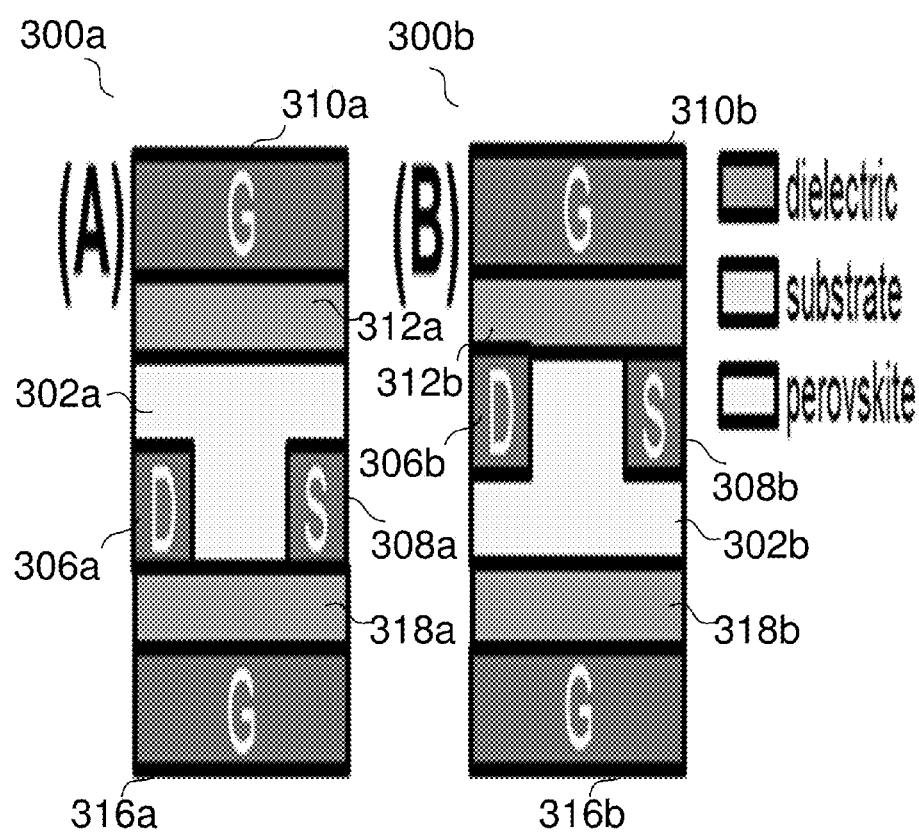
FIG. 3 is a schematic illustrating various embodiments of the light-emitting device having the double-gated configuration.

FIG. 3 is a schematic illustrating various embodiments of the light-emitting device. The light-emitting devices illustrated in FIG. 3 300a, 300b are double-gated perovskite light-emitting field-effect transistors (Pe-LEFET). The active structure in FIG. 3 may consist of only the halide perovskite layer. Accordingly, the active structure in FIG. 3 may be a single active layer.

Device 300a is a double gated perovskite light-emitting field-effect transistor (Pe-LEFET) in the double gated bottom contacts (DGBC) configuration while device 300b is a double gated perovskite light-emitting field-effect transistor (Pe-LEFET) in the double gated top contacts (DGTC) configuration.

Device 300a may include a halide perovskite layer 302a, an insulator layer 312a on a first side of the active layer 302a, and a gate electrode 310a on the insulator layer 312a. The device 300a may further include a further insulator layer 318a on a second side of the halide perovskite layer 302a, and a further gate electrode 316a on the further insulator layer 318a. In other words, the insulator layers 312a, 318a may be on opposite sides of the halide perovskite layer 302a, and the gate electrodes 310a, 316a may be on opposite sides of the halide perovskite layer 302a. The device 300a may include the further gate electrode 316a, the further insulator layer 318a over the further gate electrode 316a, the halide perovskite layer 302a over the further insulator layer 318a, the insulator layer 312a over the halide perovskite layer 302a, and the gate electrode 310a over the insulator layer 312a. The device 300a may further include a drain electrode 306a extending from a first lateral side of the active layerhalide perovskite layer 302a, and from an interface between the halide perovskite layer 302a and the further insulator layer 318a, and a source electrode 308a extending from a second lateral side of the halide perovskite layer 302a, and from the interface between the halide perovskite layer 302a and the further insulator layer 318a.

Device 300b may include a halide perovskite layer 302b, an insulator layer 312b on a first side of the halide perovskite layer 302b, and a gate electrode 310b on the insulator layer 312b. The device 300b may further include a further insulator layer 318b on a second side of the halide perovskite layer 302b, and a further gate electrode 316b on the further insulator layer 318b. In other words, the insulator layers 312b, 318b may be on opposite sides of the halide perovskite layer 302b, and the gate electrodes 310b, 316b may be on opposite sides of the halide perovskite layer 302b. The device 300b may include the further gate electrode 316b, the further insulator layer 318b over the further gate electrode 316b, the halide perovskite layer 302b over the further insulator layer 318b, the insulator layer 312b over the halide perovskite layer 302b, and the gate electrode 310b over the insulator layer 312b. The device 300b may further include a drain electrode 306b extending from a first lateral side of the halide perovskite layer 302b, and from an interface between the halide perovskite layer 302b and the insulator layer 312b, and a source electrode 308b extending from a second lateral side of the halide perovskite layer 302b, and from the interface between the halide perovskite layer 302b and the insulator layer 312b.

Each structure 300a, 300b may incorporate two metal-insulator-semiconductor (MIS) diode structures with a shared halide perovskite layer 302a, 302b to form a field-effect transistor. The introduction of the further gate electrode 316a, 316b may enhance carrier injection and induce a second transport accumulation channel, allowing extra control over the carrier injection and recombination area.

Figure 4:
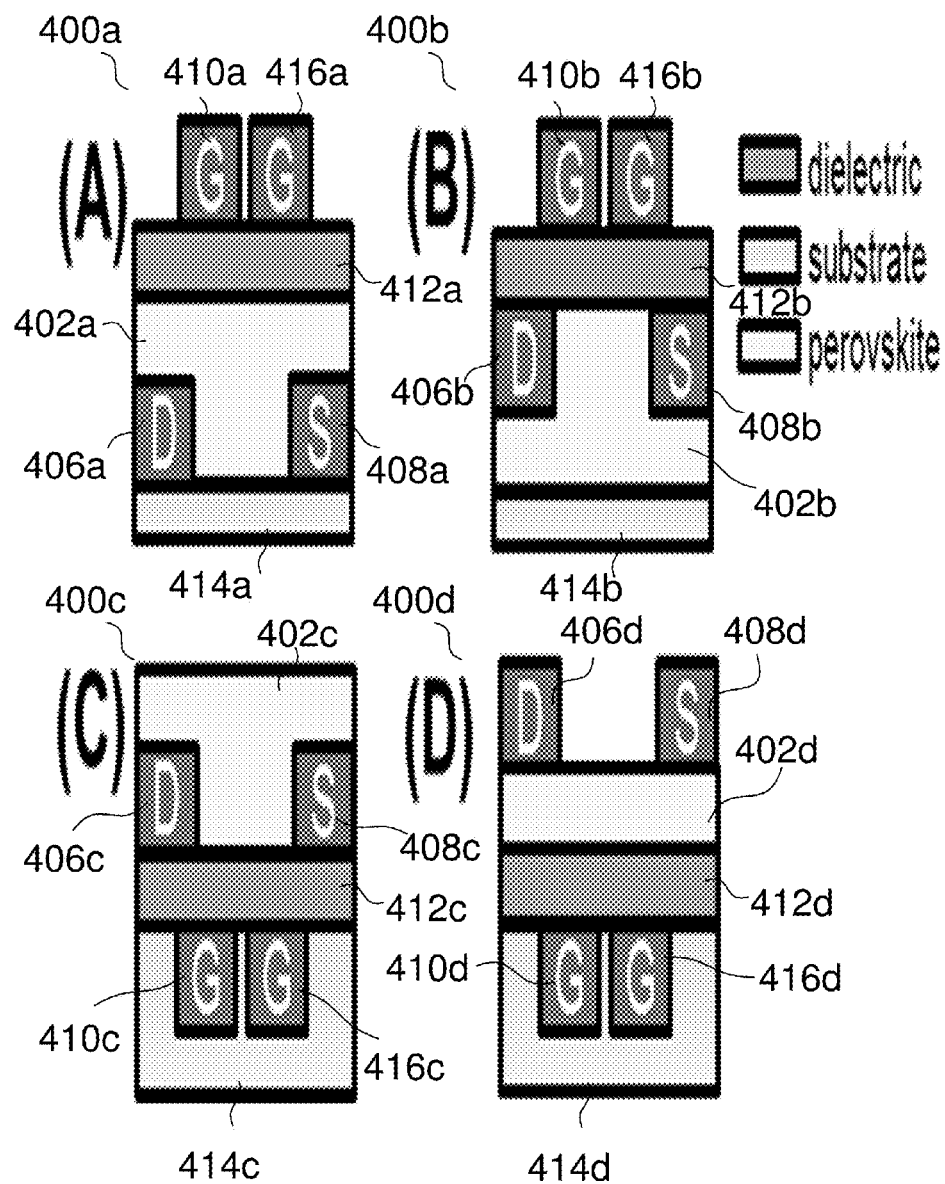
FIG. 4 is a schematic illustrating various embodiments of the light-emitting device having the splitting gate configuration.

FIG. 4 is a schematic illustrating various embodiments of the light-emitting device. The light-emitting devices 400a-d illustrated in FIG. 4 are splitting gate perovskite light-emitting field-effect transistors (Pe-LEFET). The active structure in FIG. 4 may consist of only the halide perovskite layer. Accordingly, the active structure in FIG. 4 may be a single active layer.

The splitting gate perovskite light-emitting field-effect transistors (Pe-LEFET) may include two MIS diodes in parallel connection to control the injection of holes and electrons from the source and drain, respectively. The splitting gate may allow the control of hole-electron recombination and emission area on the Pe-FET.

Transistor 400a is of the top splitting gate—bottom contact (TSGBC) configuration. Transistor 400a may include a substrate 414a, a halide perovskite layer 402a on the substrate 414a, and insulator layer 412a on the halide perovskite layer 402a. The transistor 400a may further include a gate electrode 410a and a further gate electrode 416a on the insulator layer 412a. The device 400a may further include a drain electrode 406a extending from a first lateral side of the halide perovskite layer 402a, and from an interface between the halide perovskite layer 402a and the substrate 414a, and a source electrode 408a extending from a second lateral side of the halide perovskite layer 402a, and from the interface between the halide perovskite layer 402a and the substrate 414a.

Transistor 400b is of the top splitting gate—top contact (TSGTC) configuration. Transistor 400b may include a substrate 414b, a halide perovskite layer 402b on the substrate 414b, and insulator layer 412b on the halide perovskite layer 402b. The transistor 400b may further include a gate electrode 410b and a further gate electrode 416b on the insulator layer 412b. The device 400b may further include a drain electrode 406b extending from a first lateral side of the halide perovskite layer 402b, and from an interface between the halide perovskite layer 402b and the insulator layer 412b, and a source electrode 408b extending from a second lateral side of the halide perovskite layer 402b, and from the interface between the halide perovskite layer 402b and the insulator layer 412b.

Transistor 400c is of the bottom splitting gate—bottom contact (BSGBC) configuration. The transistor 400c may include a substrate 414c, an insulator layer 412c on the substrate 414c, and a halide perovskite layer 402c on the insulator layer 412c. The gate electrode 410c and further gate electrode 416c may be embedded in the substrate 414c, and may extend from an interface between the insulator layer 412c and the substrate 414c. The device 400c may further include a drain electrode 406c extending from a first lateral side of the halide perovskite layer 402c, and from an interface between the halide perovskite layer 402c and the insulator layer 412c, and a source electrode 408c extending from a second lateral side of the halide perovskite layer 402c, and from the interface between the halide perovskite layer 402c and the insulator layer 412c.

Transistor 400d is of the bottom splitting gate—top contact (BSGTC) configuration. The transistor 400d may include a substrate 414d, an insulator layer 412d on the substrate 414d, and a halide perovskite layer 402d on the insulator layer 412d. The gate electrode 410d and further gate electrode 416d may be embedded in the substrate 414d, and may extend from an interface between the insulator layer 412d and the substrate 414d. The drain electrode 406d and the source electrode 408d may be on the halide perovskite layer 402d, and may be separated from each other.

Figure 5:
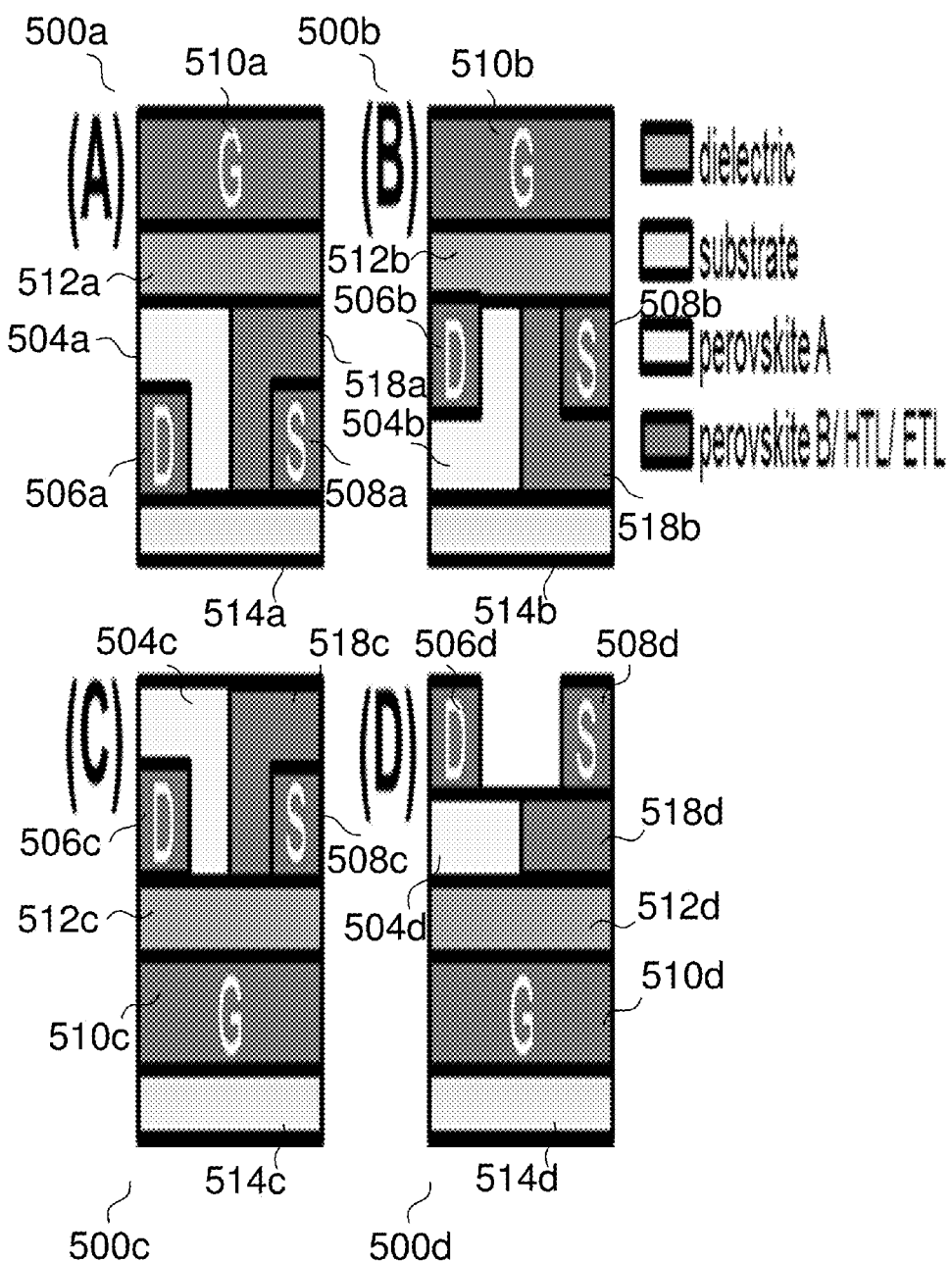
FIG. 5 is a schematic illustrating various embodiments of the planar lateral heterojunction perovskite light-emitting field-effect transistor.

FIG. 5 is a schematic illustrating various embodiments of the light-emitting device. The light-emitting devices 500a-d illustrated in FIG. 5 are planar (lateral) heterojunction perovskite light-emitting field-effect transistors (Pe-LEFET).

The active structure may include two different semiconductor layers forming a heterojunction. In various embodiments, the first semiconductor layer may be a halide perovskite layer 504a-d, which may be the emission layer. The second semiconductor layer 518a-d may be a further perovskite layer for carrying electrons or holes, a hole transport layer for carrying holes, or an electron transport layer for carrying electrons. In various embodiments, the heterojunction may be between the first injection electrode 506a-d and the second injection electrode 508a-d. The planar heterojunction may allow the accumulation of holes and electrons at the interface by introducing proper energetic barrier to either holes or electrons. Various embodiments may improve emission efficiency through enhancing recombination rate with a large charge density at the heterojunction interface.

Transistor 500a may include a substrate 514a, a halide perovskite layer 504a on a first portion of the substrate 514a, and a semiconductor layer 518a on a second portion of the substrate 514a so that the halide perovskite layer 504a and the semiconductor layer 518a forms a heterojunction which may be substantially perpendicular to a main surface of the substrate 514a. In other words, the halide perovskite layer 504a may be arranged laterally to the semiconductor layer 518a, and the heterojunction may extend substantially vertically. An insulator layer 512a may be on the halide perovskite layer 504a and the semiconductor layer 518a, and a gate electrode 510a may be on the insulator layer 512a. The device 500a may further include a drain electrode 506a extending from a lateral side of the halide perovskite layer 504a, and from an interface between the halide perovskite layer 504a and the substrate 514a, and a source electrode 508a extending from a lateral side of the semiconductor layer 518a, and from the interface between the semiconductor layer 518a and the substrate 514a.

Transistor 500b may include a substrate 514b, a halide perovskite layer 504b on a first portion of the substrate 514b, and a semiconductor layer 518b on a second portion of the substrate 514b so that the halide perovskite layer 504b and the semiconductor layer 518b forms a heterojunction which may be substantially perpendicular to a main surface of the substrate 514b. In other words, the halide perovskite layer 504b may be arranged laterally to the semiconductor layer 518b, and the heterojunction may extend substantially vertically. An insulator layer 512b may be on the halide perovskite layer 504b and the semiconductor layer 518b, and a gate electrode 510b may be on the insulator layer 512b. The device 500b may further include a drain electrode 506b extending from a lateral side of the halide perovskite layer 504b, and from an interface between the halide perovskite layer 504b and the insulator layer 512b, and a source electrode 508b extending from a lateral side of the semiconductor layer 518b, and from the interface between the semiconductor layer 518b and the insulator layer 512b.

Transistor 500c may include a substrate 514c, a gate electrode 510c on the substrate 514c, an insulator layer 512c on the gate electrode 510c, a halide perovskite layer 504c on a first portion of insulator layer 512c, and a semiconductor layer 518c on a second portion of the insulator layer 512c so that the halide perovskite layer 504c and the semiconductor layer 518c forms a heterojunction which may be substantially perpendicular to a main surface of the substrate 514c. In other words, the halide perovskite layer 504c may be arranged laterally to the semiconductor layer 518c, and the heterojunction may extend substantially vertically. The device 500c may further include a drain electrode 506c extending from a lateral side of the halide perovskite layer 504c, and from an interface between the halide perovskite layer 504c and the insulator layer 512c, and a source electrode 508c extending from a lateral side of the semiconductor layer 518c, and from the interface between the semiconductor layer 518c and the insulator layer 512c.

Transistor 500d may include a substrate 514d, a gate electrode 510d on the substrate 514d, an insulator layer 512d on the gate electrode 510d, a halide perovskite layer 504d on a first portion of insulator layer 512d, and a semiconductor layer 518d on a second portion of the insulator layer 512d so that the halide perovskite layer 504d and the semiconductor layer 518d forms a heterojunction which may be substantially perpendicular to a main surface of the substrate 514d. In other words, the halide perovskite layer 504d may be arranged laterally to the semiconductor layer 518d, and the heterojunction may extend substantially vertically. The device 500d may further include a drain electrode 506d on the halide perovskite layer 504d, and a source electrode 508d on the semiconductor layer 518d.

Figure 6B:
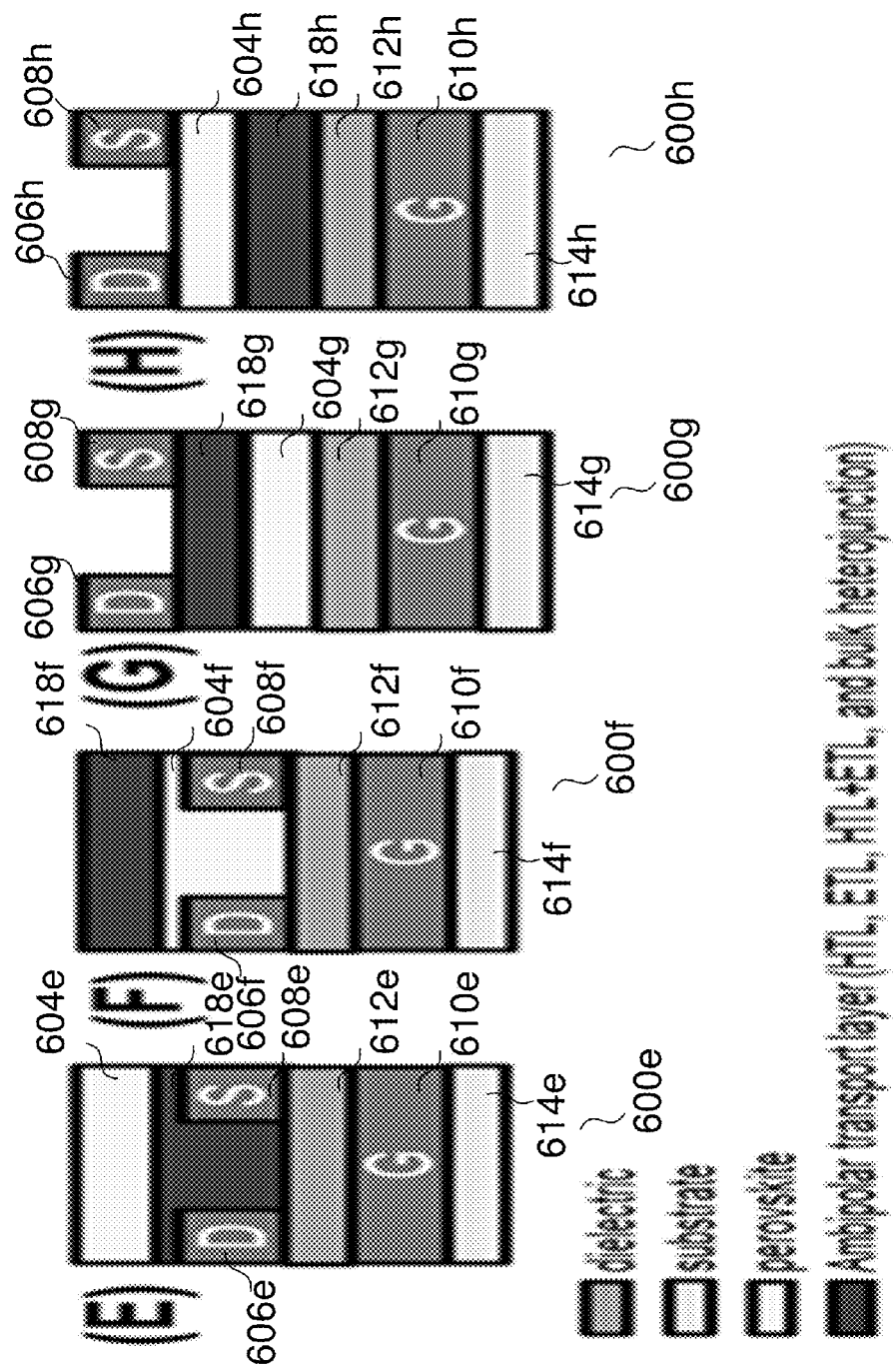

FIGS. 6A and 6B are schematics illustrating various embodiments of the light-emitting device. The light-emitting devices 600a-h illustrated in FIG. 6 are vertical single heterojunction perovskite light-emitting field-effect transistors (Pe-LEFET). As shown in FIG. 6, the substrate 614a-h, a halide perovskite layer (which serves as the emission layer) 604a-h, a semiconductor layer 618a-h (such as a hole transport layer, an electron transport layer, an ambipolar transport layer such as an hole transport layer with an electron transport layer or a bulk heterojunction), an insulator layer 612a-h, and a gate electrode 610a-h may form a vertical stacked arrangement. A vertical layer-by-layer structure may be easier to fabricate as compared to a lateral configuration.

Transistor 600a (top gate bottom contact with perovskite/transport layer active layer) may include a substrate 614a, a semiconductor layer 618a on the substrate 614a, a halide perovskite layer 604a on the semiconductor layer 618a, an insulator layer 612a on the halide perovskite layer 604a, and a gate electrode 610a on the insulator layer 612a. The drain electrode 606a may extend from a first lateral side of the semiconductor layer 618a, and from an interface between the semiconductor layer 618a and the substrate 614a. The source electrode 608a may extend from a second lateral side of the semiconductor layer 618a, and from the interface between the semiconductor layer 618a and the substrate 614a.

Transistor 600b (top gate bottom contact with transport layer/perovskite active layer) may include a substrate 614b, a halide perovskite layer 604b on the substrate 614b, a semiconductor layer 618b on the halide perovskite layer 604b, an insulator layer 612b on the semiconductor layer 618b, and a gate electrode 610b on the insulator layer 612b. The drain electrode 606b may extend from a first lateral side of the halide perovskite layer 604b, and from an interface between the halide perovskite layer 604b and the substrate 614b. The source electrode 608b may extend from a second lateral side of the halide perovskite layer 604b, and from the interface between the halide perovskite layer 604b and the substrate 614b.

Transistor 600c (top gate top contact with transport layer/perovskite active layer) may include a substrate 614c, a halide perovskite layer 604c on the substrate 614c, a semiconductor layer 618c on the halide perovskite layer 604c, an insulator layer 612c on the semiconductor layer 618c, and a gate electrode 610c on the insulator layer 612c. The drain electrode 606c may extend from a first lateral side of the semiconductor layer 618c, and from an interface between the semiconductor layer 618c and the insulator layer 612c. The source electrode 608c may extend from a second lateral side of the semiconductor layer 618c, and from the interface between the semiconductor layer 618c and the insulator layer 612c.

Transistor 600d (top gate top contact with perovskite/transport layer active layer) may include a substrate 614d, a semiconductor layer 618d on the substrate 614d, a halide perovskite layer 604d on the semiconductor layer 618d, an insulator layer 612d on the halide perovskite layer 604d, and a gate electrode 610d on the insulator layer 612d. The drain electrode 606d may extend from a first lateral side of the halide perovskite layer 604d, and from an interface between the halide perovskite layer 604d and the insulator layer 612d. The source electrode 608d may extend from a second lateral side of the halide perovskite layer 604d, and from the interface between the halide perovskite layer 604d and the insulator layer 612d.

Transistor 600e (bottom gate bottom contact with perovskite/transport layer active layer) may include a substrate 614e, a gate electrode 610e on the substrate 614e, an insulator layer 612e on the gate electrode 610e, a semiconductor layer 618e on the insulator layer 612e, and a halide perovskite layer 604e on the semiconductor layer 618e. The drain electrode 606e may extend from a first lateral side of the semiconductor layer 618e, and from an interface between the semiconductor layer 618e and the insulator layer 612e. The source electrode 608e may extend from a second lateral side of the semiconductor layer 618e, and from the interface between the semiconductor layer 618e and the insulator layer 612e.

Transistor 600f (bottom gate bottom contact with transport layer/perovskite active layer) may include a substrate 614f, a gate electrode 610f on the substrate 614f, an insulator layer 612f on the gate electrode 610f, a halide perovskite layer 604f on the insulator layer 612f, and a semiconductor layer 618f on the halide perovskite layer 604f. The drain electrode 606f may extend from a first lateral side of the halide perovskite layer 604f, and from an interface between the halide perovskite layer 604f and the insulator layer 612f. The source electrode 608f may extend from a second lateral side of the halide perovskite layer 604f, and from the interface between the halide perovskite layer 604f and the insulator layer 612f.

Transistor 600g (bottom gate top contact with transport layer/perovskite active layer) may include a substrate 614g, a gate electrode 610g on the substrate 614g, an insulator layer 612g on the gate electrode 610g, a halide perovskite layer 604g on the insulator layer 612g, and a semiconductor layer 618g on a halide perovskite layer 604g. The transistor 600g may further include a drain electrode 606g and a source electrode 608g on the semiconductor layer 618g, with the drain electrode 606g separated from the source electrode 608g.

Transistor 600h (bottom gate top contact with perovskite/transport layer active layer) may include a substrate 614h, a gate electrode 610h on the substrate 614h, an insulator layer 612h on the gate electrode 610h, a semiconductor layer 618h on the insulator layer 612h, and a halide perovskite layer 604h on the semiconductor layer 618h. The transistor 600h may further include a drain electrode 606h and a source electrode 608h on the halide perovskite layer 604h, with the drain electrode 606h separated from the source electrode 608h.

Figure 7A:
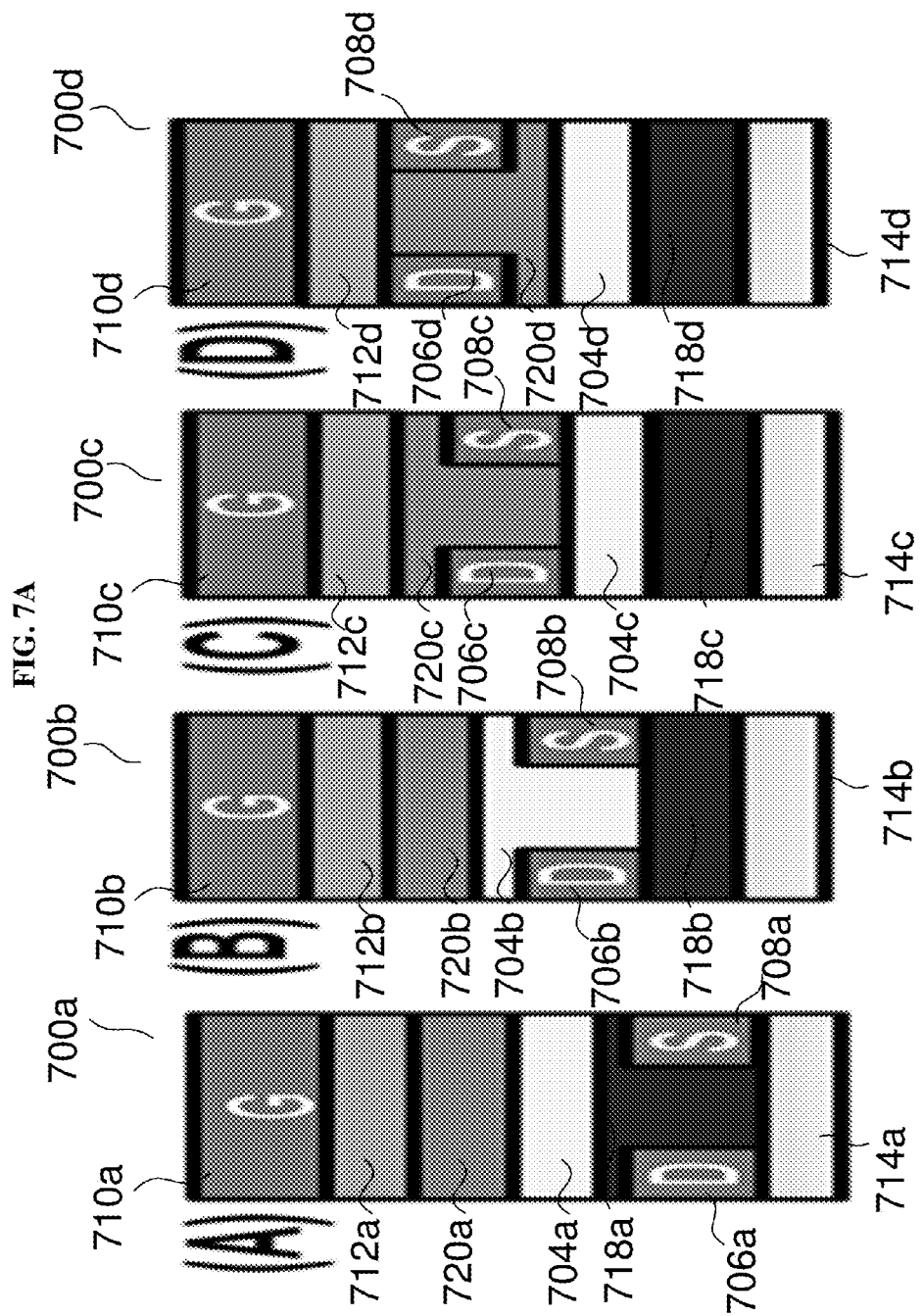
FIGS. 7A and 7B are schematics illustrating various embodiments of the vertical double heterojunction perovskite light-emitting field-effect transistor with a top hole transport layer (HTL).
Figure 7B:
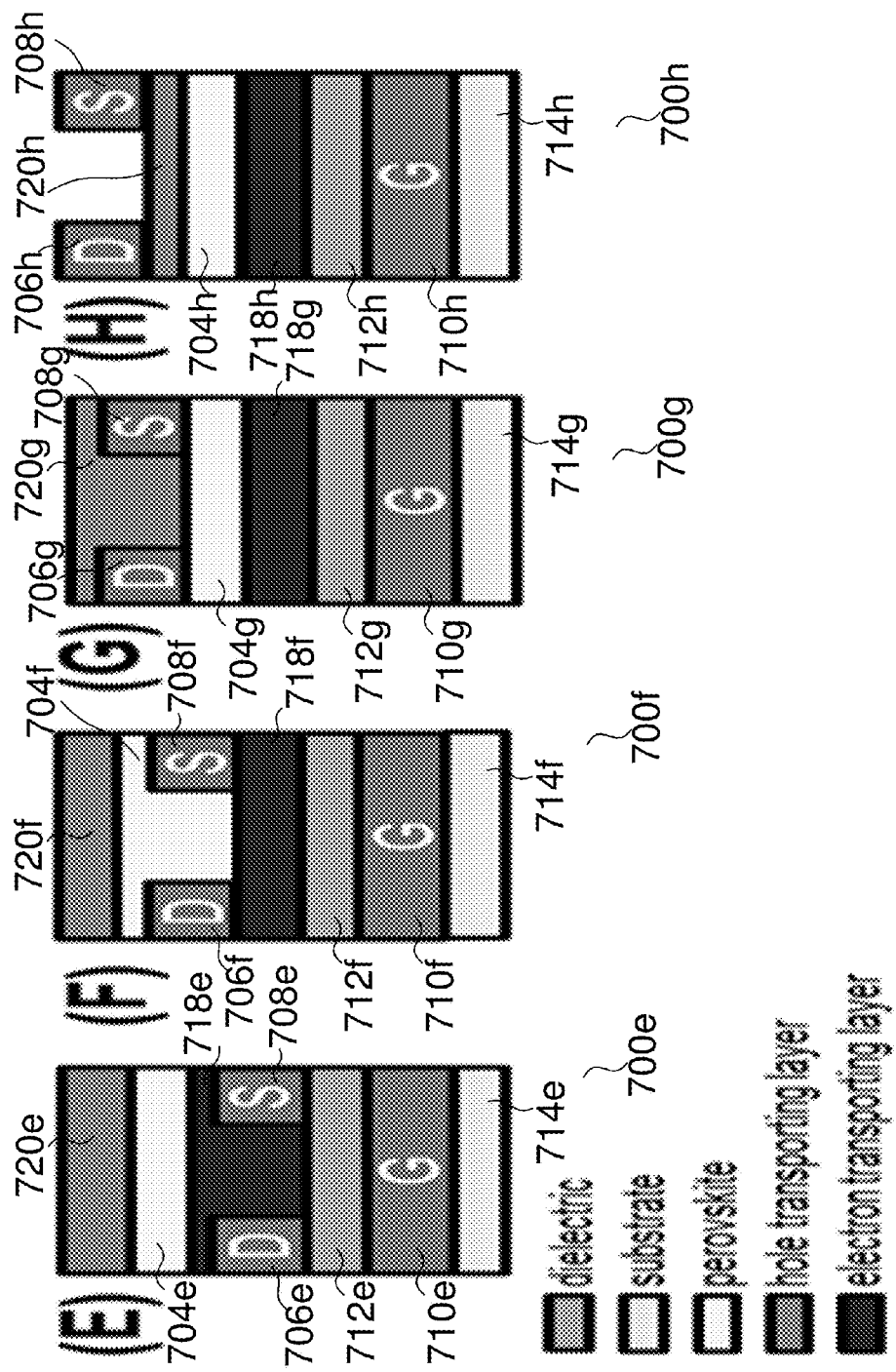

FIGS. 7A and 7B are schematics illustrating various embodiments of the light-emitting device. The light-emitting devices 700a-h illustrated in FIG. 7 are vertical double heterojunction perovskite light-emitting field-effect transistors (Pe-LEFET). The transistors 700a-h may include a halide perovskite layer 704a-h between an electron transport layer (ETL) 718a-h and a hole transport layer (HTL) 720a-h, with the halide perovskite layer 704a-h on the electron transport layer 718a-h and the hole transport layer 720a-h on the halide perovskite layer 704a-h.

Transistor 700a (top gate with contact in ETL of HTL/perovskite/ETL FET) may include substrate 714a, electron transport layer 718a on the substrate 714a, halide perovskite layer 704a on the electron transport layer 718a, hole transport layer 720a on the halide perovskite layer 704a, insulator layer 712a on the hole transport layer 720a, and gate electrode 710a on the insulator layer 712a. The drain electrode 706a may extend from a first lateral side of the electron transport layer 718a, and from an interface between the substrate 714a and the electron transport layer 718a. The source electrode 708a may extend from a second lateral side of the electron transport layer 718a, and from the interface between the substrate 714a and the electron transport layer 718a.

Transistor 700b (top gate with contact in perovskite layer of HTL/perovskite/ETL FET) may include substrate 714b, electron transport layer 718b on the substrate 714b, halide perovskite layer 704b on the electron transport layer 718b, hole transport layer 720b on the halide perovskite layer 704b, insulator layer 712b on the hole transport layer 720b, and gate electrode 710b on the insulator layer 712b. The drain electrode 706b may extend from a first lateral side of the halide perovskite layer 704b, and from an interface between the halide perovskite layer 704b and the electron transport layer 718b. The source electrode 708b may extend from a second lateral side of the halide perovskite layer 704b, and from the interface between the halide perovskite layer 704b and the electron transport layer 718b.

Transistor 700c (top gate with contact at bottom of HTL of HTL/perovskite/ETL FET) may include substrate 714c, electron transport layer 718c on the substrate 714c, halide perovskite layer 704c on the electron transport layer 718c, hole transport layer 720c on the halide perovskite layer 704c, insulator layer 712c on the hole transport layer 720c, and gate electrode 710c on the insulator layer 712c. The drain electrode 706c may extend from a first lateral side of the hole transport layer 720c, and from an interface between the halide perovskite layer 704c and the hole transport layer 720c. The source electrode 708c may extend from a second lateral side of the hole transport layer 720c, and from the interface between the halide perovskite layer 704c and the hole transport layer 720c.

Transistor 700d (top gate with contact at top of HTL of HTL/perovskite/ETL FET) may include substrate 714d, electron transport layer 718d on the substrate 714d, halide perovskite layer 704d on the electron transport layer 718d, hole transport layer 720d on the halide perovskite layer 704d, insulator layer 712d on the hole transport layer 720d, and gate electrode 710d on the insulator layer 712d. The drain electrode 706d may extend from a first lateral side of the hole transport layer 720d, and from an interface between the insulator layer 712d and the hole transport layer 720d. The source electrode 708d may extend from a second lateral side of the hole transport layer 720d, and from the interface between the insulator layer 712d and the hole transport layer 720d.

Transistor 700e (bottom gate with contact in ETL of HTL/perovskite/ETL FET) may include substrate 714e, gate electrode 710e on substrate 714e, insulator layer 712e on gate electrode 710e, electron transport layer 718e on the insulator layer 712e, halide perovskite layer 704e on the electron transport layer 718e, and hole transport layer 720e on the halide perovskite layer 704e. The drain electrode 706e may extend from a first lateral side of the electron transport layer 718e, and from an interface between the insulator layer 712e and the electron transport layer 718e. The source electrode 708e may extend from a second lateral side of the electron transport layer 718e, and from the interface between the insulator layer 712e and the electron transport layer 718e.

Transistor 700f (bottom gate with contact in perovskite layer of HTL/perovskite/ETL FET) may include substrate 714f, gate electrode 710f on substrate 714f, insulator layer 712f on gate electrode 710f, electron transport layer 718f on the insulator layer 712f, halide perovskite layer 704f on the electron transport layer 718f, and hole transport layer 720f on the halide perovskite layer 704f. The drain electrode 706f may extend from a first lateral side of the halide perovskite layer 704f, and from an interface between the halide perovskite layer 704f and the electron transport layer 718f. The source electrode 708f may extend from a second lateral side of the halide perovskite layer 704f, and from the interface between the halide perovskite layer 704f and the electron transport layer 718f.

Transistor 700g (bottom gate with contact at bottom of HTL of HTL/perovskite/ETL FET) may include substrate 714g, gate electrode 710g on substrate 714g, insulator layer 712g on gate electrode 710g, electron transport layer 718g on the insulator layer 712g, halide perovskite layer 704g on the electron transport layer 718g, and hole transport layer 720g on the halide perovskite layer 704g. The drain electrode 706g may extend from a first lateral side of the hole transport layer 720g, and from an interface between the halide perovskite layer 704g and the hole transport layer 720g. The source electrode 708g may extend from a second lateral side of the hole transport layer 720g, and from the interface between the halide perovskite layer 704g and the hole transport layer 720g.

Transistor 700h (bottom gate with contact above HTL of HTL/perovskite/ETL FET) may include substrate 714h, gate electrode 710h on substrate 714h, insulator layer 712h on gate electrode 710h, electron transport layer 718h on the insulator layer 712h, halide perovskite layer 704h on the electron transport layer 718h, and hole transport layer 720h on the halide perovskite layer 704h. The transistor 700h may further include a drain electrode 706h and a source electrode 708h on the hole transport layer 720h, with the drain electrode 706h separated from the source electrode 708h.

Figure 8A:
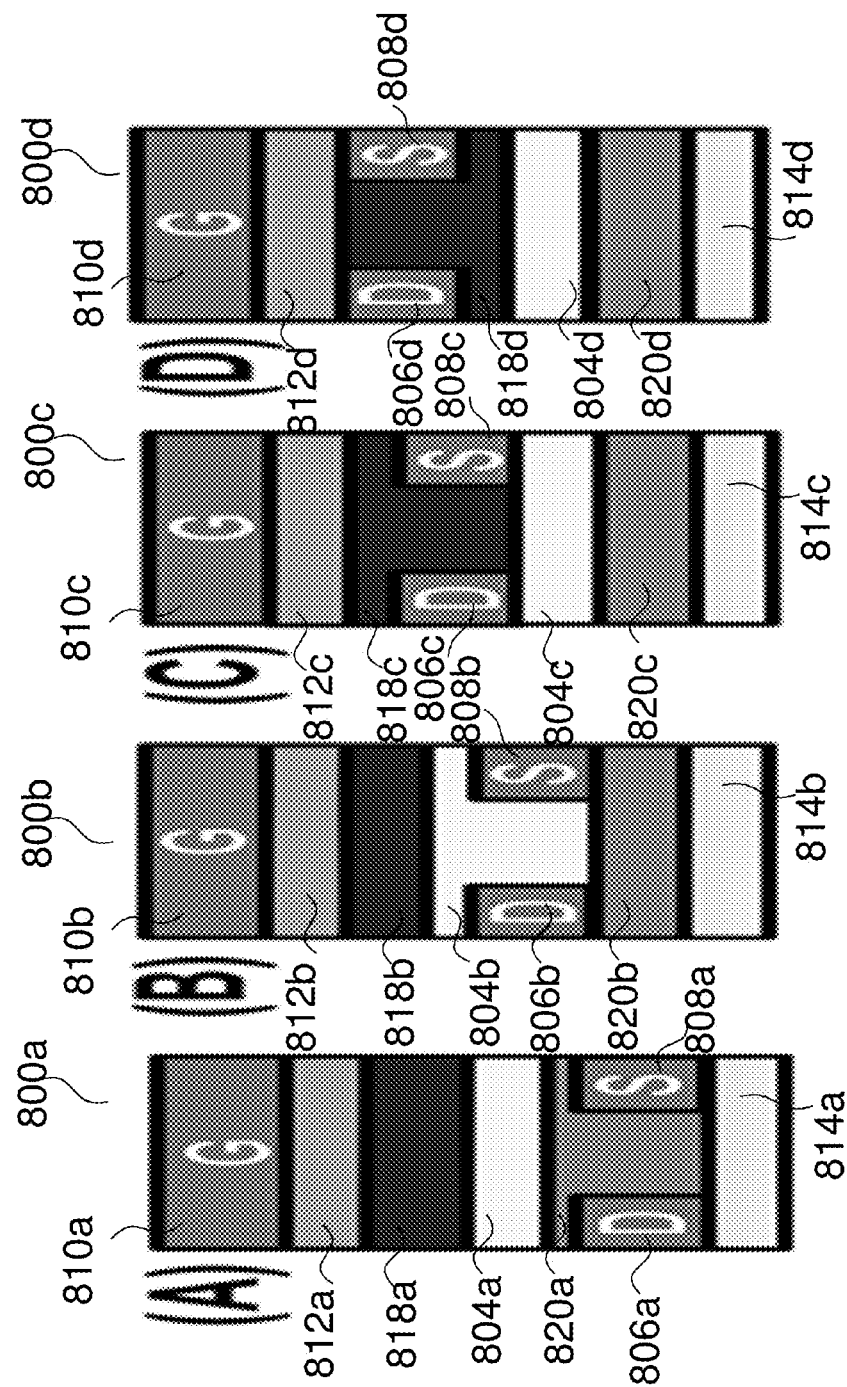

FIGS. 8A and 8B are schematics illustrating various embodiments of the light-emitting device. The light-emitting devices 800a-h illustrated in FIG. 8 are vertical double heterojunction perovskite light-emitting field-effect transistors (Pe-LEFET). The transistors 800a-h may include a halide perovskite layer 804a-h between an electron transport layer (ETL) 818a-h and a hole transport layer (HTL) 820a-h, with the halide perovskite layer 804a-h on hole transport layer 820a-h and the electron transport layer 818a-h on the halide perovskite layer 804a-h.

Transistor 800a (top gate with contact in HTL of ETL/perovskite/HTL FET) may include substrate 814a, hole transport layer 820a on the substrate 814a, halide perovskite layer 804a on the hole transport layer 820a, electron transport layer 818a on the halide perovskite layer 804a, insulator layer 812a on the electron transport layer 818a, and gate electrode 810a on the insulator layer 812a. The drain electrode 806a may extend from a first lateral side of the hole transport layer 820a, and from an interface between the substrate 814a and the hole transport layer 820a. The source electrode 808a may extend from a second lateral side of the hole transport layer 820a, and from the interface between the substrate 814a and the hole transport layer 820a.

Transistor 800b (top gate with contact in perovskite layer of ETL/perovskite/HTL FET) may include substrate 814b, hole transport layer 820b on the substrate 814b, halide perovskite layer 804b on the hole transport layer 820b, electron transport layer 818b on the halide perovskite layer 804b, insulator layer 812b on the electron transport layer 818b, and gate electrode 810b on the insulator layer 812b. The drain electrode 806b may extend from a first lateral side of the halide perovskite layer 804b, and from an interface between the halide perovskite layer 804b and the hole transport layer 820b. The source electrode 808b may extend from a second lateral side of the halide perovskite layer 804b, and from the interface between the halide perovskite layer 804b and the hole transport layer 820b.

Transistor 800c (top gate with contact at bottom of ETL of ETL/perovskite/HTL FET) may include substrate 814c, hole transport layer 820c on the substrate 814c, halide perovskite layer 804c on the hole transport layer 820c, electron transport layer 818c on the halide perovskite layer 804c, insulator layer 812c on the electron transport layer 818c, and gate electrode 810c on the insulator layer 812c. The drain electrode 806c may extend from a first lateral side of the electron transport layer 818c, and from an interface between the halide perovskite layer 804c and the electron transport layer 818c. The source electrode 808c may extend from a second lateral side of the electron transport layer 818c, and from the interface between the halide perovskite layer 804c and the electron transport layer 818c.

Transistor 800d (top gate with contact at top of ETL of ETL/perovskite/HTL FET) may include substrate 814d, hole transport layer 820d on the substrate 814d, halide perovskite layer 804d on the hole transport layer 820d, electron transport layer 818d on the halide perovskite layer 804d, insulator layer 812d on the electron transport layer 818d, and gate electrode 810d on the insulator layer 812d. The drain electrode 806d may extend from a first lateral side of the electron transport layer 818d, and from an interface between the insulator layer 812d and the electron transport layer 818d. The source electrode 808d may extend from a second lateral side of the electron transport layer 818d, and from the interface between the insulator layer 812d and the electron transport layer 818d.

Transistor 800e (bottom gate with contact in HTL of ETL/perovskite/HTL FET) may include substrate 814e, gate electrode 810e on substrate 814e, insulator layer 812e on gate electrode 810e, hole transport layer 820e on the insulator layer 812e, halide perovskite layer 804e on the hole transport layer 820e, and electron transport layer 818e on the halide perovskite layer 804e. The drain electrode 806e may extend from a first lateral side of the hole transport layer 820e, and from an interface between the insulator layer 812e and the hole transport layer 820e. The source electrode 808e may extend from a second lateral side of the hole transport layer 820e, and from the interface between the insulator layer 812e and the hole transport layer 820e.

Transistor 800f (bottom gate with contact in perovskite layer of ETL/perovskite/HTL FET) may include substrate 814f, gate electrode 810f on substrate 814f, insulator layer 812f on gate electrode 810f, hole transport layer 820f on the insulator layer 812f, halide perovskite layer 804f on the hole transport layer 820f, and electron transport layer 818f on the halide perovskite layer 804f. The drain electrode 806f may extend from a first lateral side of the halide perovskite layer 804f, and from an interface between the halide perovskite layer 804f and the hole transport layer 820f. The source electrode 808f may extend from a second lateral side of the halide perovskite layer 804f, and from the interface between the halide perovskite layer 804f and the hole transport layer 820f.

Transistor 800g (bottom gate with contact at bottom of ETL of ETL/perovskite/HTL FET) may include substrate 814g, gate electrode 810g on substrate 814g, insulator layer 812g on gate electrode 810g, hole transport layer 820g on the insulator layer 812g, halide perovskite layer 804g on the hole transport layer 820g, and electron transport layer 818g on the halide perovskite layer 804g. The drain electrode 806g may extend from a first lateral side of the electron transport layer 818g, and from an interface between the halide perovskite layer 804g and the electron transport layer 818g. The source electrode 808g may extend from a second lateral side of the electron transport layer 818g, and from the interface between the halide perovskite layer 804g and the electron transport layer 818g.

Transistor 800h (bottom gate with contact on ETL of ETL/perovskite/HTL FET) may include substrate 814h, gate electrode 810h on substrate 814h, insulator layer 812h on gate electrode 810h, hole transport layer 820h on the insulator layer 812h, halide perovskite layer 804h on the hole transport layer 820h, and electron transport layer 818h on the halide perovskite layer 804h. The transistor 800h may further include a drain electrode 806h and a source electrode 808h on the electron transport layer 818h, with the drain electrode 806h separated from the source electrode 808h.

Figure 9:
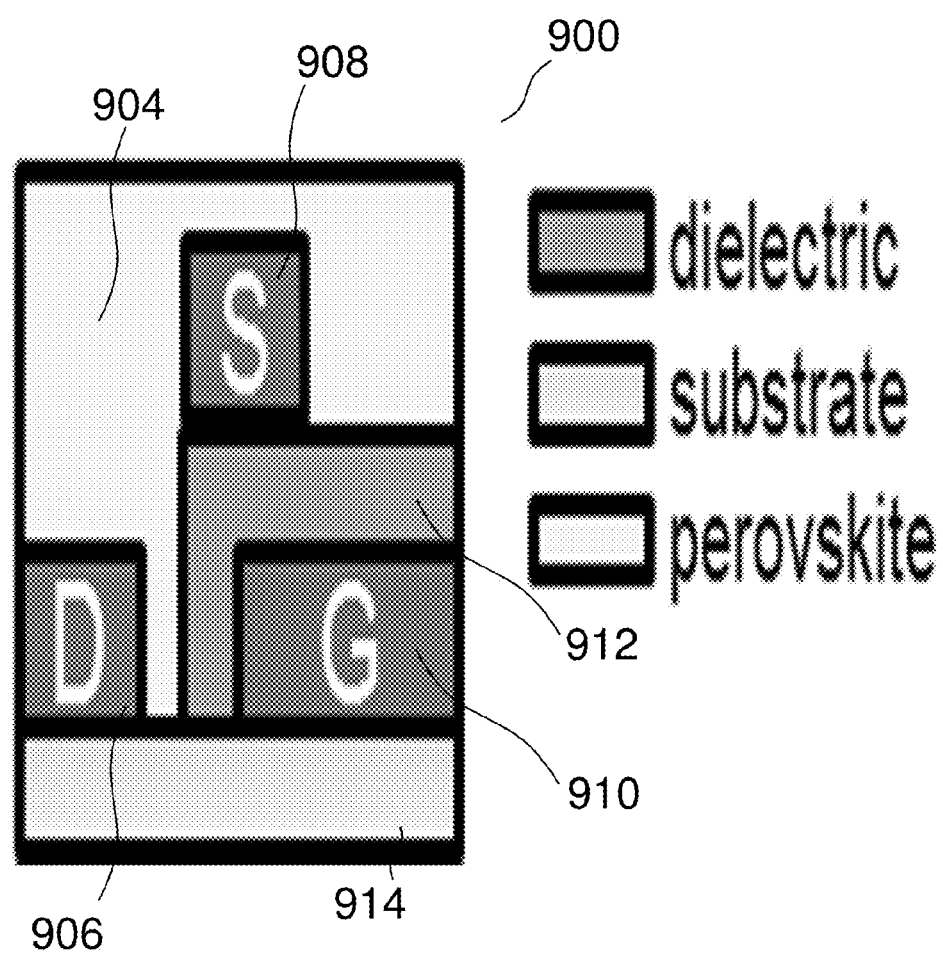
FIG. 9 is a schematic illustrating a light-emitting device having a vertical channel configuration according to various embodiments.

FIG. 9 is a schematic illustrating a light-emitting device 900 having a vertical channel configuration according to various embodiments. The device 900 may include a substrate 914, a gate electrode 910 on the substrate 914. The device 900 may further include a drain electrode 906 on the substrate 914 and lateral to the gate electrode 910. The device 900 may further include a source electrode 908 above the gate electrode 910. The device 900 may further include an insulator layer 912 separating the gate electrode 910 from the drain electrode 906 and the source electrode 908. The insulator layer 912 may be L-shaped, and may include a first dielectric section between the drain electrode 906 and the gate electrode 910, and may further include a second dielectric section between the source electrode 908 and the gate electrode 910, the second dielectric section substantially perpendicular to the first dielectric section. The device 900 may be configured to form a vertical channel, i.e. between the drain electrode 906 and the first dielectric section of the insulator layer 912. The channel may be substantially perpendicular to the substrate plane. The use of a vertical channel may allow for a more compact Pe-LEFET, which may result in greater ease for inclusion in the substrate area. A vertical channel may allow fabrication of small channel length, which may enable a smaller operating voltage.

Figure 10:
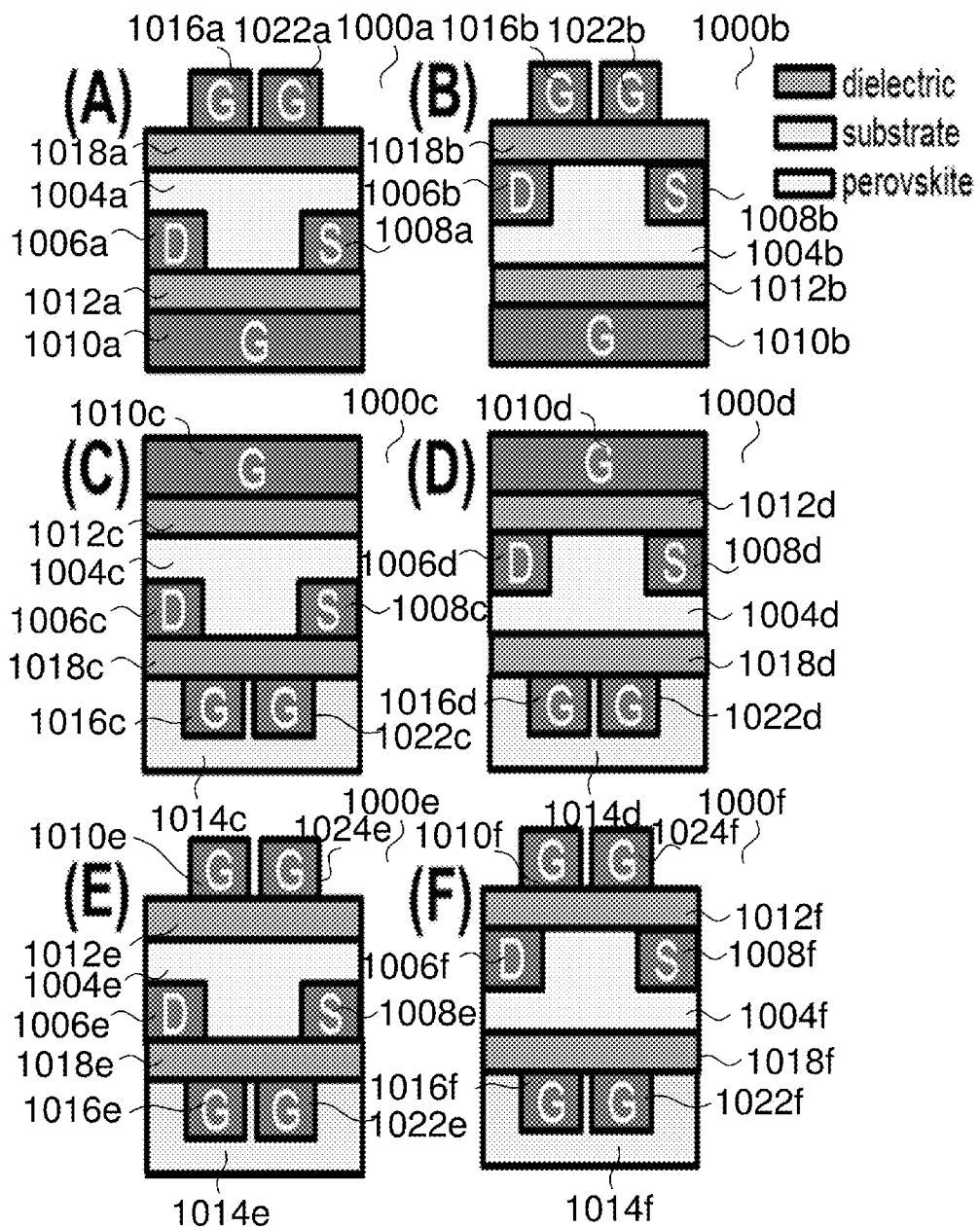
FIG. 10 is a schematic illustrating various embodiments of the light-emitting device with combined double and splitting gate configuration.

FIG. 10 is a schematic illustrating various embodiments of the light-emitting device with combined double and splitting gate configuration. The introduction of one or more extra gates in the Pe-LEFET may allow extra control over hole and electron injection. When different biases are applied to the different gates, carrier injection may be optimized and recombination/emission may be easily controlled.

Transistor 1000a may include a halide perovskite layer 1004a, a first insulator layer 1012a on a first surface of the halide perovskite layer 1004a, and a first gate electrode 1010a on the first insulator layer 1012a. The transistor 1000a may further include a second insulator layer 1018a on a second surface of the halide perovskite layer 1004a opposite the first surface, and second gate electrode 1016a and third gate electrode 1022a on the second insulator layer 1018a. In other words, the insulator layers 1012a, 1018a may be on opposite sides of the halide perovskite layer 1004a. Further, the gate electrode 1010a, and gate electrodes 1016a, 1022a may be on opposite sides of the halide perovskite layer 1004a. The transistor 1000a may include a first gate electrode 1010a, a first insulator layer 1012a on the first gate electrode 1010a, a halide perovskite layer 1004a on the first insulator layer 1012a, a second insulator layer 1018a on the halide perovskite layer 1004a, and a second gate electrode 1016a, a third gate electrode 1022a on the second insulator layer 1018a. The transistor 1000a may further include a drain electrode 1006a extending from a first lateral side of the halide perovskite layer 1004a, and from an interface between the halide perovskite layer 1004a and the first insulator layer 1012a. The transistor 1000a may also include a source electrode 1008a extending from a second lateral side of the halide perovskite layer 1004a, and from an interface between the halide perovskite layer 1004a and the first insulator layer 1012a.

Transistor 1000b may include a halide perovskite layer 1004b, a first insulator layer 1012b on a first surface of the halide perovskite layer 1004b, and a first gate electrode 1010b on the first insulator layer 1012b. The transistor 1000b may further include a second insulator layer 1018b on a second surface of the halide perovskite layer 1004b opposite the first surface, and second gate electrode 1016b and third gate electrode 1022b on the second insulator layer 1018b. In other words, the insulator layers 1012b, 1018b may be on opposite sides of the halide perovskite layer 1004b. Further, the gate electrode 1010b, and gate electrodes 1016b, 1022b may be on opposite sides of the halide perovskite layer 1004b. The transistor 1000b may include a first gate electrode 1010b, a first insulator layer 1012b on the first gate electrode 1010b, a halide perovskite layer 1004b on the first insulator layer 1012b, a second insulator layer 1018b on the halide perovskite layer 1004b, and a second gate electrode 1016b, a third gate electrode 1022b on the second insulator layer 1018b. The transistor 1000b may further include a drain electrode 1006b extending from a first lateral side of the halide perovskite layer 1004b, and from an interface between the halide perovskite layer 1004b and the second insulator layer 1018b. The transistor 1000b may also include a source electrode 1008b extending from a second lateral side of the halide perovskite layer 1004b, and from an interface between the halide perovskite layer 1004b and the second insulator layer 1018b.

Transistor 1000c may include a substrate 1014c, an insulator layer 1018c on the substrate 1014c, a halide perovskite layer 1004c on the insulator layer 1018c, an insulator layer 1012c on the halide perovskite layer 1004c and a gate electrode 1010c on the insulator layer 1012c. The transistor 1000c may further include gate electrodes 1016c, 1022c in the substrate 1014c and adjoining the insulator layer 1018c. The gate electrode 1016c may be separated from the gate electrode 1022c by a portion of the substrate 1014c. The transistor 1000c may further include a drain electrode 1006c extending from a first lateral side of the halide perovskite layer 1004c, and from an interface between the halide perovskite layer 1004c and the insulator layer 1018c. The transistor 1000c may also include a source electrode 1008c extending from a second lateral side of the halide perovskite layer 1004c, and from an interface between the halide perovskite layer 1004c and the insulator layer 1018c.

Transistor 1000d may include a substrate 1014d, an insulator layer 1018d on the substrate 1014d, a halide perovskite layer 1004d on the insulator layer 1018d, an insulator layer 1012d on the halide perovskite layer 1004d and a gate electrode 1010d on the insulator layer 1012d. The transistor 1000d may further include gate electrodes 1016d, 1022d in the substrate 1014d and adjoining the insulator layer 1018d. The gate electrode 1016d may be separated from the gate electrode 1022d by a portion of the substrate 1014d. The transistor 1000d may further include a drain electrode 1006d extending from a first lateral side of the halide perovskite layer 1004d, and from an interface between the halide perovskite layer 1004d and the insulator layer 1012d. The transistor 1000d may also include a source electrode 1008d extending from a second lateral side of the halide perovskite layer 1004d, and from an interface between the halide perovskite layer 1004d and the insulator layer 1012d.

Transistor 1000e may include a substrate 1014e, an insulator layer 1018e on the substrate 1014e, a halide perovskite layer 1004e on the insulator layer 1018e, an insulator layer 1012e on the halide perovskite layer 1004e and separate gate electrodes 1010e, 1024e on the insulator layer 1012e. The transistor 1000e may further include gate electrodes 1016e, 1022e in the substrate 1014e and adjoining the insulator layer 1018e. The gate electrode 1016e may be separated from the gate electrode 1022e by a portion of the substrate 1014e. The transistor 1000e may further include a drain electrode 1006e extending from a first lateral side of the halide perovskite layer 1004e, and from an interface between the halide perovskite layer 1004e and the insulator layer 1018e. The transistor 1000e may also include a source electrode 1008e extending from a second lateral side of the halide perovskite layer 1004e, and from an interface between the halide perovskite layer 1004e and the insulator layer 1018e.

Transistor 1000f may include a substrate 1014f, an insulator layer 1018f on the substrate 1014f, a halide perovskite layer 1004f on the insulator layer 1018f, an insulator layer 1012f on the halide perovskite layer 1004f and separate gate electrodes 1010f, 1024f on the insulator layer 1012f. The transistor 1000f may further include gate electrodes 1016f, 1022f in the substrate 1014f and adjoining the insulator layer 1018f. The gate electrode 1016f may be separated from the gate electrode 1022f by a portion of the substrate 1014f. The transistor 1000f may further include a drain electrode 1006f extending from a first lateral side of the halide perovskite layer 1004f, and from an interface between the halide perovskite layer 1004f and the insulator layer 1012f. The transistor 1000f may also include a source electrode 1008f extending from a second lateral side of the halide perovskite layer 1004f, and from an interface between the halide perovskite layer 1004f and the insulator layer 1012f.

Figure 11:
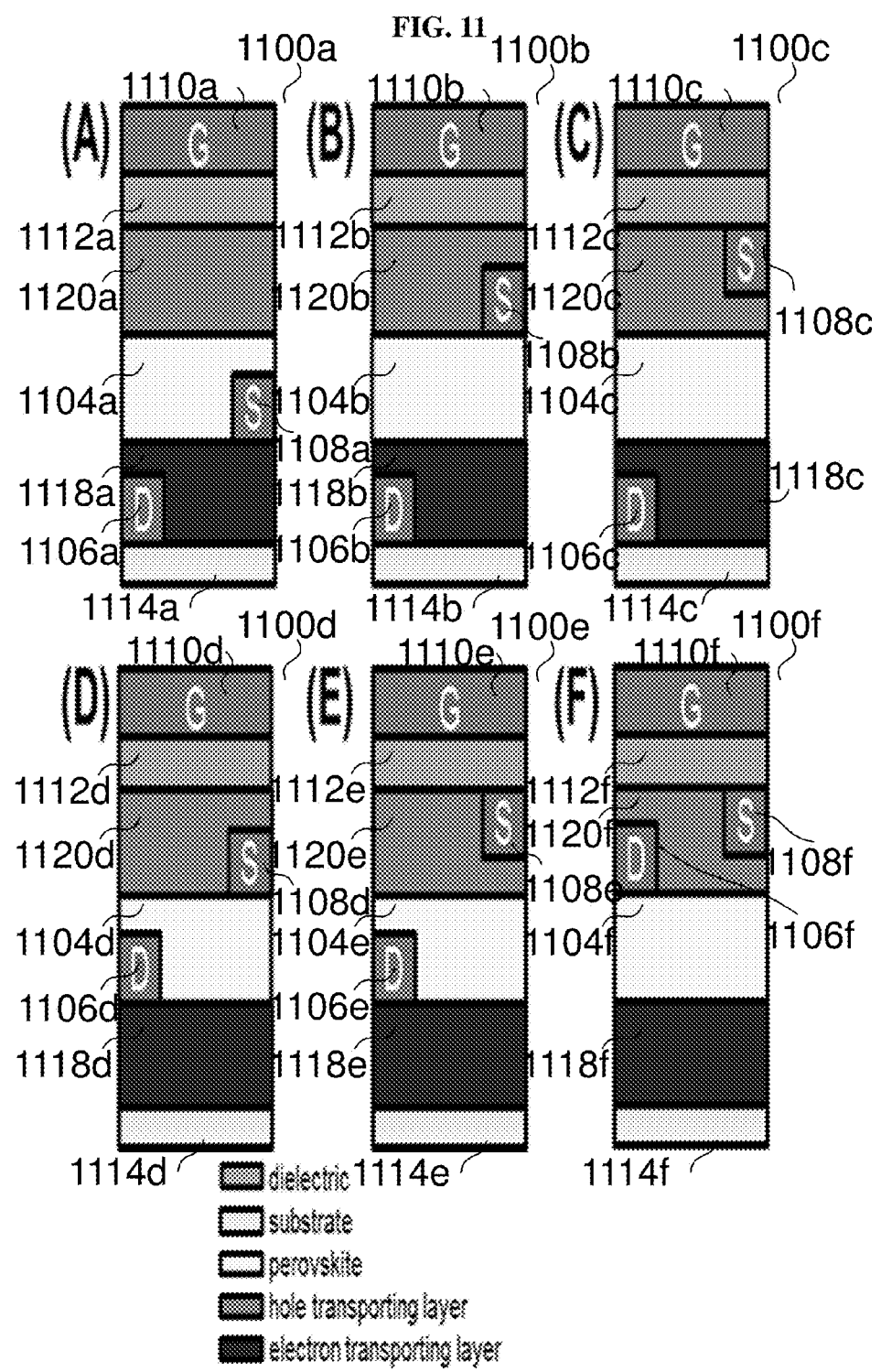
FIG. 11 is a schematic illustrating various embodiments of the light-emitting device with at least one of the drain electrode and source electrode positioned at a different active layer from the perovskite halide layer.

FIG. 11 is a schematic illustrating various embodiments of the light-emitting device with at least one of the drain electrode and source electrode positioned at a different active layer from the perovskite halide layer. The drain electrode and source electrode may be positioned at different layers or may be positioned at the same layer. The positioning of the contact electrodes (i.e. the drain electrode and the source electrode) at different active layers (i.e. the electron transport layer, the hole transport layer or the halide perovskite layer) or in a same active layer (i.e. the electron transport layer or the hole transport layer) may help improve the injection of holes and/or electrons into the active structure. FIG. 11 illustrates positioning of contact electrodes in different active layers or same active layer of a top gate FET with HTL/perovskite/ETL active structure. The positioning of different contact electrodes at different active layers or the same active layer may also apply to other multilayer active structure FET configurations.

Transistor 1100a may include a substrate 1114a, an electron transport layer 1118a on the substrate 1114a, a halide perovskite layer 1104a on the electron transport layer 1118a, a hole transport layer 1120a on the halide perovskite layer 1104a, an insulator layer 1112a on the hole transport layer 1120a, and the gate electrode 1110a on the insulator layer 1112a. The transistor 1100a may further include a drain electrode 1106a at or in contact with the electron transport layer 1118a (extending from interface between the substrate 1114a and the electron transport layer 1118a), and a source electrode 1108a at or in contact with the halide perovskite layer 1104a (extending from interface between electron transport layer 1118a and the perovskite layer 1104a).

Transistor 1100b may include a substrate 1114b, an electron transport layer 1118b on the substrate 1114b, a halide perovskite layer 1104b on the electron transport layer 1118b, a hole transport layer 1120b on the halide perovskite layer 1104b, an insulator layer 1112b on the hole transport layer 1120b, and the gate electrode 1110b on the insulator layer 1112b. The transistor 1100b may further include a drain electrode 1106b at or in contact with the electron transport layer 1118b (extending from interface between the substrate 1114b and the electron transport layer 1118b), and a source electrode 1108b at or in contact with the hole transport layer 1120*b* (extending from interface between hole transport layer 1120*b* and the perovskite layer 1104*b*).

Transistor 1100*c* may include a substrate 1114*c*, an electron transport layer 1118*c* on the substrate 1114*c*, a halide perovskite layer 1104*c* on the electron transport layer 1118*c*, a hole transport layer 1120*c* on the halide perovskite layer 1104*c*, an insulator layer 1112*c* on the hole transport layer 1120*c*, and the gate electrode 1110*c* on the insulator layer 1112*c*. The transistor 1100*c* may further include a drain electrode 1106*c* at or in contact with the electron transport layer 1118*c* (extending from interface between the substrate 1114*c* and the electron transport layer 1118*c*), and a source electrode 1108*c* at or in contact with the hole transport layer 1120*c* (extending from interface between hole transport layer 1120*c* and the insulator layer 1112*c*).

Transistor 1100*d* may include a substrate 1114*d*, an electron transport layer 1118*d* on the substrate 1114*d*, a halide perovskite layer 1104*d* on the electron transport layer 1118*d*, a hole transport layer 1120*d* on the halide perovskite layer 1104*d*, an insulator layer 1112*d* on the hole transport layer 1120*d*, and the gate electrode 1110*d* on the insulator layer 1112*d*. The transistor 1100*d* may further include a drain electrode 1106*d* at or in contact with the halide perovskite layer 1104*d* (extending from interface between the halide perovskite layer 1104*d* and the electron transport layer 1118*d*), and a source electrode 1108*d* at or in contact with the hole transport layer 1120*d* (extending from interface between hole transport layer 1120*d* and the perovskite layer 1104*d*).

Transistor 1100*e* may include a substrate 1114*e*, an electron transport layer 1118*e* on the substrate 1114*e*, a halide perovskite layer 1104*e* on the electron transport layer 1118*e*, a hole transport layer 1120*e* on the halide perovskite layer 1104*e*, an insulator layer 1112*e* on the hole transport layer 1120*e*, and the gate electrode 1110*e* on the insulator layer 1112*e*. The transistor 1100*e* may further include a drain electrode 1106*e* at or in contact with the halide perovskite layer 1104*e* (extending from interface between the halide perovskite layer 1104*e* and the electron transport layer 1118*e*), and a source electrode 1108*e* at or in contact with the hole transport layer 1120*e* (extending from interface between hole transport layer 1120*e* and the insulator layer 1112*e*).

Transistor 1100*f* may include a substrate 1114*f*, an electron transport layer 1118*f* on the substrate 1114*f*, a halide perovskite layer 1104*f* on the electron transport layer 1118*f*, a hole transport layer 1120*f* on the halide perovskite layer 1104*f*, an insulator layer 1112*f* on the hole transport layer 1120*f*, and the gate electrode 1110*f* on the insulator layer 1112*f*. Both the drain electrode 1106*f* and the source electrode 1108*f* may be at or in contact with the hole transport layer 1120*f*. The drain electrode 1106*f* may extend from an interface between the hole transport layer 1120*f* and the halide perovskite layer 1104*f*, while the source 1108*f* may extend from an interface between the hole transport layer 1120*f* and the insulator layer 1112*f*.

Various embodiments may seek to improve the recombination and/or emission from the active structure by increasing the density of carriers at the induced active channel when the gate voltage is applied.

In various embodiments, the gate electrode or control electrode may be a ferroelectric gate. The gate electrode or control electrode may include a ferroelectric material such as poly[(vinylidenefluoride-co-trifluoroethylene] (PVDF-TrFE). The ferroelectric material may allow for a higher induced carrier density through polarization electric field that induces higher carrier concentration at the surface. The polarization field may allow for higher accumulation of carrier density at the semiconductor-dielectric interface.

In various embodiments, the gate electrode or control electrode may be an ionic gate. The gate electrode or control electrode may include an ionic gate dielectric. Similar for ionic gate dielectric, a higher carrier density may promote better emission rate since probability of electron-hole pair recombination may be more significant at a higher carrier density. An ionic gate dielectric may include one or more polyelectrolyte materials that may form a polarized electric field upon applying voltage bias. The polarization field may allow for a higher capacitance per unit, hence enabling a higher induced carrier density at the semiconductor-dielectric interface. Enhancement in carrier density may increase the recombination rate, leading to a higher emission rate.

Figure 12:
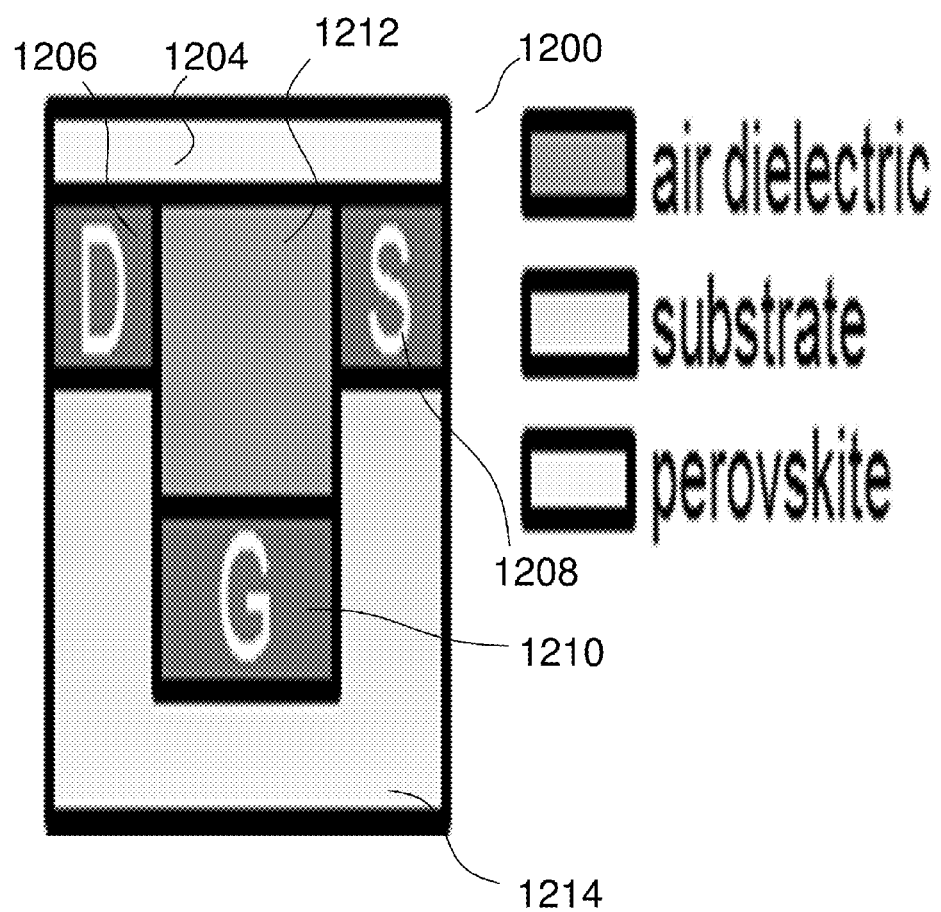
FIG. 12 is a schematic illustrating a light-emitting device having an air gap gate dielectric according to various embodiments.

In various embodiments, the insulator layer may include an air gap gate dielectric. In other words, the insulator layer may be or may include an air gap. FIG. 12 is a schematic illustrating a light-emitting device 1200 having an air gap gate dielectric 1212 according to various embodiments. The device 1200 may include a substrate 1214 with a cavity, and a gate electrode 1210 within the cavity so that the gate electrode takes up a portion of the cavity. The device 1200 may further include a drain electrode 1206 on a first lateral side portion of the substrate 1214, and a source electrode 1208 on a second lateral side portion of the substrate 1214. The device 1200 may further include an active perovskite layer 1204 on the drain electrode 1206 and the source electrode 1208 so that an air gap 1212 is enclosed by the substrate 1214, the gate electrode 1210, the drain electrode 1206, the source electrode 1208 and the active perovskite layer 1204. The active perovskite layer 1204 may have a first end portion held by the drain electrode 1206 and a second end portion held by the source electrode 1208 so that the layer 1204 is suspended over the air gap 1212.

In various embodiments, the insulator layer may include suitable self-assembled molecules such as hexamethyldisilazane, β-phenethyltrichlorosilane, tridecafluorooctyltrichlorosilane, octyltrichlorosilane. A low density of trap states at the gate dielectric surface may be desirable to achieve higher induced carrier density and higher field-effect charge transport. Self-assembled molecules may be used to passivate the trap states at the surface of the gate dielectric to achieve better charge transport.

In various embodiments, the insulator layer may include a plurality of high-κ dielectric sub-layers to achieve higher induced charge density. The high-κ material may have low number of traps for better charge transport. A higher density of charge carriers and faster charge transport may be desirable to achieve higher radiative recombination rate.

Carrier injection is a process where holes and electrons are injected from source-drain electrodes into the active channel. Improvement in carrier injection may help reduce the operating voltages of the Pe-LEFET, thus achieving higher external quantum efficiency.

Ambipolar Pe-LEFETs may require injection of both holes and electrons from source-drain into the active structure to achieve radiative recombination of holes and electrons. The injection of carriers may be affected by the alignment of the work function of electrode to conduction and valence bands of the active materials. Symmetric electrodes, i.e. same materials used for source and drain, may typically allow efficient injection of either hole or electron into the active channel. When asymmetric electrodes are used for source and drain, a respective low and a high work function of electrodes may optimize the hole and electron injection. This may allow an overall lower operating voltage and higher recombination efficiency for the fabricated Pe-LEFET.

The formation of conventional metallic electrodes may require high vacuum deposition methods, such as thermal resistance evaporation and electron beam thermal evaporation techniques. These methods may require apparatuses/instruments such as vacuum chambers and vacuum pumps, which may significantly increase the device fabrication cost as well as the fabrication time. The use of solution processable organic metallic materials, such as poly(3,4-ethylenedioxythiophene) polystyrene sulfonate (PEDOT:PSS), may allow for lower cost and higher throughput fabrication.

Low work function metallic materials may be easier to be oxidized. A conductive inorganic metal oxide, such as zinc oxide, may be used as a low work function electrode. This may allow a better stability and longer lifetime for the fabricated devices.

The low work function electrodes may be desirable for injecting electron into the active channel. Conventional low work function metallic electrodes may be easily oxidized while conductive inorganic metal oxides may require doping to achieve suitable conductivity. A surface modifier, such as polyethyleneimine (PEI) or polyethyleneimine ethoxylated (PEIE), may be used to lower the work function of metallic electrode to facilitate the electron injection.

Pe-LEFETs may be realized using deposition methods as single step and double step spin coating, drop casting, screen printing, evaporation, sublimation, and doctor blade. Small scale and large scale printing of the devices may be fabricated using various printing techniques. Ink-jet printing methods may be used both in continuous or drop-on-demand mode to optimize the uniformity and the thickness of the perovskite material and the other layers of the device. Other printing techniques for the active material and/or the other layers of the device may include roll-to-roll and gravure printing. Pe-LEFET devices may be also realized using both vacuum-based sublimation chemical vapour deposition, and/or other physical methods, which may allow for an extremely flat surface to be obtained in the devices.

The Pe-LEFET devices may be realized also on a variety of flexible and transparent substrates, including polyethylene naphthalate (PEN), polyethylene terephthalate (PET), or paper, to realize flexible devices. The devices may be formed based on substrates such as silicon or glass using standard microelectronic techniques. In order to optimize the performances over time and ambient operating conditions, various encapsulation methods may be employed. Various embodiments may provide a device including a mold encapsulation to encapsulate one or more other components of the device, such as the halide perovskite layer.

Three dimensional (3-D) and two dimensional (2-D) hybrid organic-inorganic and fully inorganic perovskites may be used in the active structure of LE-FET. The halide perovskite layer may include a 3D or a 2D perovskite material. The halide perovskite layer may include a hybrid organic-inorganic perovskite material or a fully inorganic perovskite material.

3-D perovskites are a class of materials with the general formula $ABX_3$. A may be selected from the group consisting of an organic ammonium cation derived from $RNH_3$ wherein R is an aliphatic group, a cyclic group, or an aromatic group; an organic cation derived from an aromatic compound; and an inorganic cation comprising $Li^+$, $Na^+$, $K^+$, $Rb^+$ or $Cs^+$. A may instead be a mixture or combination of organic/inorganic cations. B may be a metal with respective valence $M^{2+}$, $M^{4+}$, $M^{6+}$ (e.g. $Pb^{2+}/Sn^{2+}$; $Sn^{4+}$; $Cu^{6+}$). X may be a halide selected from the group consisting of $Cl^-$, $Br^-$, $F^-$, $I^-$, and an oxygen-halide. X may be a mixture or combination of different halides.

2-D perovskite are a class of materials with the general formula $ABX_4$ and $A_2BX_4$. In this case A may be selected from the group consisting of an organic ammonium cation derived from $RNH_3$ wherein R is an aliphatic group, a cyclic group, or an aromatic group; an organic cation derived from an aromatic compound; and an inorganic cation including $Li^+$, $Na^+$, $K^+$, $Rb^+$, or $Cs^+$. A may instead be a mixture or combination of organic/inorganic cations.

For materials with the formula $ABX_4$, A may be a di-ammonium valence cation. For materials with the formula $A_2BX_4$, A may be a mono-ammonium cation. B may be a metal with valence $M^{2+}$, (e.g. $Pb^{2+}/Sn^{2+}$). X may be a halide selected from the group consisting of $Cl^-$, $Br^-$, $F^-$, $I^-$, and an oxygen-halide. X may instead be a mixture or a combination of different halides.

Figure 13:
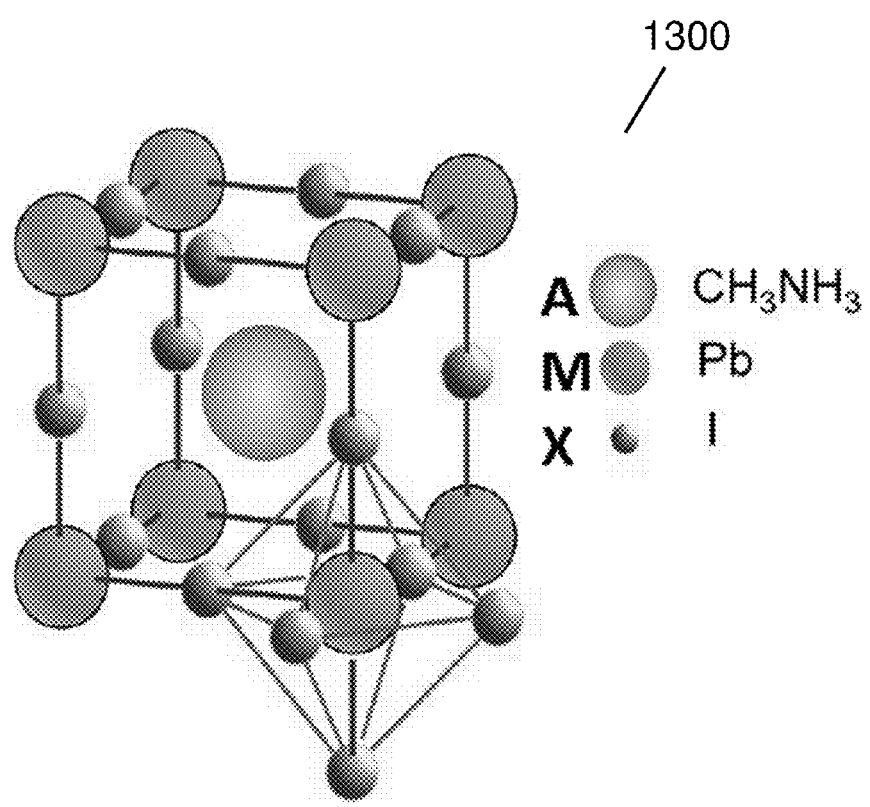
FIG. 13 is a schematic showing a crystal structure of a halide perovskite material according to various embodiments.

FIG. 13 is a schematic showing a crystal structure of a halide perovskite material according to various embodiments. The halide perovskite material is $CH_3NH_3PbI$, which has an $AMX_3$ perovskite crystalline system.

Different combinations of both 3-D and 2-D perovskite materials may show both narrow and broadband emission ranging from the ultra violet (UV) to visible and up to the infrared (IR) spectral region. The materials may achieve high photoluminescence yield (from ultraviolet region to near infrared region). The conductivity of the material may also be improved by tuning the material composition leading to high charge carrier mobility and ambipolar charge transfer characteristics.

Morphology for the active perovskite material in Pe-LEFET devices may be optimized by enlarging crystal size in order to reduce boundary effects, and so increasing current density to reach mobility values as high as the ones previously predicted by the density functional theory (DFT). Various embodiments may employ morphology control to increase crystallinity and film uniformity. Single crystal Pe-LEFET devices may be also realized using the structures as described herein. Quantum confined low-dimensional perovskite nanostructures (as quantum dots, nanowires, nanoplates) may highly increase the emission yield respect to one of the corresponding bulk material. Nanostructures may be used as an active material to improve efficiency of Pe-LEFET devices. In quantum confined nanostructures, charge carrier density may also be highly increased, leading to better performing devices. Pe-LEFET carrier mobility may also be improved by surface passivation using inorganic surface ligands (e.g. Cl, I) to obtain higher electroluminescence yield. Inserting of new injection layers and/or modifying the interfacial properties between layers to increase efficiency through band engineering or optimization may be employed.

A LEFET is a field-effect transistor which is capable of emitting light. A LEFET may has switchable electroluminescence (bright and fast), balanced charge carrier recombination, offer spatial control of emission, and/or ease of integration as a nanoscale light source in optoelectronic and photonic devices.

Figure 14A:
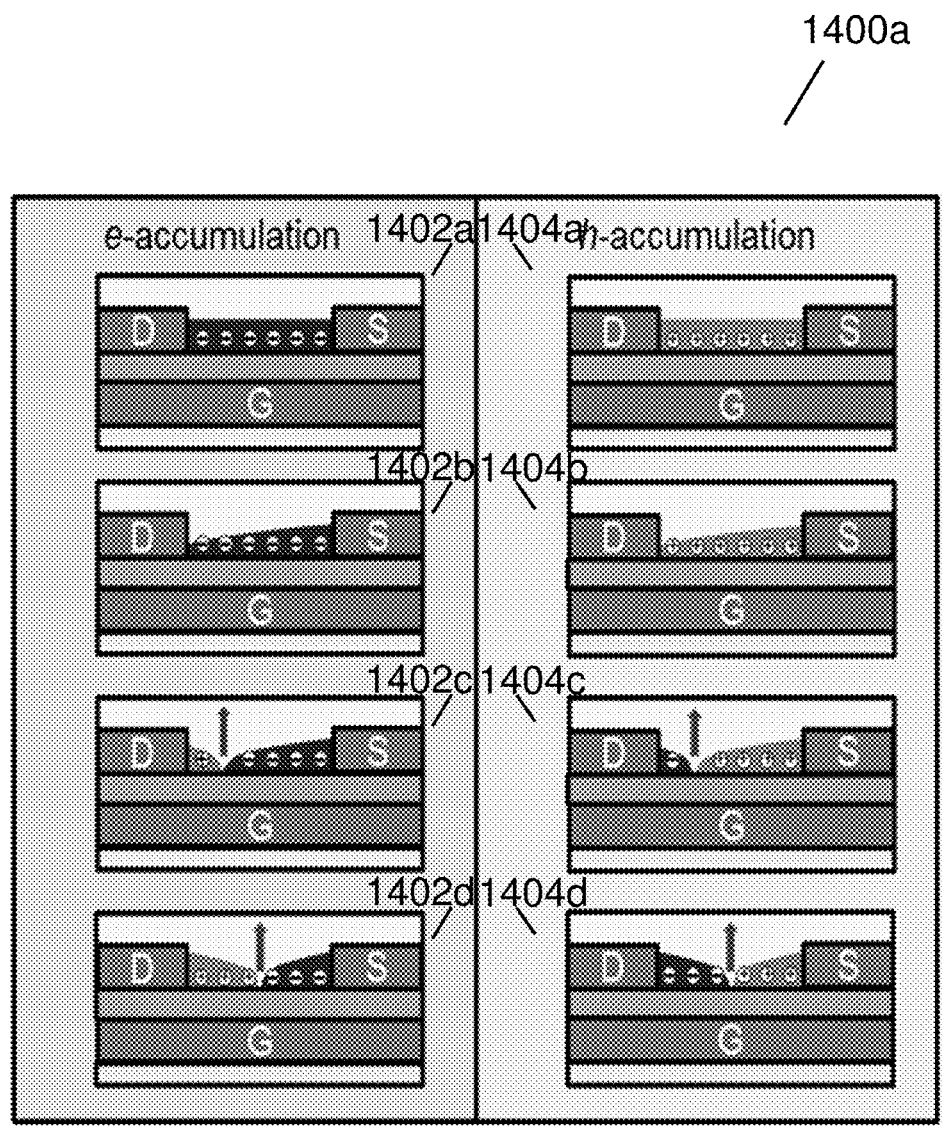
FIG. 14A is a schematic illustrating the working principle of a halide perovskite light-emitting transistor according to various embodiments.

FIG. 14A is a schematic 1400a illustrating the working principle of a halide perovskite transistor according to various embodiments. 1402a-d show the ambipolar FET functioning in electron accumulation mode. The FET may function by applying a positive gate bias to accumulate electron at the active channel (1402a). Applying a positive drain-source bias may deplete electron carrier density at the area close to drain (1402b). Holes may be injected as a result of biasing a higher drain-source voltage (1402c). The arrow indicates the light emission. By further increasing the source-drain bias, the emission area may move to channel center (1402d). 1404a-d show the ambipolar FET functioning in hole accumulation mode. The FET may function by applying a negative gate bias to accumulate hole at the active channel (1404a). Applying a negative drain-drain-source bias may deplete hole carrier density at the area close to drain. (1404b). Electrons may be injected as a result of biasing a higher negative drain-source voltage (1404c). The arrow indicates the light emission. By further increasing the negative source-drain bias, the emission area may move to channel center (1404d).

Pe-LEFET is a perovskite based field-effect transistor that may emit light when the biases are properly applied. The schematics and working principle of Pe-LEFET of a bottom gate bottom contact (BGBC) structure is shown in FIG. 14A for the electron accumulation mode (1402a-d) and for the hole accumulation mode (1404a-d). In general, the same working principle may also be applied to bottom gate top contact (BGTC), top gate bottom contact (TGBC), and top gate top contact (TGTC) structures.

For electron accumulation mode (1402a-d), electrons may be induced at the active structure by applying positive gate voltage (1402a). Source electrode may be grounded by default. A positive bias may be applied to drain-source to drive the accumulated electron to transport from source to drain electrode (1402b). Meanwhile, depletion of carrier density close to drain electrode may be due to decrease in local potential when drain-source is biased (1402b). By increasing the drain-source bias, holes may be injected from the drain electrode if the local drain potential is higher than the hole injection threshold voltage (1402c). The injected holes may radiatively recombine with electron to give light mission, as indicated with arrow in 1402c. A further increase in drain-source voltage may improve the hole injection, pushing the emission further from drain (closer to source) electrode (1402d).

A similar mechanism for ambipolar FET operating in hole accumulation mode (1404a-d). A negative gate voltage may be applied to induce holes at the active structure (1404a). Hole transport from source to drain electrode may be driven by a negative drain-source bias (1404b). Similarly, the negative drain-source bias may decrease the local potential close to the drain electrode and depletes the carrier density (1404b). Electron may be injected from drain electrode when a higher drain-source voltage is applied, when the local drain potential is higher than the electron injection threshold voltage (1404c). Emission area may be moved inside the channel by improving the electron injection through modulating the negative drain-source voltage (1404d).

Figure 14B:
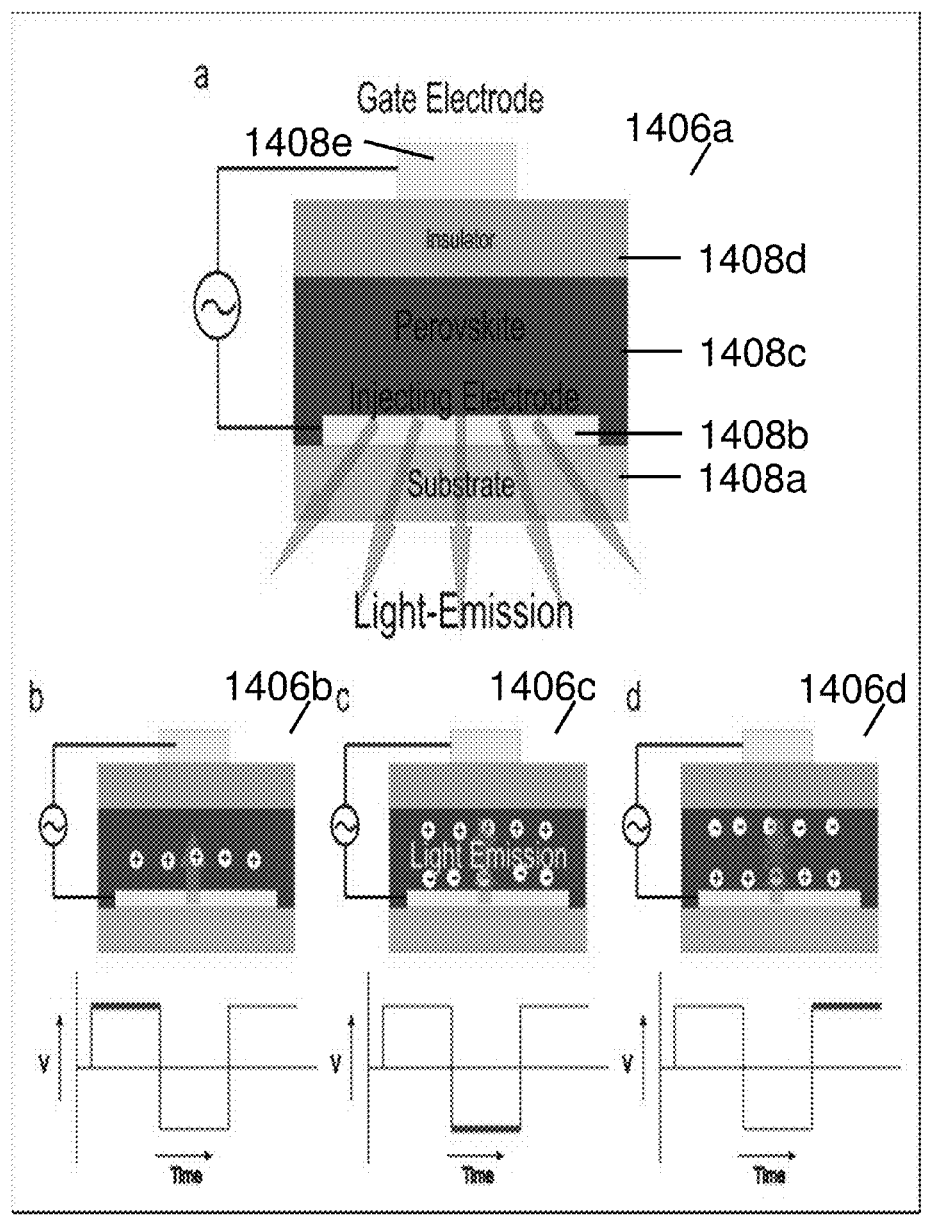
FIG. 14B is a schematic illustrating the working principle of a halide perovskite light-emitting metal-insulator-semiconductor diode according to various embodiments.

FIG. 14B is a schematic illustrating the working principle of a halide perovskite light-emitting metal-insulator-semiconductor diode according to various embodiments. 1406a shows the structure of the diode including a substrate 1408a, a injecting electrode 1408b on the substrate 1408a, a halide perovskite layer 1408c on the injecting electrode 1408b, an insulator layer 1408d on the halide perovskite layer 1408c, and a gate electrode 1408e on the insulator layer 1408d. 1406b-d illustrate the operation of the diode shown in 1406a.

The Pe-LEFET may be operated in AC-driven modality in order to minimize screening issues caused by ionic motion in perovskites. A schematic of the AC-driven light-emitting metal-insulator-semiconductor diode is shown in FIG. 14B. In this case only two electrodes 1408b, 1408e may be necessary, an injecting electrode 1408b and a gate electrode 1408e. Applying a bias on the gate 1408e may induce accumulation of charge carriers, electrons or holes. By applying an alternating electric field, both electrons and holes may be injected and accumulated in the perovskites. Subsequently the charge carriers may recombine radiatively within the active material 1408c. By applying oscillating fields of sufficiently high frequencies (>10 kHz), the drift of ions may be minimized while still allowing the accumulation of holes and electrons in the perovskite layer 1408c. The ionic motion may also be removed by applying a static electric before the operation, to create a preferential orientation of the ions inside the devices. The reduction of the ionic motion may bring an improved charge injection in the device.

In various embodiments, a light-emitting diode may be provided. The light-emitting diode may include an active structure including a halide perovskite layer. The light-emitting diode may further include a gate electrode, and an insulator layer between the gate electrode and the active structure. The light-emitting diode may further include an injecting electrode electrically coupled to the active structure. The light-emitting diode may be operable by application of an alternating current (AC) potential difference between the gate electrode and the injecting electrode.

FIG. 15 is a schematic 1500 illustrating a method of forming a light-emitting device according to various embodiments. The method may include, in 1502, forming an active structure comprising an emissive halide perovskite layer. The halide perovskite layer may include a halide perovskite material. The method may also include, in 1504, forming a first injection electrode electrically coupled to the active structure. The method may further include, in 1506, forming a second injection electrode electrically coupled to the active structure. The method may additionally include, in 1508, forming a control electrode. The method may also include, in 1510, forming an insulator layer between the control electrode and the active structure. The first injection electrode may be configured to inject electrons into the active structure and the second injection electrode may be configured to inject holes into the active structure upon application of a potential difference between the first injection electrode and the second injection electrode. The control electrode may be configured to generate an electric field upon application of a voltage, thereby causing simultaneous accumulation of the electrons and the holes in a region of the halide perovskite layer so that the recombination of the electrons and holes at the region emits light.

In other words, a method of forming the transistor for emission of light may include forming an active structure which includes a halide perovskite layer, forming the insulator layer, forming the control electrode and two injection electrodes.

For avoidance of doubt, FIG. 15 is not intended to imply any sequence or any order. For instance, it may be envisioned that in various embodiments, the insulator layer is formed before forming the control electrode, and in various other embodiments, the insulator layer may be formed after forming the control electrode. It may also be envisioned that a step may occur simultaneously or may overlap with another step.

In various embodiments, the active structure may be formed by a deposition method selected from a group consisting of screen printing, ink-jet printing, spin coating, drop casting, evaporation, sublimation, and doctor blade.

The device or portion of the device may be formed by a solution processing method such as spin coating, drop casting, screen printing. The device or portion of the device may be formed by inkjet printing, roll-to-roll printing, chemical vapour deposition, vacuum-based sublimation or other physical methods.

Figure 16:
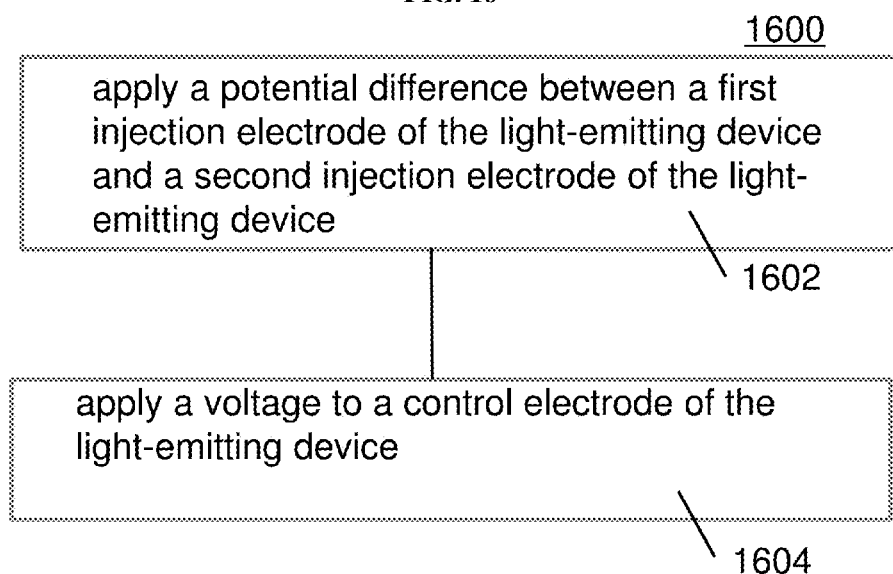
FIG. 16 is a schematic illustrating a method of operating a light-emitting device according to various embodiments.

FIG. 16 is a schematic 1600 illustrating a method of operating a light-emitting device according to various embodiments. The method may include, in 1602, applying a potential difference between a first injection electrode of the light-emitting device and a second injection electrode of the light-emitting device so that the first injection electrode injects electrons and the second injection electrode injects holes into an active structure of the light-emitting device electrically coupled to the first injection electrode and the second injection electrode. The method may further include, in 1604, applying a voltage to a control electrode of the light-emitting device, the light-emitting device comprising an insulator layer between the control electrode and the active structure, to generate an electric field, thereby causing simultaneous accumulation of the electrons and the holes in a region of an emissive halide perovskite layer comprised in the active structure, wherein the halide perovskite layer comprises a halide perovskite material, so that the recombination of the electrons and the holes at the region emits light.

In other words, the method may include applying a voltage at the control electrode as well as a potential difference across the first injection electrode and the second injection electrode, so that the electrons and holes may move to the halide perovskite layer and recombine, thereby emitting light.

For avoidance of doubt, FIG. 16 is not intended to imply any sequence or any order. The voltage may be applied to the control electrode before, after, or simultaneously with the application of the potential difference across the first injection electrode and the second injection electrode.

The potential difference applied between the first injection electrode and the second injection electrode may be a direct current (DC) voltage or an alternating current (AC) voltage. The voltage applied to the control electrode may be a direct current (DC) voltage or an alternating current (AC) voltage.

Various embodiments may include using pulsed gating or voltage pulse sequences to reduce ionic screening. Various embodiments may use electrical poling.

Various embodiments may have advantages over conventional light-emitting diodes (LED). For instance, various embodiments may have a higher carrier density achievable by applying gate voltage due the two dimensional confinement of charge carriers. Various embodiments may allow for spatial control of recombination/emission area through the application of proper drain-source and gate voltages.

Various embodiments may allow for high current density in order to reach efficient light emission. Various embodiments may be good candidates for flexible lighting application due to efficient light emission, as well as flexible and durable mechanical properties. Various embodiments may be used as ambipolar transistor for flexible electronics or integrated thin film transistor light-emitting diodes (TFT+LED) for flexible displays. Various embodiments may allow for gating control of the Pe-LEFET emission, which may in turn address channel pixilation by varying the recombination zone position. Various embodiments may allow for electric field modulation of multi-colour blends. Various embodiments may have applications on colour tunable pixels (for lighting and displays.

Various embodiments may serve as an efficient light source for electrical-injection laser. Surface light management structures such as gratings may be easily incorporated on top of the device to provide optical feedback and increase light extraction Experimental Results and Discussion Fabrication and characterization of $CH_3NH_3PbI_3$ FETs, and their operation as light-emitting FETs yielding gate-assisted electroluminescence (EL) are described. Low temperature measurements were used to effectively remove screening effects arising from ionic transport, allowing the determination of intrinsic transport parameters such as carrier density and mobility. Field-effect mobility of $CH_3NH_3PbI_3$ is found to increase by almost two orders of magnitude from room temperature down to 78 K, a behaviour consistent with phonon scattering-limited transport of conventional inorganic semiconductors.

We also confirm the ambipolar nature of charge transport in $CH_3NH_3PbI_3$, which yields close to ideal ambipolar transistor characteristics and electroluminescence (EL) from the transistor channel under balanced injection conditions. This demonstration of $CH_3NH_3PbI_3$ light-emitting FETs provides an essential guideline for materials optimization through chemical synthesis and future improvements of solar cell performance. And the novel device concept opens up new opportunities for the development of electro-optic devices based on $CH_3NH_3PbI_3$, such as gated light-emitting devices.

Perovskite Deposition

The organic precursor methylammonium iodide $CH_3NH_3I$ was synthetized by mixing 10 ml of methylamine solution ($CH_3NH_2$, 40% in methanol, Tokyo Chemical Industry, Co., Ltd) and 14 ml of hydroiodic acid (57% wt in water, Sigma-Aldrich). The reaction was accomplished in ice bath for 2 h under magnetic stirring, and the solvent removed with a rotary evaporator (1 h at 60 mbar and 60° C.). The product was purified by dissolution in ethanol and recrystallization with diethylether, repeating the washing cycle six times. After filtration, the resulting white powder was dried in vacuum oven at 60° C. for 24 h. Thin film of $CH_3NH_3PbI_3$ deposited on clean electrodes pre-patterned $SiO_2$ substrates. A 20% wt $CH_3NH_3PbI_3$ solution was prepared by mixing stoichiometric amounts of $CH_3NH_3I$ and $PbI_2$ (99%, Sigma-Aldrich) in a solvent mixture of γ-butyrolactone and dimethylsulfoxide (7:3 volume ratio) and stirred overnight at 100° C. To obtain continuous and uniform films, the solvent engineering technique was used. The solution was spin-coated on the substrate using a two-step ramp: 1,000 r.p.m. for 10 s, 5,000 r.p.m. for 20 s. Toluene was drop-casted on the substrate during the second step. The resulting film was finally annealed at 100° C. for 30 min.

Perovskite Characterization

Morphological analysis was performed with a FEI Helios 650 Nanolab SEM with 10 KV acceleration voltage and a scanning probe microscope Digital Instrument Dimension V (atomic force microscopy (AFM) analysis). The software WSxM was used for editing and plotting of the AFM images. The X-ray diffraction structural spectra were obtained using a diffractometer BRUKER D8 ADVANCE with Bragg-Brentano geometry employing Cu Kα radiation (1=1.54,056 Å), a step increment of 0.02°, 1 s of acquisition time and sample rotation of 5 $min^{-1}$.

FET Fabrication

Heavily p-doped Si substrates with thermally grown $SiO_2$ (500 nm) layer were cleaned by two rounds of sonication in acetone and iso-propyl alcohol (20 min each round, and then dried under nitrogen flow). Interdigitated electrodes (L=80 and 100 μm, W=20 mm) were patterned using conventional photolithography. Electrodes of Ni (10 nm) and Au (50 nm) were thermally evaporated. The substrates were then undergoing lift-off process to obtain the desired electrodes. Before the spin coating of the active materials, an oxygen plasma cleaning treatment was performed on the substrate, for 1 min, to improve the wetting of the surface and obtain flatter and homogeneous perovskite thin film.

Temperature-Dependent FET Measurements

FET devices were mounted into a liquid nitrogen-cooled Linkam Stage (FTIR 600) that allow to scan FET operating temperature of the device from 300 K down to 77K. The FET electrical characteristics were acquired with Agilent B2902A Precision Source/Measure Unit in dark environment. The data were then analysed with OriginPro software.

Electroluminescence (EL) Measurement

The EL spectra were acquired using the Nikon eclipse LV100 microscope with LU plan fluor ×10 objectives, whereas the FET were enclosed in the Linkam Stage and FET electrical behaviour was controlled using Agilent B2902A Precision Source/Measure Unit. EL emission signal was focused into optic fibre that coupled to USB2000 Ocean Optics to record EL spectra. All EL spectra were measured with 1 s integration time over three averages. The optical images and videos were taken and acquired by Thorlabs DCC1545M High-Resolution USB2.0 CMOS Camera with weak illumination to enhance the optical contrast.

Thin Film Characterization

Figure 17A:
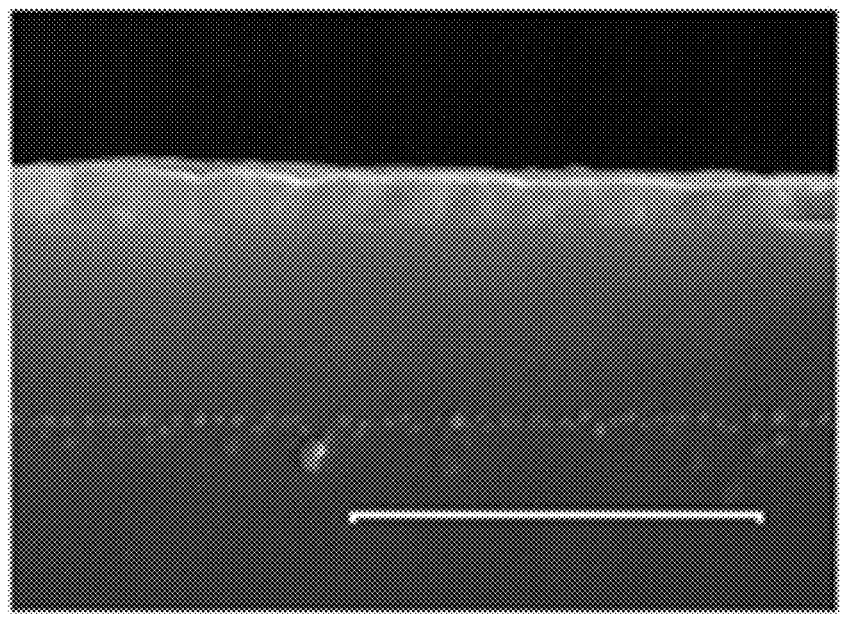
FIG. 17A is a scanning electron microscope micrograph image showing the cross-sectional view of a $CH_3NH_3PbI_3$ thin film according to various embodiments.
Figure 17B:
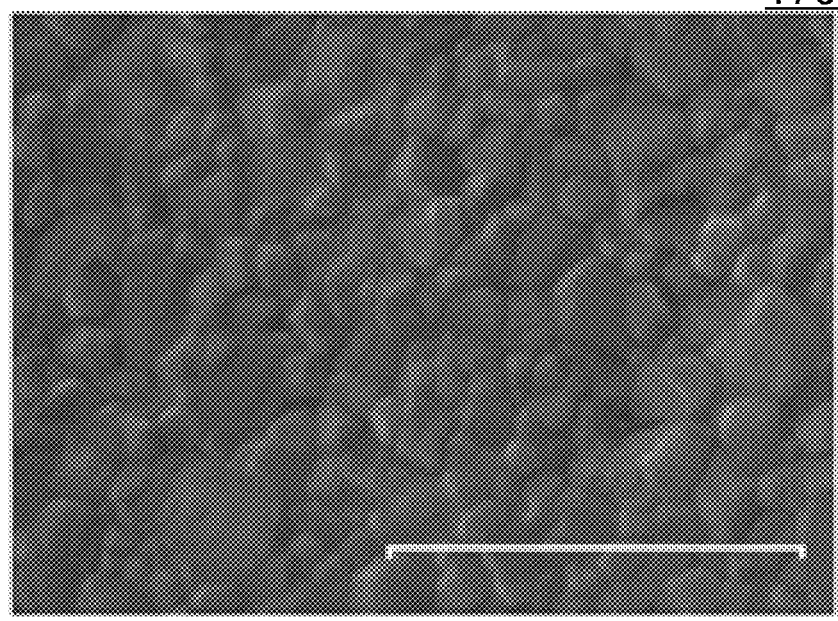
FIG. 17B is a scanning electron microscope micrograph image showing the top view of a $CH_3NH_3PbI_3$ thin film according to various embodiments.
Figure 17C:
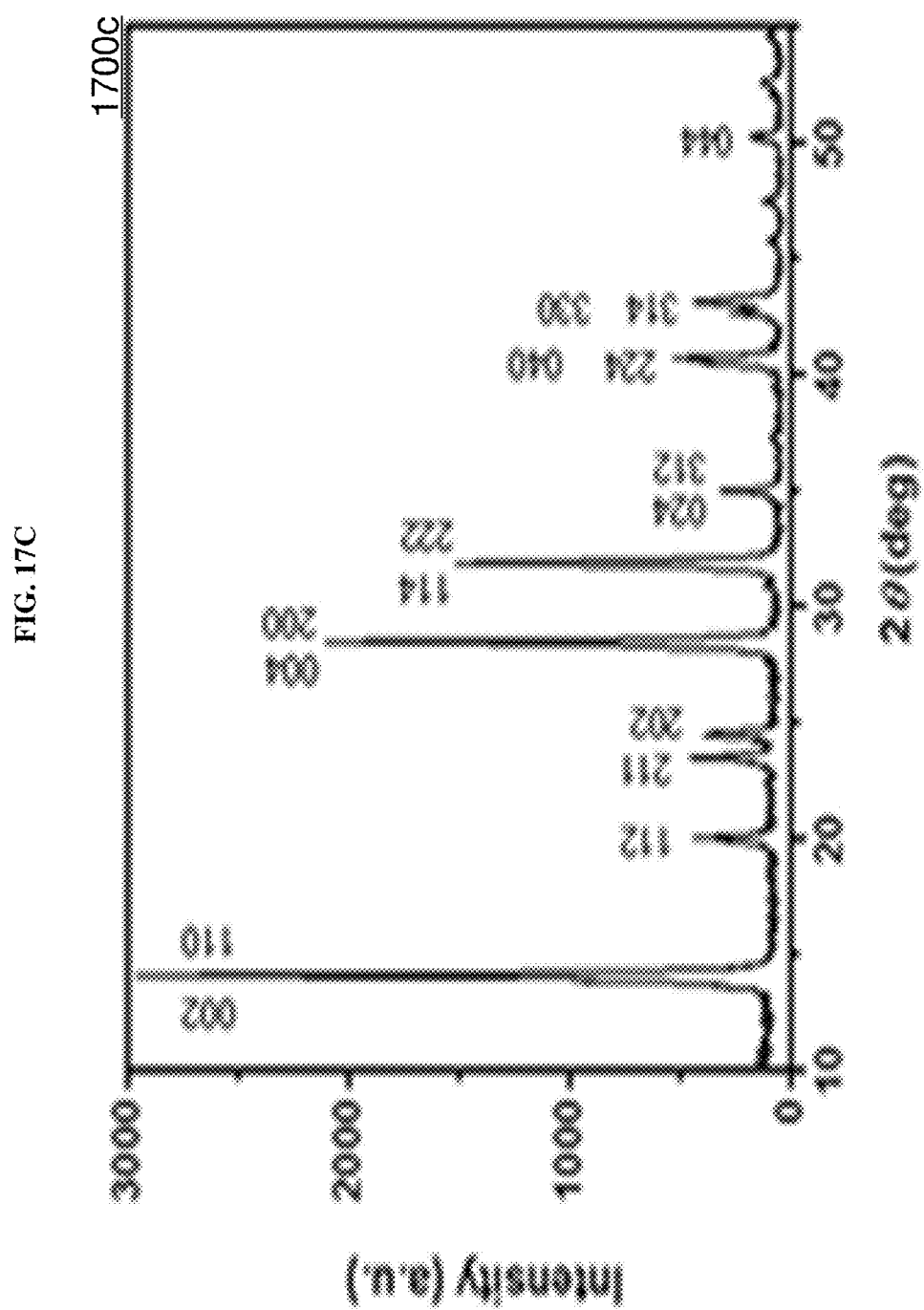
FIG. 17C is a plot of intensity (arbitrary units or a.u.) as a function of $2\theta$ (degrees or °) showing the X-ray diffraction pattern of $CH_3NH_3PbI_3$ film on silicon oxide/silicon ($SiO_2$/Si (p++)) substrate according to various embodiments.
Figure 17D:
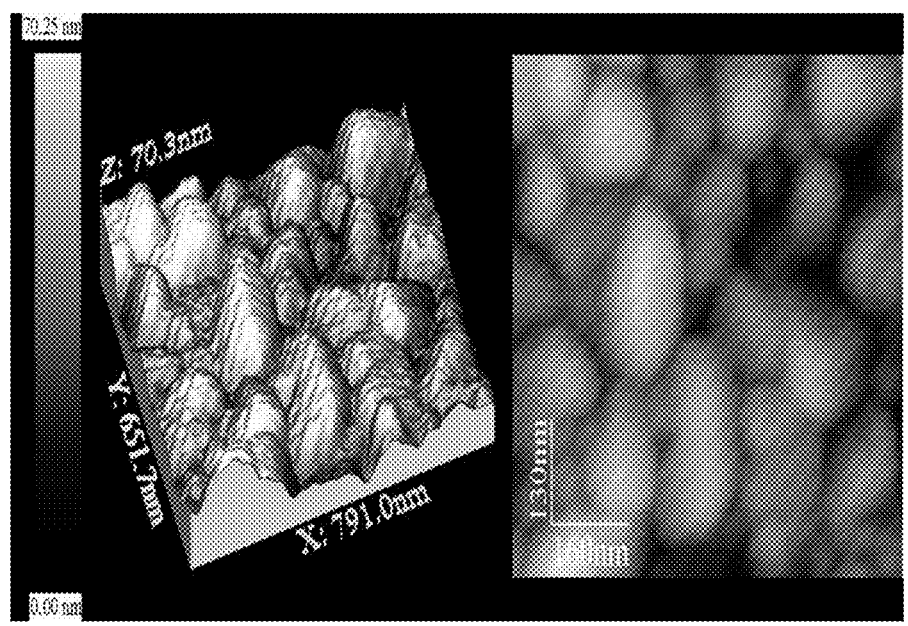
FIG. 17D is an image showing atomic force microscopy (AFM) characterization of the $CH_3NH_3PbI_3$ film. The surface images of the films obtained by spin coating on Si(p++)/$SiO_2$ substrates.

FIG. 17A is a scanning electron microscope micrograph image 1700a showing the cross-sectional view of a $CH_3NH_3PbI_3$ thin film according to various embodiments. FIG. 17B is a scanning electron microscope micrograph image 1700b showing the top view of a $CH_3NH_3PbI_3$ thin film according to various embodiments. The scale bars in FIGS. 17A, B represent 1 µm. FIG. 17C is a plot 1700c of intensity (arbitrary units or a.u.) as a function of 2θ (degrees or °) showing the X-ray diffraction pattern of $CH_3NH_3PbI_3$ film on silicon oxide/silicon ($SiO_2$/Si (p++)) substrate according to various embodiments. FIG. 17C confirms the tetragonal structure of the perovskite and space group I4/mcm. FIG. 17D is an image 1700d showing atomic force microscopy (AFM) characterization of the $CH_3NH_3PbI_3$ film. The surface images of the films obtained by spin coating on Si(p++)/$SiO_2$ substrates.

Deposition methods of solution processed organo-lead hybrid perovskite have direct consequences on the morphology of thin film, hence on charge transport properties of the material. Here we used the solvent engineering technique recently reported for optimized solar cell fabrication to deposit a compact and uniform $CH_3NH_3PbI_3$ perovskite layer (~150 nm thick) on top of heavily p-doped Si with thermally grown $SiO_2$ (FIG. 17A). The resulting thin films are of very high quality: they consist of closely packed, large domains with grain size up to 200 nm, as seen in the top view scanning electron microscope (SEM) image in FIG. 17B. They crystallize in a perfect tetragonal structure, as revealed by the X-ray diffraction analysis in FIG. 17C. A film roughness of $R_{RMS}$ (measured root mean squared roughness)=10.8 nm was evaluated by atomic force microscopy (FIG. 17D). Availability of such high-quality films is essential to minimize the influence of metal contacts and charge carrier scattering across the film, so as to obtain intrinsic transport parameters from FET measurements. The device structure used in this study is shown in FIG. 1B. A bottom gate, bottom contact configuration was employed to allow deposition of active materials to be the last step in the fabrication. This is to minimize exposure of $CH_3NH_3PbI_3$ to moisture in the environment, and to avoid potential overheating during the metal electrode deposition.

Low-Temperature FET Characterization

As reported in the literature, transport characteristics of flat-junction $CH_3NH_3PbI_3$ solar cells are often subject to strong hysteresis, which so far hindered a complete understanding of the electrical response, and the determination of intrinsic transport parameters of the perovskite. The origin of this anomalous behaviour has been attributed to capacitive effects associated with ferroelectricity arising from the spontaneous polarization of methylammonium cation and lattice distortion effects, diffusion of excess ions as interstitial defects, and trapping/de-trapping of charge carriers at the interface. Photocurrent hysteresis in $CH_3NH_3PbI_3$ planar heterojunction solar cells was found to originate from trap states on the surface and grain boundaries of the perovskite materials, which can be effectively eliminated by fullerene passivation.

Recently, hysteresis-free photovoltaic devices with well-reproducible PCEs were achieved in single crystals and millimeter-scale grain size thin films. Piezoelectric microscopy revealed the reversible switching of the ferroelectric domains by poling with DC biases, but a recent observation of field-switchable photovoltaic effect suggested that ion drift under the electric field in the perovskite layer induces the formation of p-i-n structures, as observed by electron beam induced current measurement and Kelvin probe force microscopy. A weakened switchable photovoltaic effect at low temperature and the lack of photo voltage dependence with respect to the lateral electrode spacing suggest that ferroelectric photovoltaic effect may not play dominant role in the observed field-switchable photovoltaic behaviour. Theoretical calculations further reveal that charged Pb, I and methylammonium vacancies have low formation energies, suggesting that the high ionicity of this materials may lead to p and n-type self-doping.

Figure 18A:
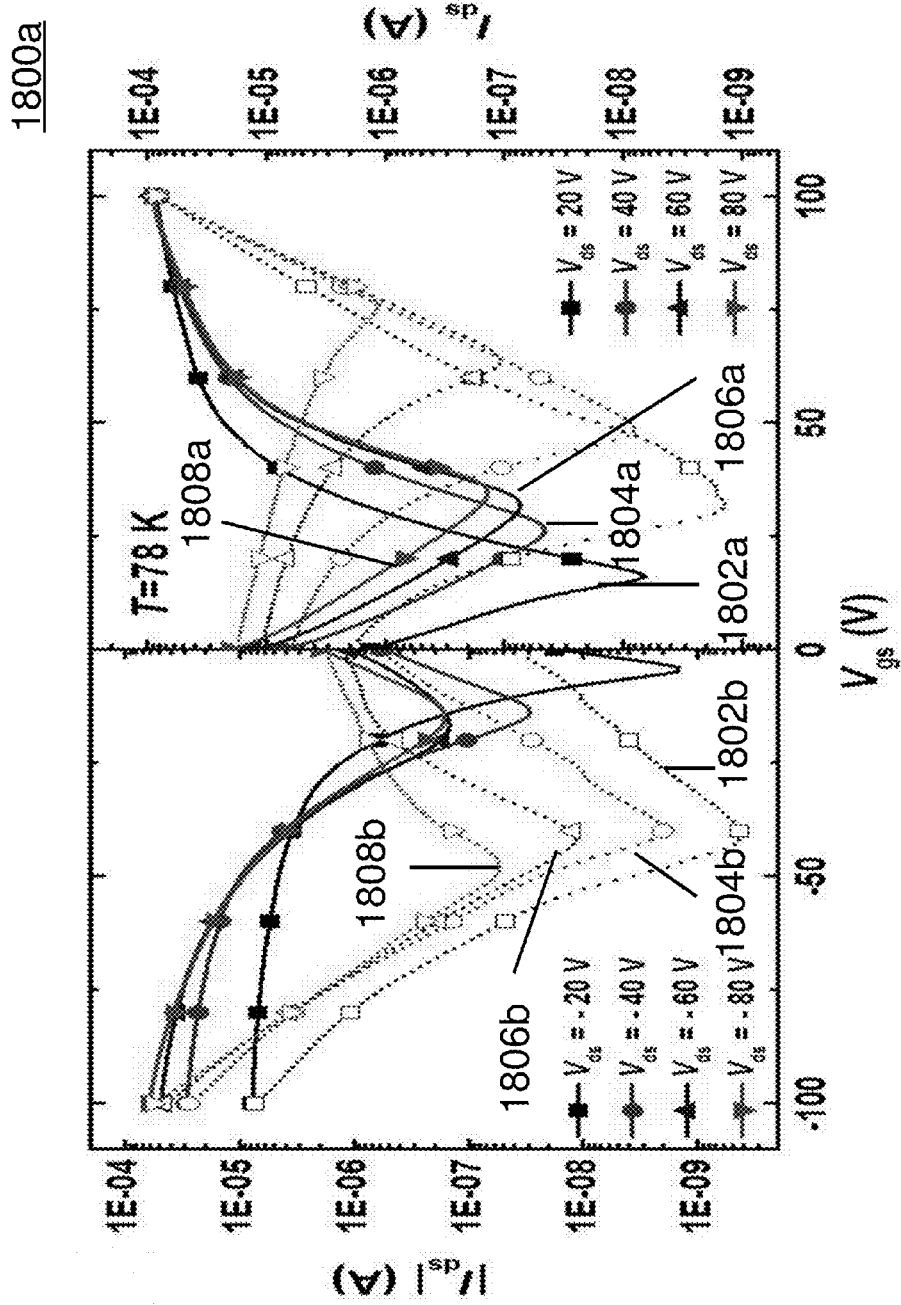
FIG. 18A is a plot of drain-source current $I_{ds}$ (amperes or A) as a function of potential difference across the gate and source (volts or V) at different indicated drain-souce voltages ($V_{ds}$) illustrating the transfer characteristics of the field-effect transistor at 78K according to various embodiments.

FIG. 18A is a plot 1800a of drain-source current $I_{ds}$ (amperes or A) as a function of potential difference across the gate and source (volts or V) at different indicated drain-source voltages ($V_{ds}$) illustrating the transfer characteristics of the field-effect transistor at 78 K according to various embodiments. The n-type characteristics (right panel) were measured at $V_{ds}$=20 to 80V ($V_{ds}$=20 V (1802a) square, $V_{ds}$=40 V (1804a) circle, $V_{ds}$=60 V (1806a) up triangle, $V_{ds}$=80 V (1808a) down triangle), whereas the p-type transfer characteristics (left panel) are measured at $V_{ds}$=−20 V to −80 V ($V_{ds}$=−20 V (1802b) square, $V_{ds}$=−40 V (1804b) circle, $V_{ds}$=−60 V (1806b) up triangle, $V_{ds}$=−80V (1808b) down triangle). Solid curve with filled symbol and dashed curve with open symbol are measured with forward and backward sweeping, respectively.

Figure 18B:
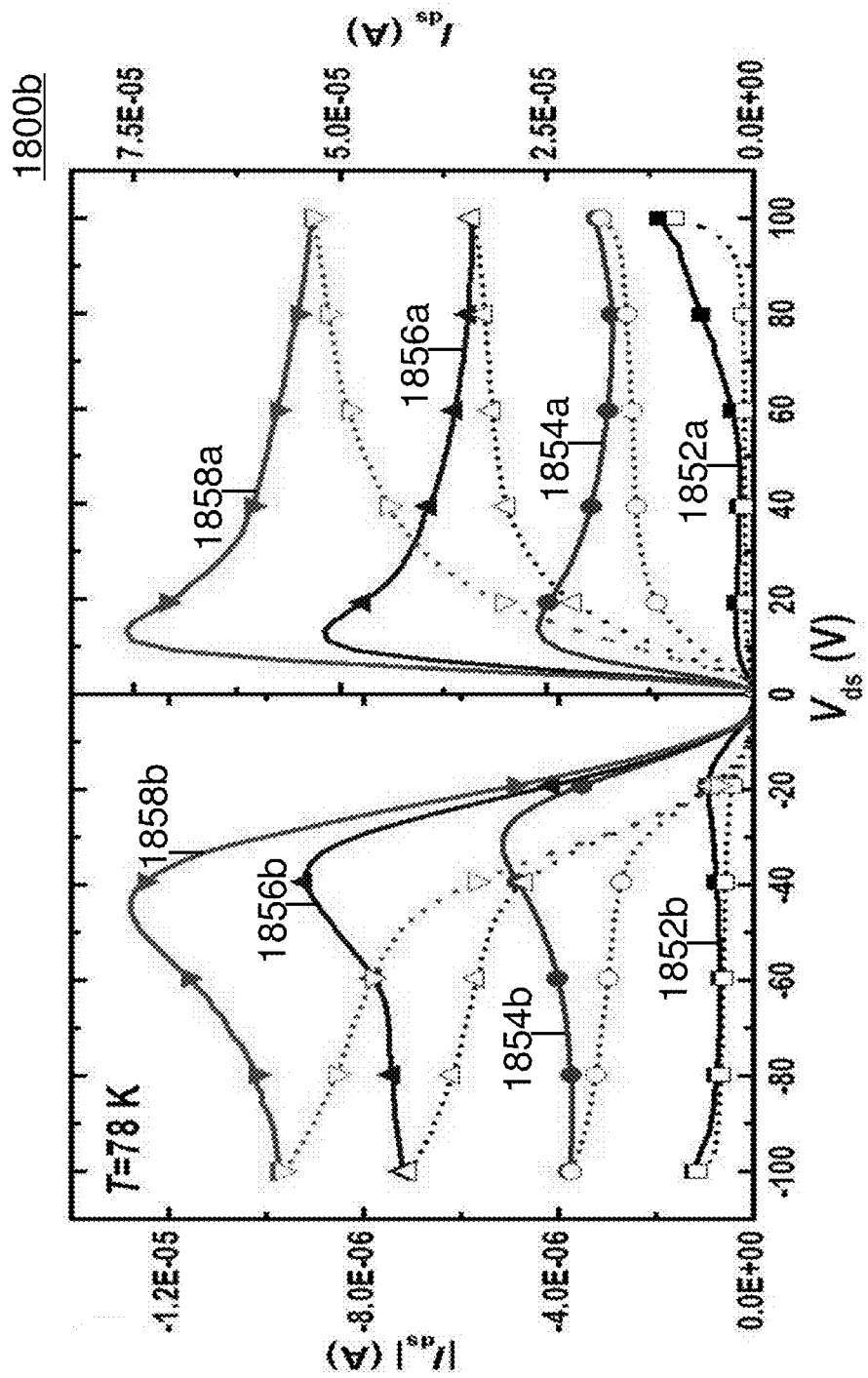
FIG. 18B is a plot of drain-source current $I_{ds}$ (amperes or A) as a function of potential difference across the drain and source (volts or V) at different indicated gate-source voltages ($V_{gs}$) illustrating the output characteristics of the field-effect transistor at 78K according to various embodiments.

FIG. 18B is a plot 1800b of drain-source current $I_{ds}$ (amperes or A) as a function of potential difference across the drain and source (volts or V) at different indicated gate-source voltages ($V_{gs}$) illustrating the output characteristics of the field-effect transistor at 78K according to various embodiments. The n-type characteristics (right panel) were measured at $V_{gs}$=40 to 100V ($V_{gs}$=40V (1852a) square, $V_{gs}$=60V (1854a) circle, $V_{gs}$=80V (1856a) up triangle, $V_{gs}$=100V (1858a) down triangle), whereas the p-type output characteristics (left panel) are measured at $V_{gs}$=−40 V to −100 V ($V_{gs}$=−40 V (1852b) square, $V_{gs}$=−60 V (1854b) circle, $V_{gs}$=−80 V (1856b) up triangle, $V_{gs}$=−100 V (1858b) down triangle). Solid curve with filled symbol and dashed with open symbol curves are measured with forward and backward sweeping, respectively.

Figure 19A:
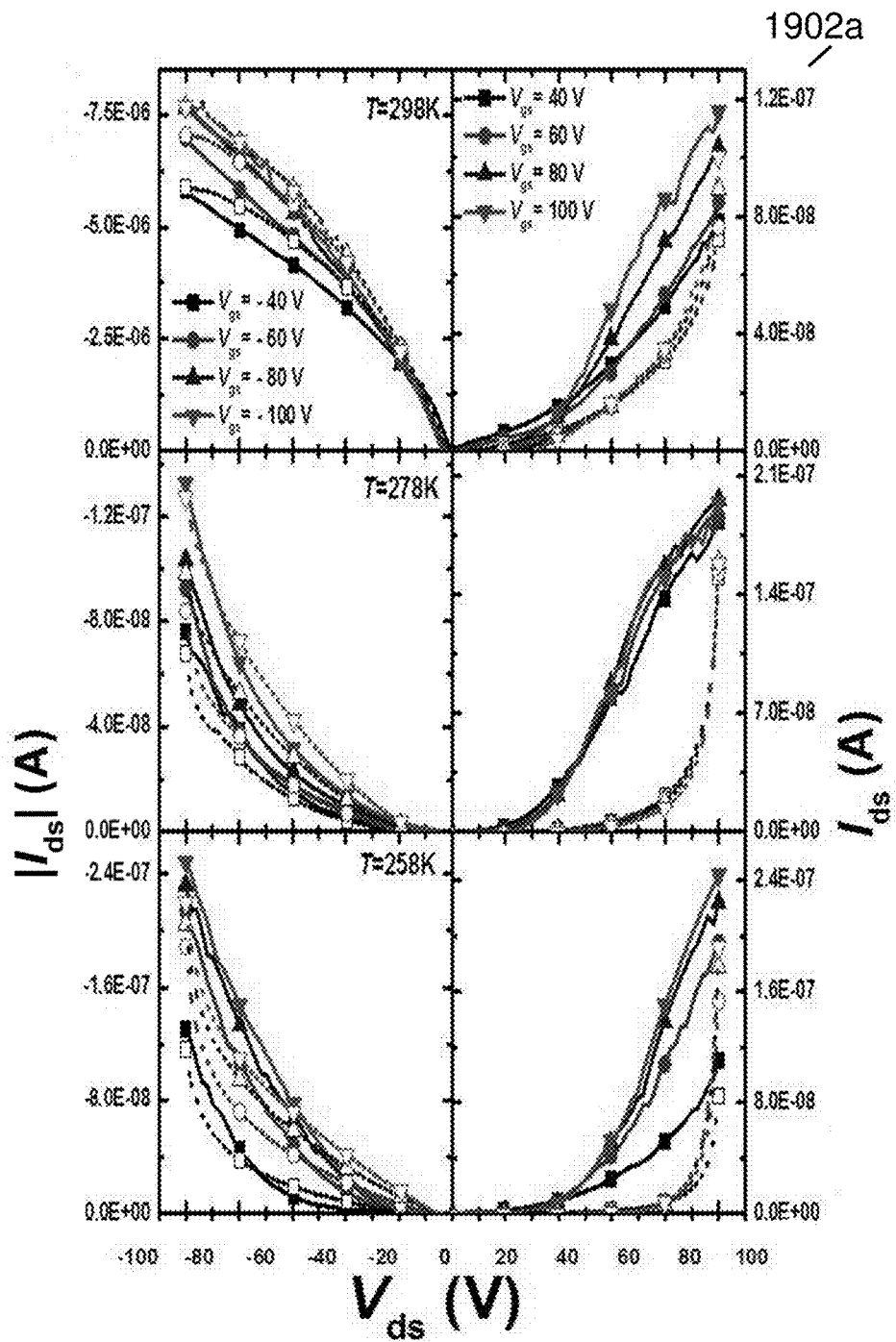
FIG. 19A shows plots illustrating the field-effect transistor (FET) ambipolar output characteristics at 298K, 278K and 258K according to various embodiments.
Figure 19B:
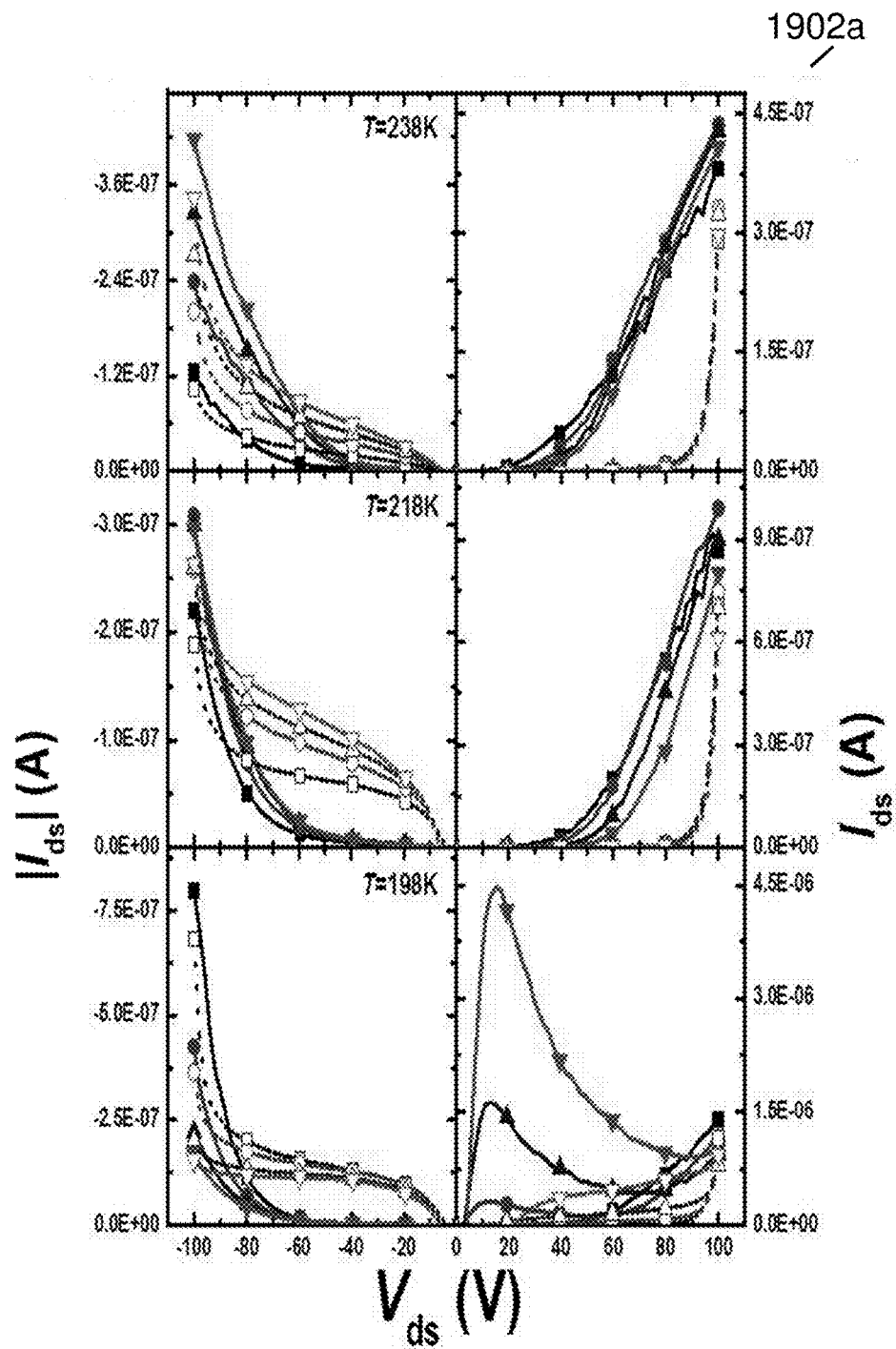
FIG. 19B shows plots illustrating the field-effect transistor (FET) ambipolar output characteristics at 238K, 218K and 198K according to various embodiments.
Figure 19C:
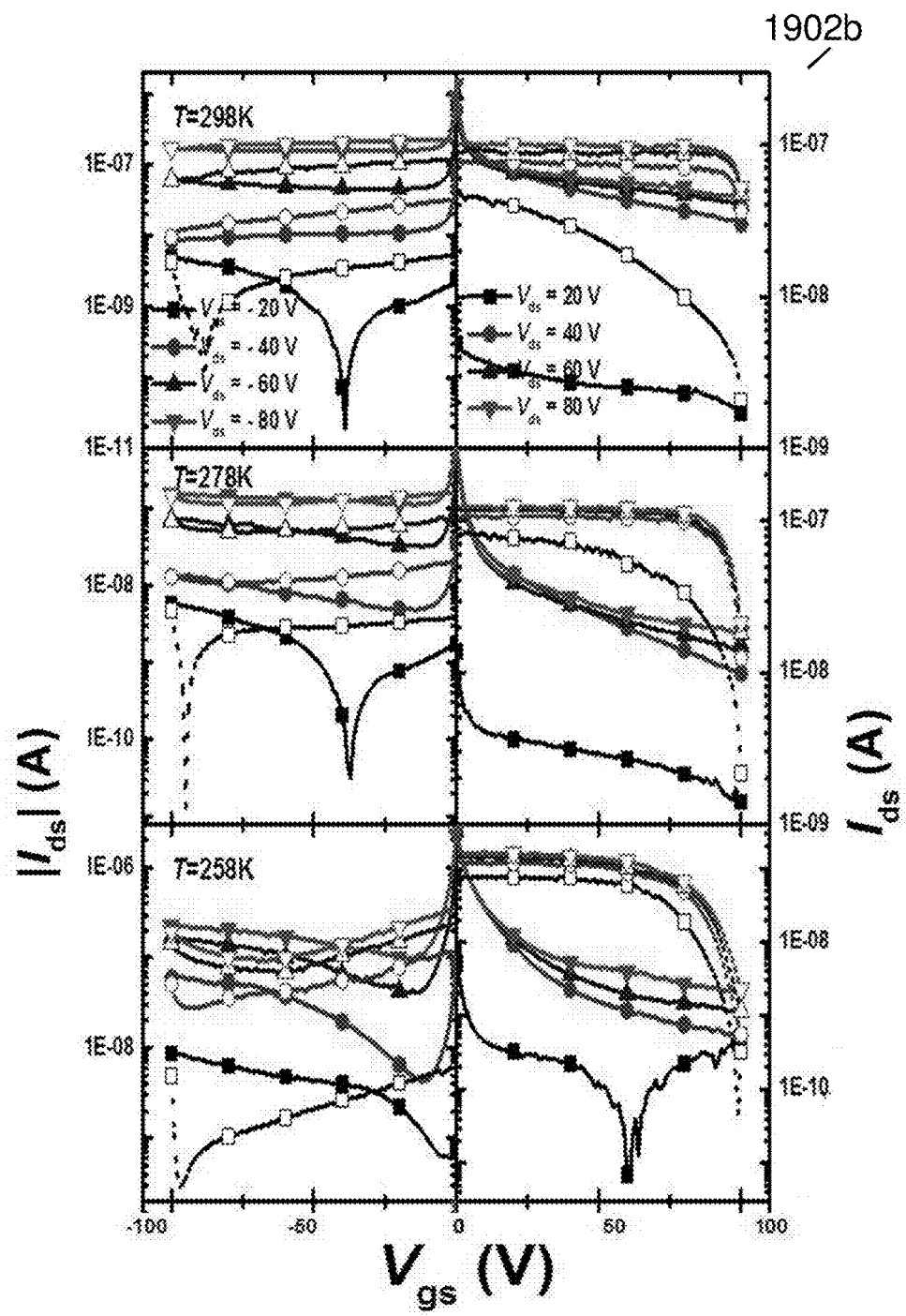
FIG. 19C shows plots illustrating the field-effect transistor (FET) transfer characteristics (ambipolar) at 298K, 278K and 258K according to various embodiments.
Figure 19D:
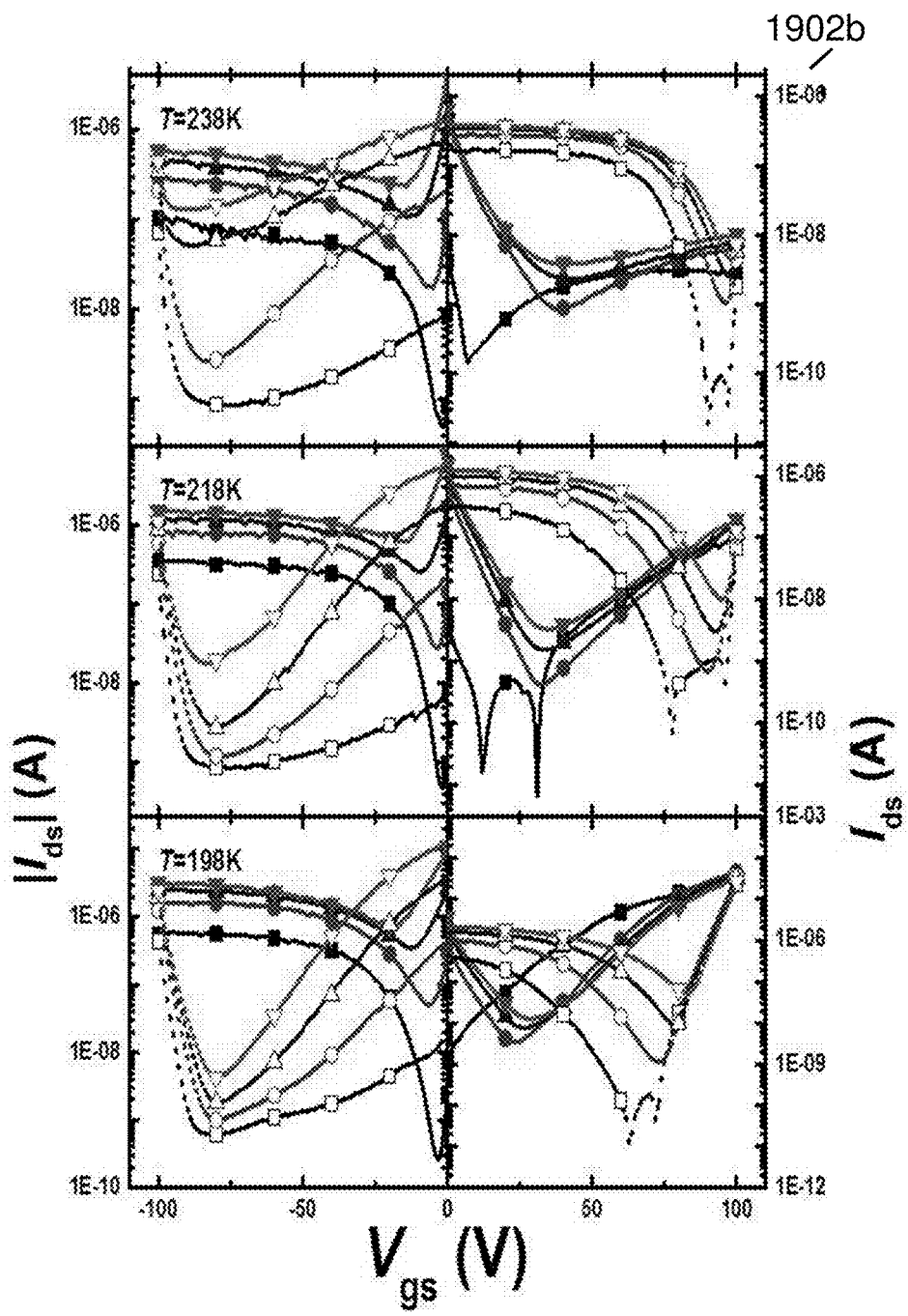
FIG. 19D shows plots illustrating the field-effect transistor (FET) transfer characteristics (ambipolar) at 238K, 218K and 198K according to various embodiments.

FIG. 19A shows plots illustrating the field-effect transistor (FET) ambipolar output characteristics at 298K, 278K, and 258K according to various embodiments. FIG. 19B shows plots illustrating the field-effect transistor (FET) ambipolar output characteristics at 238K, 218K, and 198K according to various embodiments. FIG. 19C shows plots illustrating the field-effect transistor (FET) transfer characteristics (ambipolar) at 298K, 278K, and 258K according to various embodiments. FIG. 19D shows plots illustrating the field-effect transistor (FET) transfer characteristics (ambipolar) at 238K, 218K, and 198K according to various embodiments.

Figure 19E:
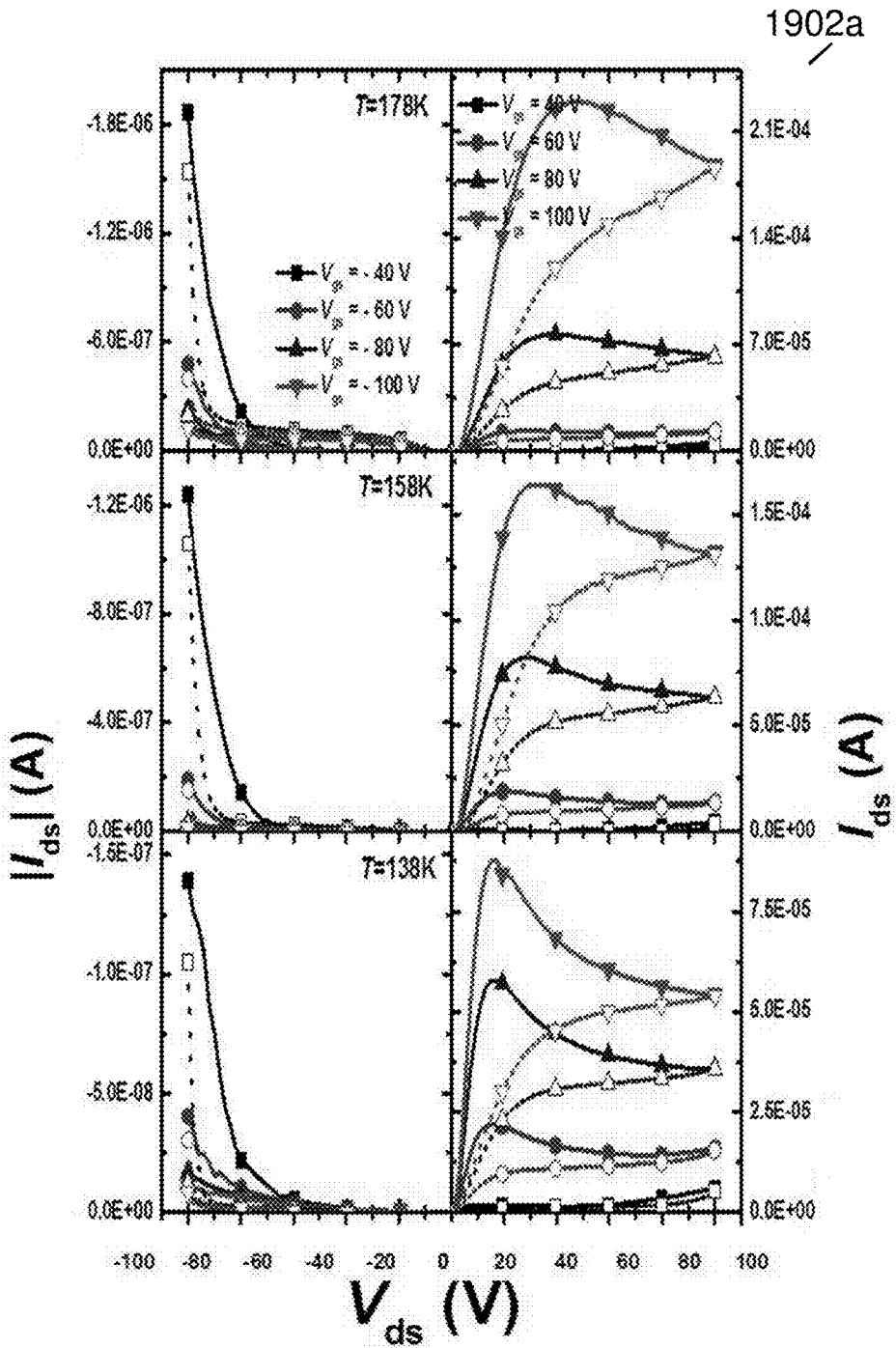
FIG. 19E shows plots illustrating the field-effect transistor (FET) ambipolar output characteristics at 178K, 158K and 138K according to various embodiments.
Figure 19F:
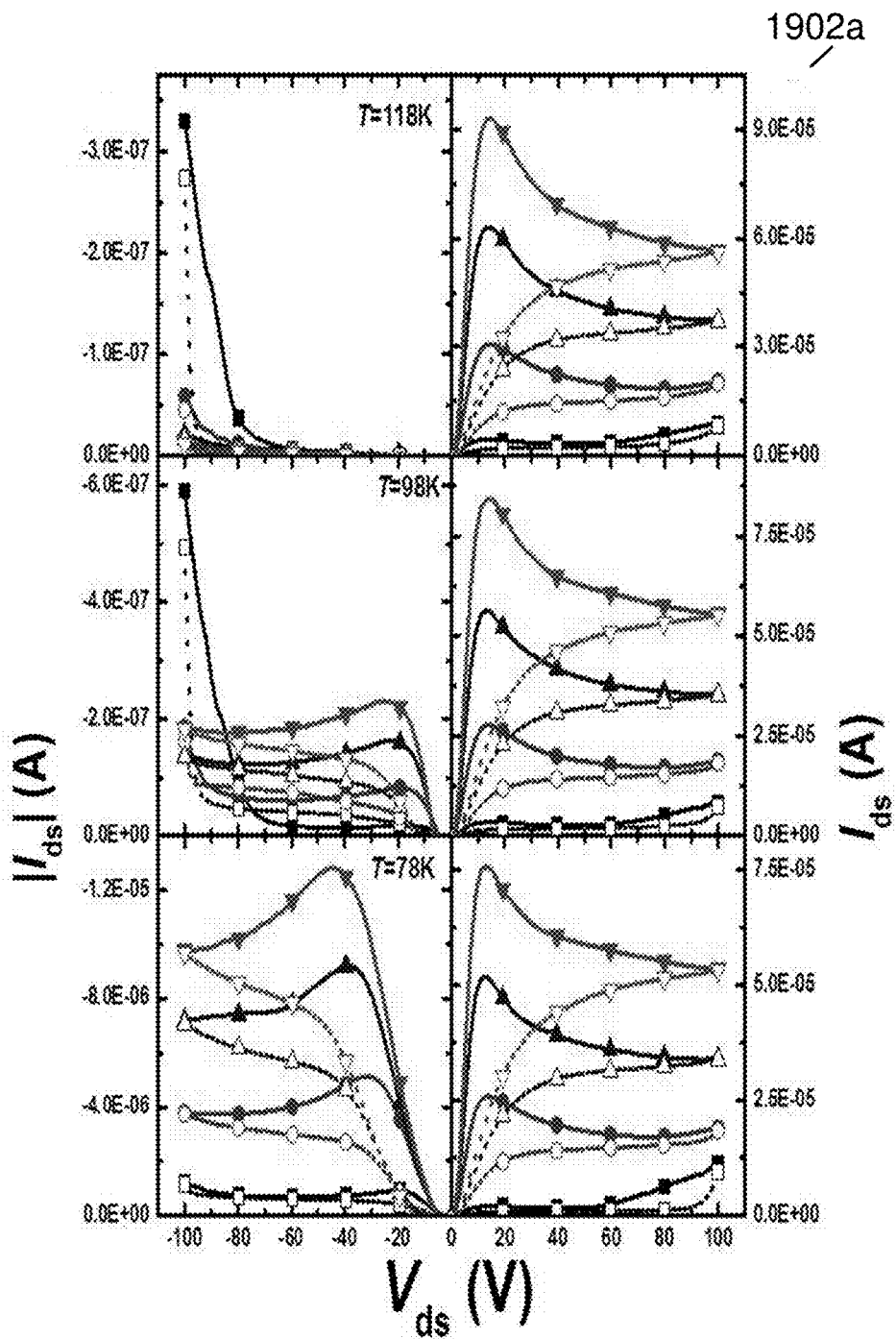
FIG. 19F shows plots illustrating the field-effect transistor (FET) ambipolar output characteristics at 118K, 98K and 78K according to various embodiments.
Figure 19G:
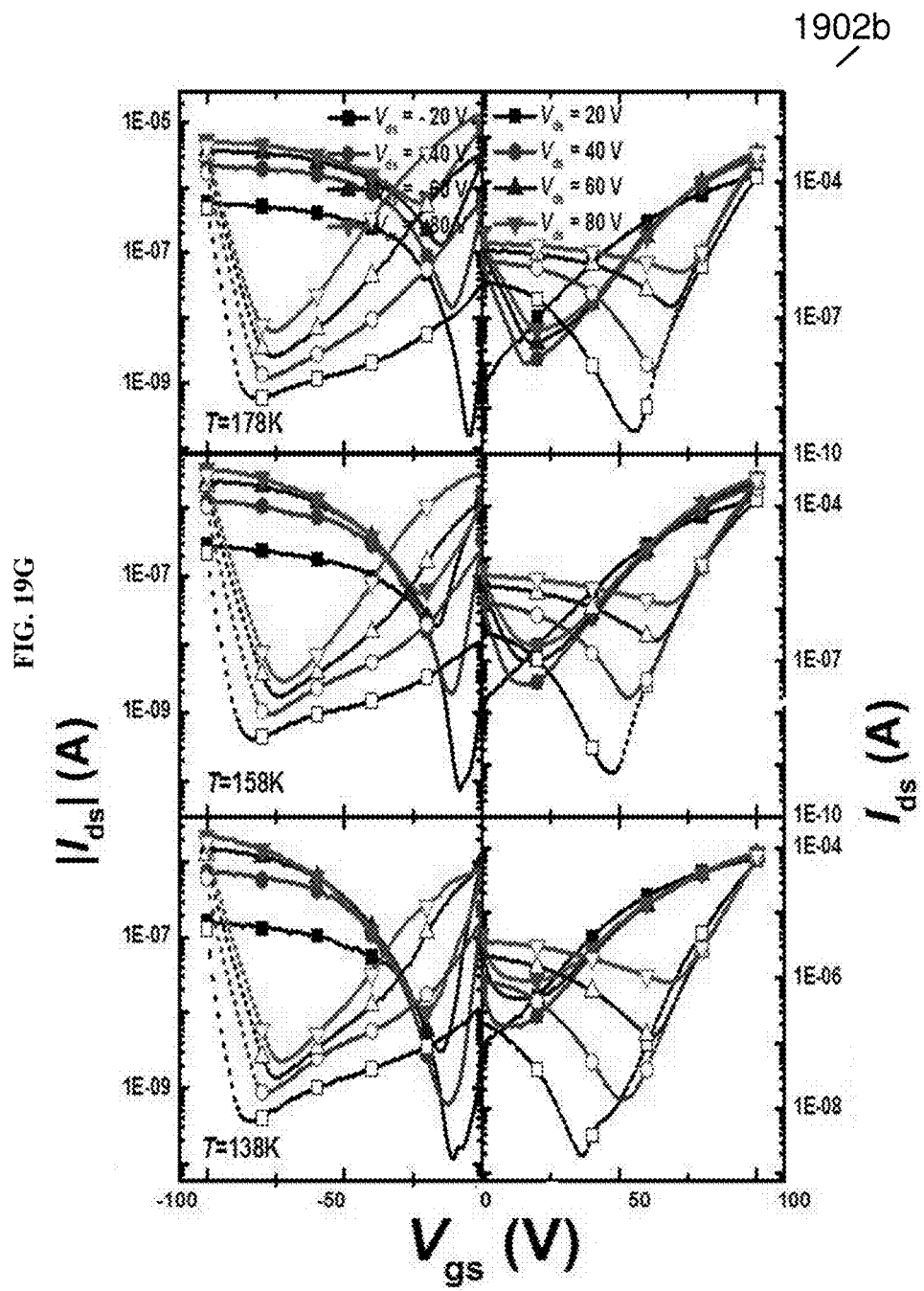
FIG. 19G shows plots illustrating the field-effect transistor (FET) transfer characteristics (ambipolar) at 178K, 158K and 138K according to various embodiments.
Figure 19H:
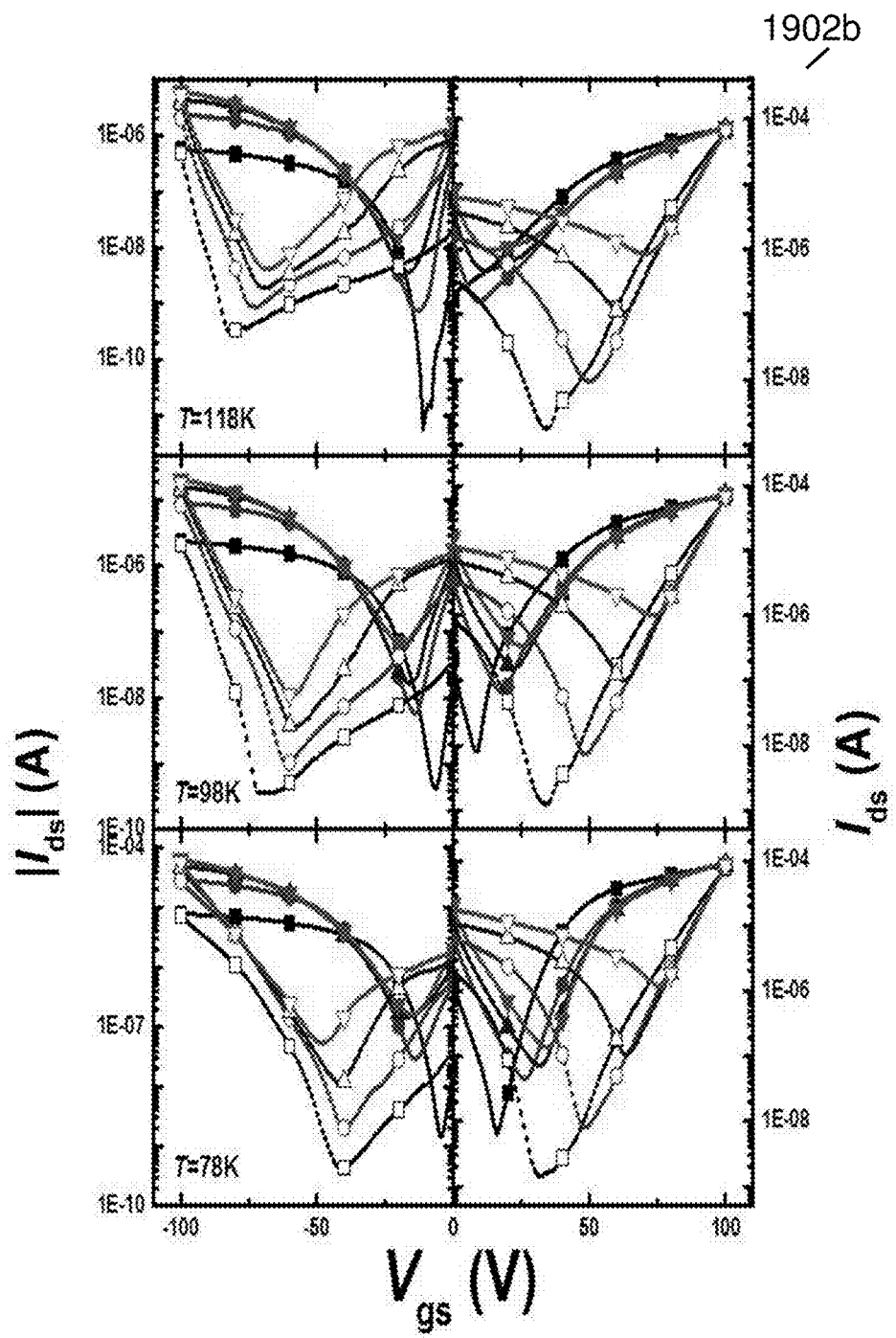
FIG. 19H shows plots illustrating the field-effect transistor (FET) transfer characteristics (ambipolar) at 118K, 98K and 78K according to various embodiments.

FIG. 19E shows plots illustrating the field-effect transistor (FET) ambipolar output characteristics at 178K, 158K, and 138K according to various embodiments. FIG. 19F shows plots illustrating the field-effect transistor (FET) ambipolar output characteristics at 118K, 98K, and 78K according to various embodiments. FIG. 19G shows plots illustrating the field-effect transistor (FET) transfer characteristics (ambipolar) at 178K, 158K, and 138K according to various embodiments. FIG. 19H shows plots illustrating the field-effect transistor (FET) transfer characteristics (ambipolar) at 118K, 98K, and 78K according to various embodiments.

1902a shows the n-type output characteristics have been measured at $V_{gs}$=40 V to 100 V ($V_{gs}$=40 V square, $V_{gs}$=60 V circle, $V_{gs}$=80 V up triangle, $V_{gs}$=100 V down triangle), while the p-type output characteristics (left column) are measured at $V_{gs}$=-40 V to -100 V ($V_{gs}$=-40 V square, $V_{gs}$=-60 V circle, $V_{gs}$=-80 V up triangle, $V_{gs}$=-100 V down triangle). 1902b shows the n-type transfer characteristics (ambipolar) are measured at $V_{ds}$=20 V to 80 V ($V_{ds}$=20 V square, $V_{ds}$=40 V circle, $V_{ds}$=60 V up triangle, $V_{ds}$=80 V down triangle), while the p-type transfer characteristics (left column) are measured at $V_{ds}$=-20 V to -80 V ($V_{ds}$=-20 V square, $V_{ds}$=-40 V circle, $V_{ds}$=-60 V up triangle, $V_{ds}$=-80 V down triangle). Solid curve with filled symbol and dashed with open symbol curves are measured with forward and backward sweeping, respectively.

It is found that reducing the operating temperature of our devices is an effective way to reduce hysteresis effects due to ionic transport/screening, allowing to record transport characteristics typical of conventional ambipolar semiconductor FETs (FIGS. 18A-B). The complete temperature evolution of ambipolar FET characteristics, from room temperature down to 78 K, is provided in FIGS. 19A-H.

While above 198 K the output characteristics show either weak or no gate voltage dependence, at and below 198 K the devices display 'textbook' n-type output characteristics. Similarly, typical p-type output characteristics are observed at 98 K and lower temperatures (FIG. 18B and FIG. 19F). Both p- and n-type transfer characteristics are independent of gate field from room temperature down to 258 K. This is reflected in the measurement by large hysteresis loops, which do not close when transitioning from the hole- to the electron-dominated transport gate voltage ranges and vice versa. Below 258 K, however, both n- and p-type transfer characteristics show a closed hysteresis loop. Hysteresis of n- and p-type transfer characteristics (FIG. 18A, FIGS. 19G-H) is substantially reduced below 198 and 98 K, respectively, consistent with the observation of ambipolar output characteristics (FIG. 18B and FIGS. 19E-F). Induced carrier density of ~$3.8 \times 10^{16}$ cm$^{-2}$, maximum $I_{on}/I_{off}$~$10^5$ and current density of ~830 A cm$^{-2}$ (estimated for a ~2 nm accumulation layer thickness) are obtained from standard transistor analysis at 198 K. These values are comparable to those previously reported for 2D hybrid organic-inorganic perovskites characterized at room temperature. Note that, although our low-temperature measurements clearly demonstrate the ambipolar nature of $CH_3NH_3PbI_3$, previous studies have shown that carrier concentration can vary by up to six orders of magnitudes depending on the ratio of the methylammonium halide and lead iodine precursors and thermal annealing conditions, thus resulting in preferential p-type or n-type transport characteristics.

Temperature-dependent electron and hole mobilities were extracted from the forward sweeping of transfer characteristics at $V_{ds}$=20V and $V_{ds}$=-20V using the standard transistor equation at linear regime.

Figure 20A:
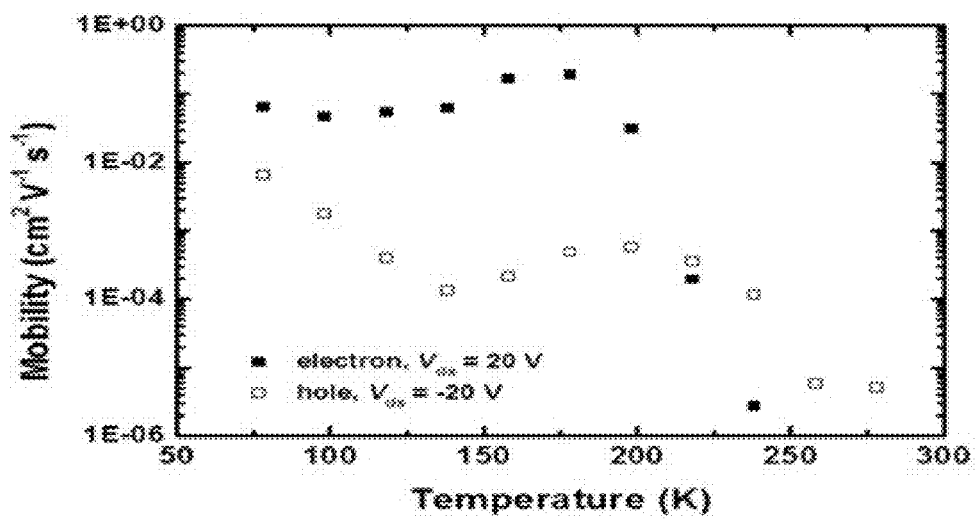
FIG. 20A is a plot of mobility (square centimetres per volt second or $cm^2V^{-1}s^{-1}$) as a function of temperature (kelvins or K) illustrating the temperature dependence of field-effect electron and hole mobilities, extracted from the forward sweeping of transfer characteristics at $V_{ds}$=20V and $V_{ds}$=−20V, respectively, according to various embodiments.

FIG. 20A is a plot 2000a of mobility (square centimetres per volt second or cm$^2$ V$^{-1}$ s$^{-1}$) as a function of temperature (kelvins or K) illustrating the temperature dependence of field-effect electron and hole mobilities, extracted from the forward sweeping of transfer characteristics at $V_{ds}$=20V and $V_{ds}$=-20V, respectively, according to various embodiments.

Note that mobilities were not extracted from backward sweeping curves to avoid misleading results due to the large hysteresis. Also, mobilities at higher $V_{ds}$ (that is, in the saturation regime) were not extracted due to the difficulty to identify linear and saturation regimes at all investigated temperatures.

Figure 20B:
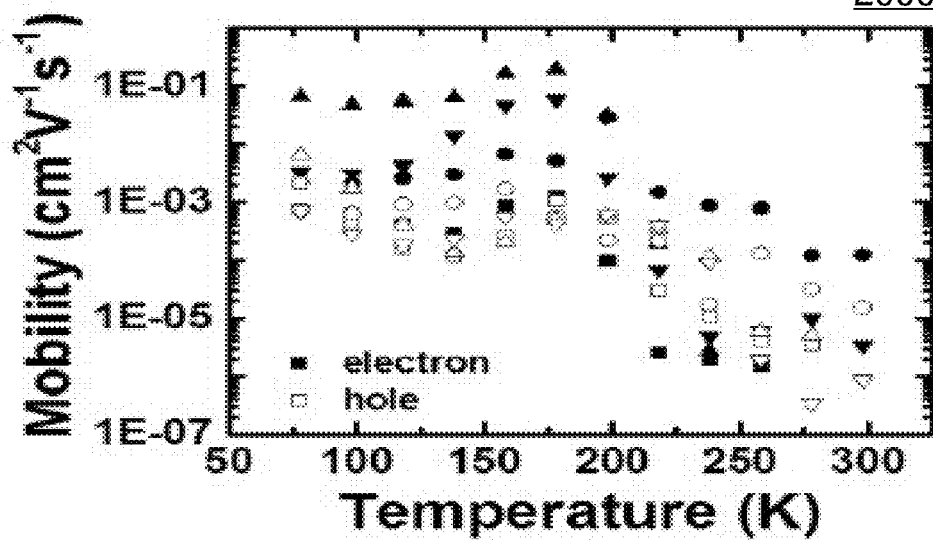
FIG. 20B is a plot of mobility (square centimetres per volt second or $cm^2V^{-1}s^{-1}$) as a function of temperature (kelvins or K) showing statistical analysis of the distribution of mobility values extracted from independent measurements across four different devices (square, circle, up triangle, down triangle) according to various embodiments.

FIG. 20B is a plot 2000b of mobility (square centimetres per volt second or cm$^2$V$^{-1}$ s$^{-1}$) as a function of temperature (kelvins or K) showing statistical analysis of the distribution of mobility values extracted from independent measurements across four different devices (square, circle, up triangle, down triangle) according to various embodiments. The filled symbols pertain to electron mobilities while the empty symbols are hole mobilities. FIG. 20C is a plot 2000c of mobility (square centimetres per volt second or cm$^2$V$^{-1}$ s$^{-1}$) as a function of temperature (kelvins or K) showing the average mobilities and error bars obtained by averaging across the 4 devices according to various embodiments.

Although some variability in the absolute values of electron and hole mobilities is observed from device to device, their relative magnitude and temperature dependence show consistent trends. From FIG. 20A, both electron and hole mobilities increase by a factor of ~100 from room temperature to 198 K. Below 198 K, there is no further improvement of electron mobility, whereas hole mobility shows an additional tenfold increase. We attribute the improvement of mobility at low temperature to the removal of screening effects arising from the ionic transport of methylammonium cations. The phonon energy of methylammonium cation was estimated to be ~14.7 meV from previous combination of density function theory (DFT) and Raman studies. The observation of weak improvement of field-effect mobilities below 198 K ($E_{thermal}$=16.7 meV) is therefore consistent with the quenching of phonon interactions related to the organic cations. This is also in agreement with the weakening of field-switchable photovoltaic effects at low temperature, which may suggest that field-effect transport is phonon limited at room temperature. Despite the remarkable improvement of field-effect mobilities, hysteresis was not completely removed at the lowest temperature investigated. This could be due to the untreated semiconductor-dielectric interface, which is known to affect semiconductor film morphology, number of trap states and surface dipoles, similar to the case of organic FET devices. The reduction of trap density in single crystal and large grain size thin films enormously enhances stability of photovoltaic devices. Thus, improvement of bulk crystallinity is also expected to reduce hysteresis of FETs, with proper control of the morphology of the semiconductor-dielectric interface, where the nanometre thin field-effect transport channel is created. Both hole and electron mobilities extracted in the linear regime at 78K are slightly smaller than the corresponding saturation regime mobilities ($\mu_{e,linear}/\mu_{e,saturation}$=6.7×10$^{-2}$/7 0.2×10$^{-2}$ cm$^2$V$^{-1}$ s$^{-1}$ and $\mu_{h,linear}/\mu_{h,saturation}$=6.6×10$^{-3}$/2.1×10$^{-2}$ CM$^2$V$^{-1}$ s$^{-1}$, extracted at V$_{ds}$=±20V for linear regime and V$_{ds}$=±80V for saturation regime from FIG. 18A). A previous study of spin-coated hybrid perovskite channels indicated linear regime mobility values 1 to 2 orders of magnitude lower than in the saturation regime. The suppression of the linear regime mobility is presumably associated to grain-boundary effects, which give rise to a large concentration of traps. Thus, the reported linear regime mobilities set a lower limit for electron and hole mobilities of CH$_3$NH$_3$PbI$_3$.

DFT Modelling and Mobility Computation

Figure 20D:
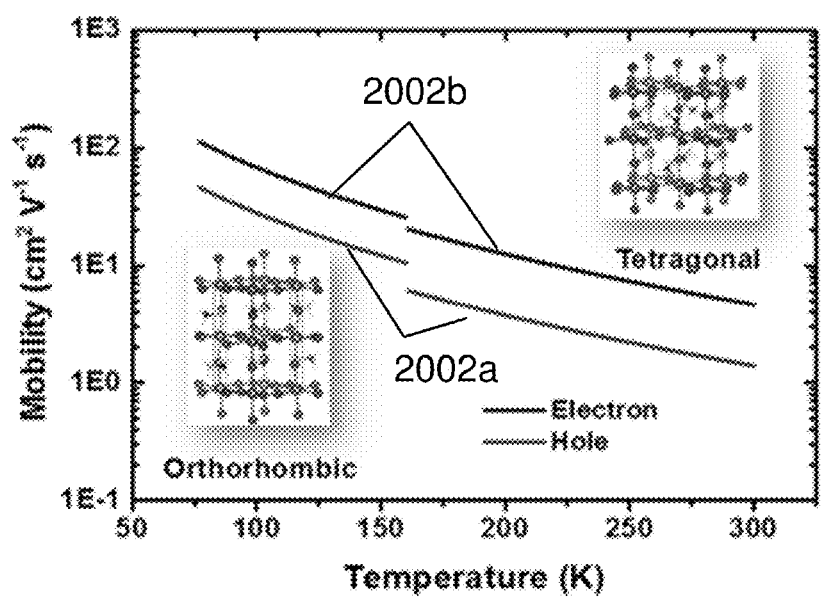
FIG. 20D is a plot of mobility (square centimetres per volt second or $cm^2V^{-1}s^{-1}$) as a function of temperature (kelvins or K) showing calculated temperature dependence hole and electron mobility in tetragonal (T=300 to 160 K) and orthorhombic (T=160 to 77 K) phases of $CH_3NH_3PbI_3$ according to various embodiments.
Figure 20E:
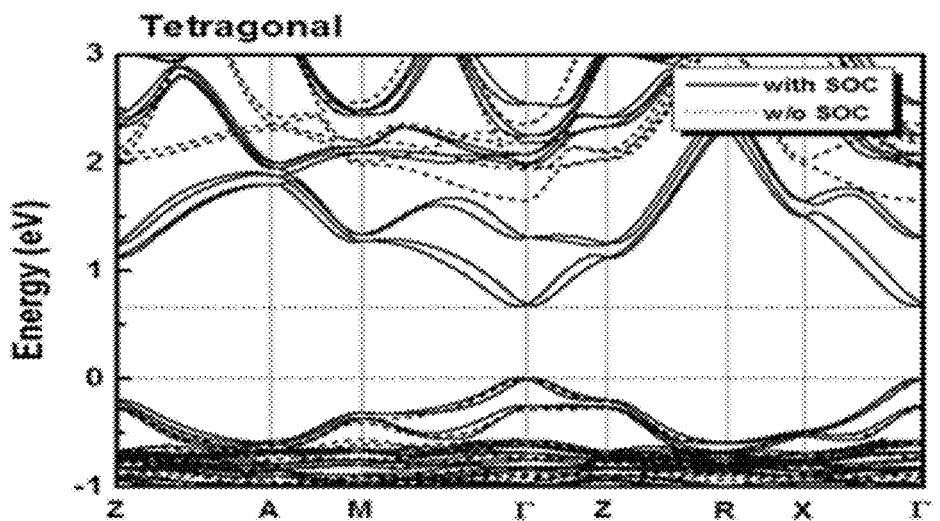
FIG. 20E is a plot of energy (electron volts or eV) as a function of momentum space showing the band structure dispersion of the tetragonal phase according to various embodiments obtained by density functional theory (DFT)-Perdew-Burke-Enzerhof method.
Figure 20F:
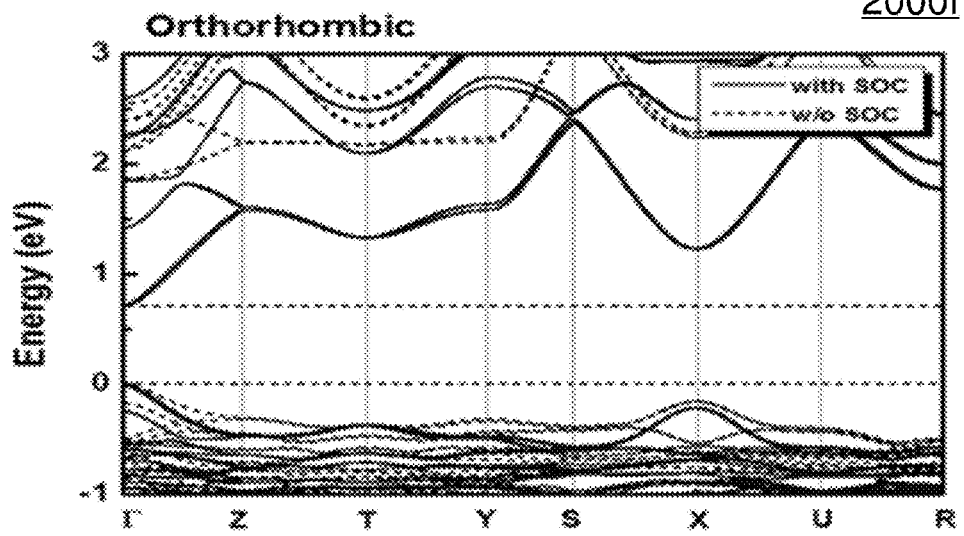
FIG. 20F is a plot of energy (electron volts or eV) as a function of momentum space showing the band structure dispersion of the orthorhombic phase according to various embodiments obtained by density functional theory (DFT)-Perdew-Burke-Enzerhof method.

FIG. 20D is a plot 2000d of mobility (square centimetres per volt second or cm$^2$V$^{-1}$s$^{-1}$) as a function of temperature (kelvins or K) showing calculated temperature dependence hole (2002a) and electron (2002b) mobility in tetragonal (T=300 to 160 K) and orthorhombic (T=160 to 77 K) phases of CH$_3$NH$_3$PbI$_3$ according to various embodiments. The crystal unit cells of the two phases are shown as insets. FIG. 20E is a plot 2000e of energy (electron volts or eV) as a function of momentum space showing the band structure dispersion of the tetragonal phase according to various embodiments obtained by density functional theory (DFT)-Perdew-Burke-Enzerhof method. FIG. 20F is a plot 2000f of energy (electron volts or eV) as a function of momentum space showing the band structure dispersion of the orthorhombic phase according to various embodiments obtained by density functional theory (DFT)-Perdew-Burke-Enzerhof method. The solid lines represent with spin-orbital coupling and the dotted line represent without spin-orbital coupling.

The DFT calculations have been carried out by the Perdew-Burke-Ernzerhof generalized gradient approximation using plane-wave self-consistent field (PWSCF) code implemented in the Quantum ESPRESSO package. For the structural optimization and band structure calculations, ultrasoft pseudopotentials including scalar-relativistic or full-relativistic effect were used to describe electron-ion interactions with electronic orbitals of H (1s$^1$); O, N and C (2 s$^2$, 2 p$^2$); I (5 s$^2$, 5 p$^2$) and Pb (5 d$^{10}$, 6 s$^2$, 6 p$^2$). The plane wave energy cutoff of wave function (charge) was set to be 40 (300) Ry. The crystal cell parameters were a=b=8.81 Å, and c=12.99 Å for tetragonal phase (I4/mcm space group); and a=8.77 Å, b=8.56 Å and c=12.97 Å for the orthorhombic phase (Pnma space group) of bulk CH$_3$NH$_3$PbI$_3$. The Monkhort-Pack scheme k-meshes are 4×4×4 for these two phases. The crystal cell and atomic positions were optimized until forces on single atoms were smaller than 0.01 eVÅ$^{-1}$. The molecular graphics viewer VESTA was used to plot molecular structures. The effective masses for electron (m$_e$*) and hole (m$_h$*) were estimated by fitting of the dispersion relation of $$m^* = \hbar^2 \left[\frac{\partial^2 \epsilon(k)}{\partial k^2}\right]^{-1}$$

from band structures in FIGS. 20E-F along the directions Γ-X, Γ-Z and Γ-M for tetragonal phase and Γ-X and Γ-Z for orthorhombic phase together with average values in these different routes.

The carrier lifetime was evaluated by the semi-classical Boltzmann transport theory. The only contribution of acoustic phonons was considered in evaluating scattering lifetime, where the charge carrier density (n) and mobility (μ) are approximated as $$n = \frac{(2m^* k_B T)^{3/2}}{3\pi^2 \hbar^3} {}^0F_0^{3/2} \quad (1)$$

$$\mu = \frac{2\pi \hbar^4 eB}{m_l^* (2m_b^* k_B T)^{3/2} \Xi^2} \frac{3 {}^0F_{-2}^1}{{}^0F_0^{3/2}} \quad (2)$$

where $${}^nF_l^m = \int_0^\infty \left(-\frac{\partial f}{\partial \zeta}\right) \zeta^n (\zeta + \alpha\zeta^2)^m [(1 + 2\alpha\zeta)^2 + 2]^{l/2} d\zeta \quad (3)$$

$$f = 1/(e^{\zeta-\xi} + 1) \quad (4)$$

$$\alpha = k_B T / E_g \quad (5)$$

k$_B$ is the Boltzmann constant, e is the elementary charge, T is the temperature, h is the Planck constant and ξ is the reduced chemical potential; m* is the density of state effective mass, m$_l$* is the conductivity effective mass, m$_b$* is the band effective mass; B is the bulk modulus $$\left(B = \frac{\partial^2 E}{\partial V^2}\right),$$

Ξ$_{e-p/h-p}$ is the electron-phonon (or hole-phonon) coupling energy (Ξ$_{e-p/h-p}$=V$_o$(ΔE$_{CBM/VBM}$/ΔV), n, m and l power integer indices, E$_g$ is the electronic band gap and ξ the reduced carrier energy. Note that the generalized gradient approximation method including spin orbital coupling yields largely underestimated values of the band gaps. Detailed estimate of the band gap values would require many-body perturbation theory (GW method). However, as the band structure is not significantly affected by GW correction, our calculations of the effective mass and mobility are still reliable.

FIG. 20G is a table 2000g showing estimated effective mass for electron and hole of CH$_3$NH$_3$PbI$_3$ calculated from band structure including spin-orbital coupling effect according to various embodiments. FIG. 20H is a table 2000h showing the required parameters for calculating mobilities. Band (m$_b$*), conductivity (m$_l$*) and density of state (m*) effective mass, electron (hole)-phonon coupling (Ξ), and bulk modulus (B).

To better understand the transport data, the mobility of CH$_3$NH$_3$PbI$_3$ for both tetragonal and orthorhombic crystallographic phases is estimated using semi-classical Boltzmann transport theory, upon deducing charge carrier effective masses and electron (hole)-phonon coupling. Electron and hole effective masses listed in FIG. 20G were derived by quadratic fitting of the band structure dispersion (FIGS. 20E-F); the corresponding fitting parameters are summarized in FIG. 20H. The average effective mass of electrons (tetragonal: 0.197 m$_0$, orthorhombic: 0.239 m$_0$) is consistently smaller than the one of holes (tetragonal: 0.340 m$_0$, orthorhombic: 0.357 m$_0$), similar to a previous report. The resulting mobilities (FIG. 20D) increase at lower temperatures due to the Boltzmann activation energy, in agreement with the trend of our experimental results. Although the calculated mobilities are substantially larger than the experimental values in FIG. 20A, calculations reflect fairly well the relative magnitude of electron versus hole mobility, as well as the different mobility of the two crystallographic phases. Within the entire temperature range investigated, electron mobilities exceed hole mobilities by approximately a factor of two, and increase by nearly one order of magnitude below the phase transition temperature ($\mu_e$=2,577-11,249 cm$^2$ V$^{-1}$ s$^{-1}$ and $\mu_h$=1,060-4,630 cm$^2$ V$^{-1}$ s$^{-1}$ for the orthorhombic phase and $\mu_e$=466-2,046 cm$^2$ V$^{-1}$ s$^{-1}$ and $\mu_h$=140-614 cm$^2$ V$^{-1}$ s$^{-1}$ for the tetragonal phase). The small experimental values can be partly attributed to the increase of effective masses by elastic carrier phonon scattering, which is expected in real crystals because of defects and disorder induced by the organic components, as well as carrier-carrier scattering at high-electron and hole concentrations. Formation of segregation pathways for hole and electron transport owing to the ferroelectric methylammonium cation could also elongate the carrier drifting path, hence lower carrier mobilities. In addition, polycrystalline domains typical of solution-processed $CH_3NH_3PbI_3$ thin films (shown in FIGS. 17A-B) are likely to weaken the electronic coupling between grains, requiring charge carriers to hop along and across domain boundaries, further reducing the effective carrier mobility. This is consistent with observation of giant photo-induced modulation of the dielectric constant, which was attributed to localized polaron hopping with relatively small activation energy.

Characteristics of LE-FET

The excellent ambipolar characteristics shown by the $CH_3NH_3PbI_3$ FET at low temperature (FIGS. 18A-B) are rather encouraging for the realization of light-emitting devices operating under balanced carrier injection. In particular, large carrier injection via charge accumulation at the semiconductor-dielectric interface is known to be an effective way to achieve bright and fast-switchable EL, and to optimize the spatial location of the carrier recombination zone in organic gate-assisted LE-FETs. In LE-FET devices, ambipolar channels are formed simultaneously by proper source-drain and gate biasing.

Under perfectly balanced conditions, holes and electrons injected from opposite electrodes recombine in the middle of the FET channel, thus defining a very narrow radiative emission zone, as depicted in FIG. 1B. The brightness of emission as well as the spatial position of the radiative recombination zone can be tuned by gate and drain-source biases. LE-FET structures have proved to improve the lifetime and efficiency of light-emitting materials, thanks to the large electrical injection achievable, and the possibility to optimize and balance charge carrier recombination compared with conventional LED devices. Combined with the ease of integration as nanoscale light sources in optoelectronic and photonic devices, this makes LE-FETs a very promising concept for applications in optical communication systems, solid-state lighting and electrically pumped lasers.

Indeed, our $CH_3NH_3PbI_3$ FETs emit light when operated in their ambipolar regime at low temperature (78-178 K). FIG. 21A is a plot 2100a of electroluminescence (arbitrary unit or a.u.) as a function of wavelength (nanometres or nm)/energy (electron-volts or eV) illustrating low-temperature electroluminescence (EL) spectra of $CH_3NH_3PbI_3$ light-emitting field-effect transistor according to various embodiments. The EL spectra is collected at $V_{ds}$=100V, $V_{gs}$=100V, normalized to their maximum peak. The spectra were fitted by three Gaussian curves (solid lines). The shift in peak position of the 750 nm peak (Peak 1, triangles), the 780 nm peak (Peak 2, circles) and the 800 nm peak (Peak 3, squares) is indicated by the dashed lines.

Note that no light emission could be observed above 198 K, most likely due to the ionic screening effects discussed earlier, so that low-temperature operation is necessary at this stage. Ionic screening is likely to be reduced in films with higher crystallinity as those recently reported, potentially enabling perovskite LE-FET operation up to room temperature. The emission spectra of the LE-FET are consistent with direct recombination of injected electrons and holes into the perovskite-active region. At the lowest temperature investigated (78 K), the EL spectrum shows three peaks centred at 750 nm (Peak 1), 780 nm (Peak 2) and 800 nm (Peak 3), with distinct amplitudes and spectral positions at the various temperatures. Although Peak 1 and Peak 3 appear only below 158 K, Peak 2 dominates the EL spectra at higher temperatures. A similar behaviour was very recently observed in photoluminescence spectra of $CH_3NH_3PbI_3$ films and single crystals, and related to the structural transition from a low temperature orthorhombic phase to a high-temperature tetragonal phase occurring around 162 K. Occurrence of this phase transition is predicted by density functional theory (see also DFT calculations in FIGS. 20E-F) and was confirmed to occur in the temperature ranges of 150-170K for $CH_3NH_3PbI_3$ and 120-140 K for hybrid $CH_3NH_3PbI_{3-x}Cl_x$ by light absorption studies. Thus, their characteristic temperature dependence suggests that Peak 1 and Peak 3 in our EL measurements are due to bound excitons in the low-temperature orthorhombic phase, whereas Peak 2 may be related to free excitons in the high temperature, smaller bandgap tetragonal phase.

Figure 21B:
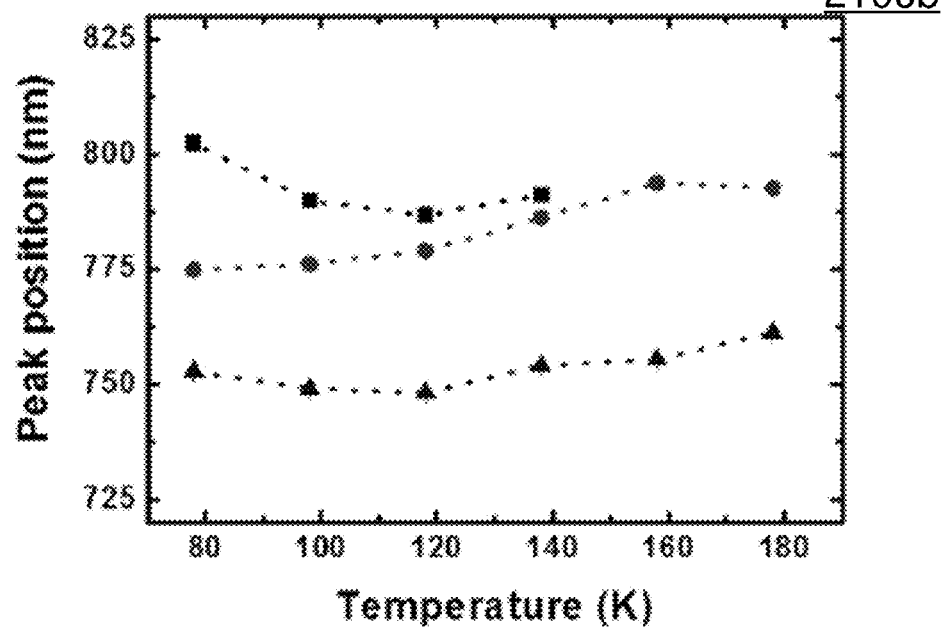
FIG. 21B is a plot of peak position of Peak 1 (triangles), Peak 2 (circles), and Peak 3 (squares) (nanometres or nm) as a function of temperature (kelvins of K) according to various embodiments.
Figure 21C:
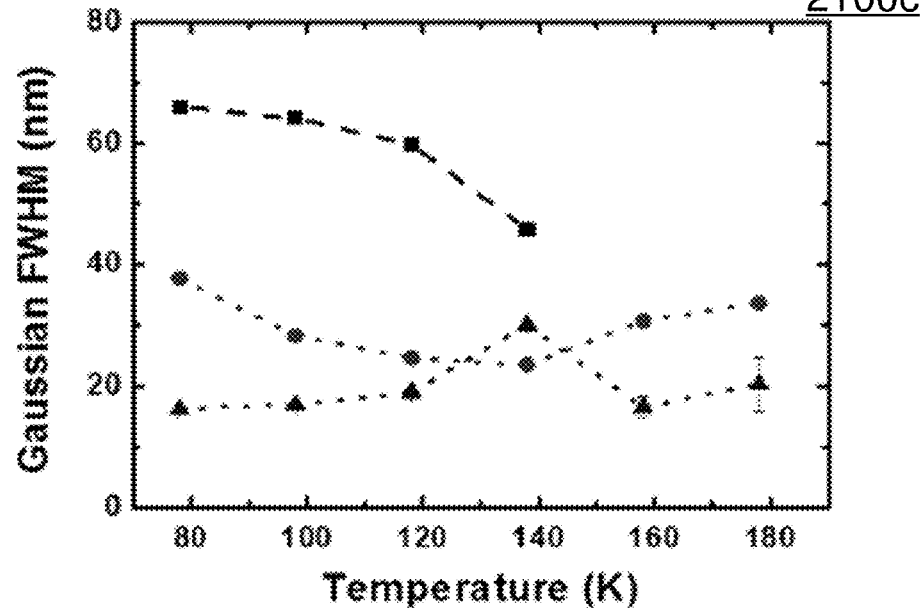
FIG. 21C is a plot of full-width-at-half-maximum (FWHM) of Peak 1 (triangles), Peak 2 (circles), and Peak 3 (squares) (nanometres or nm) as a function of temperature (kelvins of K) according to various embodiments.

FIGS. 21B-C are plots illustrating electroluminescence fitting parameters obtained from FIG. 21A. FIG. 21B is a plot 2100b of peak position of Peak 1 (triangles), Peak 2 (circles), and Peak 3 (squares) (nanometres or nm) as a function of temperature (kelvins of K) according to various embodiments. FIG. 21C is a plot 2100c of full-width-at-half-maximum (FWHM) of Peak 1 (triangles), Peak 2 (circles), and Peak 3 (squares) (nanometres or nm) as a function of temperature (kelvins of K) according to various embodiments. The values are obtained by fitting a deconvoluted double/triple peak Gaussian function on FIG. 21A.

To quantify the relative intensity and spectral energy of the three emission peaks as a function of temperature, we analysed the EL spectra by a deconvoluted Gaussian fitting (see Gaussian curves in FIG. 21A and corresponding fitted parameters in FIGS. 21B-C).

Although Peak 1 shows the expected blue shift at the lowest temperatures, its temperature dependence in the intermediate range 118-178 K is rather complicated (FIG. 21B). Peak 2 position slightly blue shifts over the whole temperature region, whereas Peak 3 shows a significant red shift in the 138-78 K region. Moreover, although the Gaussian full-width at half-maximum of Peak 1 reduces at lower temperatures, the full-width at half-maximum of Peak 2 and Peak 3 shows the opposite behaviour (FIG. 21C), as previously seen in low-temperature photoluminescence measurements.

Light Emission from FET Channel

To achieve simultaneous hole and electron injection in a LE-FET, the local gate potential at drain and source electrodes must be larger than the threshold voltage of either of the charge carrier (that is, $|V_d|>|V_{th,h}|$ and $V_s>V_{th,e}$, or $V_d>V_{th,e}$ and $|V_s|>|V_{th,h}|$). Under this condition, drain-source and gate voltages are tuned to control the injected current density of both carriers, which manipulate the spatial position of the emission zone as well as the EL intensity.

Figure 22:
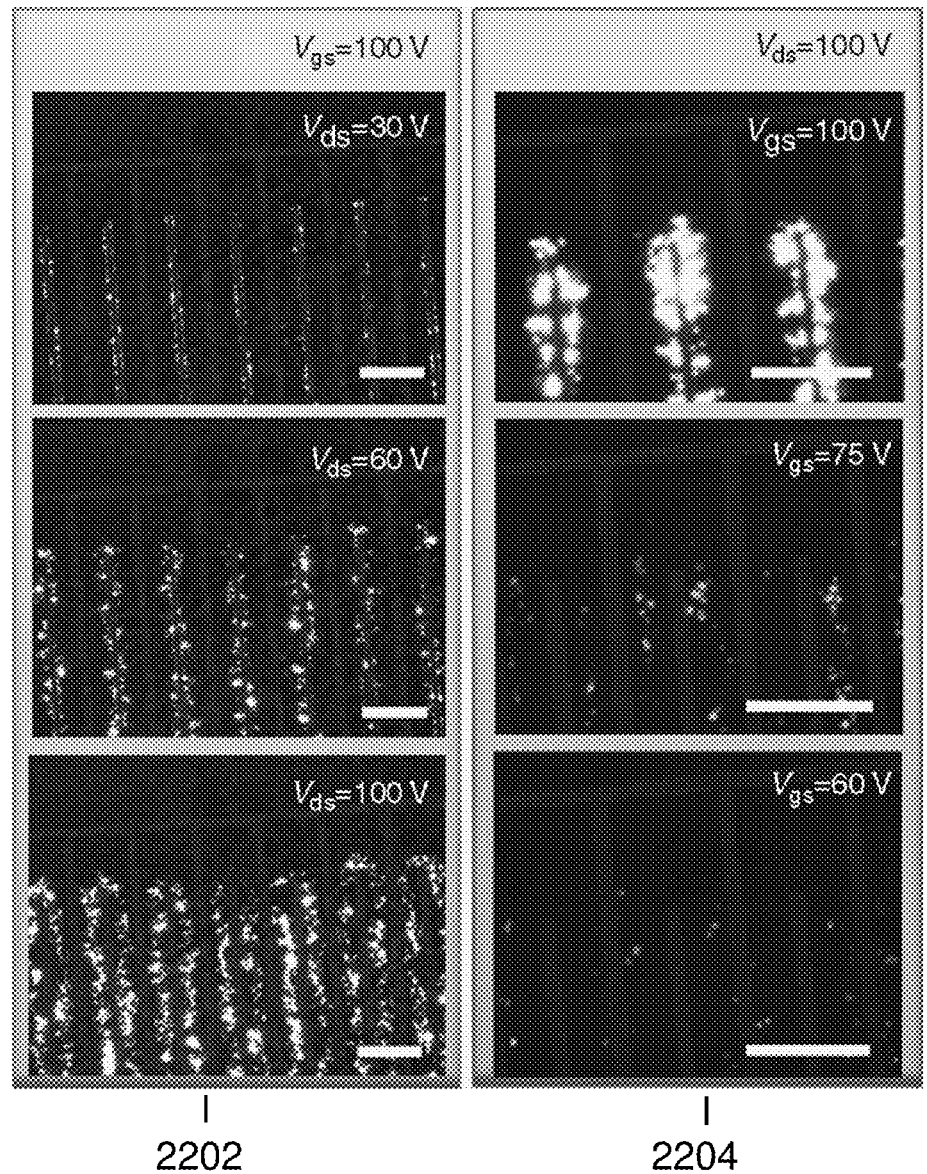
FIG. 22 shows microscope images of the emission zone of the LE-FET recorded at 158K under different biasing conditions according to various embodiments.

FIG. 22 shows microscope images of the emission zone of the LE-FET recorded at 158K under different biasing conditions according to various embodiments. The images indicated by 2202 are frame images extracted from a video recorded while sweeping $V_{ds}$ from 0 to 100V at constant $V_{gs}$=100V. The corresponding values of $V_{ds}$ are indicated in the panels. The images indicated by 2204 are frame images extracted from a video recorded while sweeping $V_{gs}$ from 0 to 100V at constant $V_{ds}$=100V. The corresponding values of $V_{gs}$ are indicated in the panels. The contrast of the metal contacts was slightly enhanced for clarity. The scale bars represent 200 μm.

Despite the grainy light emission pattern due to the polycrystalline nature of the film (FIGS. 17A-B), the EL emission zone can be clearly identified from the images. For a fixed gate bias of $V_{gs}$=100V (2202 of FIG. 22), the emission zone is mainly concentrated near the drain electrode when $V_{ds}$ is small ($V_{ds}$=30V). This is due to the limited injection of holes resulting from the relative low absolute local gate potential at the drain electrode $|V_d|$. By increasing $V_{ds}$, $|V_d|$ increases, thus more holes are injected into the active channel and the EL intensity increases ($V_{ds}$=60V). Further increase of hole injection extends the emission area to the centre of the channel, enhancing the EL intensity even further ($V_{ds}$=30V).

Conversely, for a fixed drain-source voltage of $V_{ds}$=100V (2204 of FIG. 22), the injected electron and hole current densities can no longer be regulated independently. The image at $V_{gs}$=100V shows extremely bright emission from nearby the drain electrodes because of the overwhelming density of injected electrons recombining with a comparatively lower density of injected holes. Decreasing the gate voltage reduces the local gate potential at the source electrode $V_s$ and increases $|V_d|$, thus decreasing electron injection and increasing hole injection. This pushes the emission zone to the centre of the active channel and reduces the EL intensity as overall current density decreases ($V_{gs}$=75V). A further reduction of gate voltage pushes the emission zone closer to the source electrode, further weakening the EL intensity ($V_{gs}$=60V). This demonstrates that full control of charge carrier injection and recombination in $CH_3NH_3PbI_3$ LE-FET can be easily achieved by adjusting its biasing conditions.

In summary, high-quality hybrid perovskite FETs have been fabricated and used to determine intrinsic transport parameters of $CH_3NH_3PbI_3$, which may be of great relevance to electro-optic devices (including solar cells). The main findings include the ambipolar nature of charge transport, the understanding of the origin and suppression of screening effects associated to the presence of ionic cations, the direct determination of electron and hole mobilities and their temperature dependence, and the effect of structural phase transition on the electronic properties of $CH_3NH_3PbI_3$, all in good agreement with first-principle DFT calculations. Furthermore, bright EL owing to radiative recombination within the transistor channel was demonstrated under balanced charge injection. We believe this demonstration of a $CH_3NH_3PbI_3$ LE-FET paves the way to the realization of solution-processed hybrid perovskite light-emitting devices such as high-brightness light-emitting diodes and electrical injection lasers. More work will be needed in this direction to minimize ionic screening, improve thin film crystallinity and optimize device architecture, for instance employing staggered FET configurations to increase carrier injection density or integrating surface microstructures for light management.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A light-emitting device comprising:
    an active structure comprising an emissive halide perovskite layer, the halide perovskite layer comprising a halide perovskite material;
    a first injection electrode electrically coupled to the active structure;
    a second injection electrode electrically coupled to the active structure;
    a control electrode; and
    an insulator layer between the control electrode and the active structure;
    wherein the first injection electrode is configured to inject electrons into the active structure and the second injection electrode is configured to inject holes into the active structure upon application of a potential difference between the first injection electrode and the second injection electrode; and
    wherein the control electrode is configured to generate an electric field upon application of a voltage, thereby causing simultaneous accumulation of the electrons and the holes in a region of the halide perovskite layer so that the electrons and the holes recombine, thereby emitting light.

2. The light-emitting device according to claim 1,
    wherein the control electrode is configured to allow at least a portion of light to pass through.

3. The light-emitting device according to claim 1, further comprising:
    a substrate;
    wherein the active structure, the control electrode, the first injection electrode, and
    the second injection electrode are over the substrate.

4. The light-emitting device according to claim 3,
    wherein the substrate is configured to allow at least a portion of light to pass through.

5. The light-emitting device according to claim 1, further comprising:
    a further control electrode.

6. The light-emitting device according to claim 5,
    wherein the insulator layer is between the further control electrode and the active structure.

7. The light-emitting device according to claim 5, further comprising:
    a further insulator layer;
    wherein the active structure is between the insulator layer and the further insulator layer; and
    wherein the further insulator layer is between the further control electrode and the active structure.

8. The light-emitting device according to claim 1, further comprising:
    wherein the active structure is between the first injection electrode and the second injection electrode.

9. The light-emitting device according to claim 1,
    wherein the active structure further comprises a semiconductor layer.

10. The light-emitting device according to claim 9,
    wherein the halide perovskite layer and the semiconductor layer form a heterojunction.

11. The light-emitting device according to claim 10,
    wherein the heterojunction is between the first injection electrode and the second injection electrode; and wherein the semiconductor layer is any one layer selected from a group consisting of a further halide perovskite layer, a hole transport layer, and an electron transport layer.

12. The light-emitting device according to claim 9, wherein the halide perovskite layer and the semiconductor layer form a vertical stacked arrangement.

13. The light-emitting device according to claim 10, wherein the semiconductor layer is an electron transport layer;
wherein the active structure further comprises a hole transport layer; and
wherein the halide perovskite layer and the hole transport layer form a further heterojunction.

14. The light-emitting device according to claim 13, wherein the halide perovskite layer is between the electron transport layer and the hole transport layer.

15. The light-emitting device according to claim 13, wherein at least one of the first injection electrode and the second injection electrode is in at least one of the electron transport layer and the hole transport layer.

16. The light-emitting device according to claim 1, wherein the insulator layer comprises a first dielectric section between the first injection electrode and the control electrode, and further comprises a second dielectric section between the second injection electrode and the control electrode, the second dielectric section substantially perpendicular to the first dielectric section.

17. The light-emitting device according to claim 1, wherein the insulator layer comprises an air gap.

18. A light-emitting array comprising:
a plurality of light-emitting devices, each light-emitting device comprising:
  an active structure comprising an emissive halide perovskite layer, the halide perovskite layer comprising a halide perovskite material;
  a first injection electrode electrically coupled to the active structure;
  a second injection electrode electrically coupled to the active structure;
  a control electrode; and
  an insulator layer between the control electrode and the active structure;
  wherein the first injection electrode is configured to inject electrons into the active structure and the second injection electrode is configured to inject holes into the active structure upon application of a potential difference between the first injection electrode and the second injection electrode; and
  wherein the control electrode is configured to generate an electric field upon application of a voltage, thereby causing simultaneous accumulation of the electrons and the holes in a region of the halide perovskite layer so that the electrons and the holes recombine, thereby emitting light.

19. A method of forming a light-emitting device, the method comprising:
forming an active structure comprising an emissive halide perovskite layer, halide perovskite layer comprising a halide perovskite material;
forming a first injection electrode electrically coupled to the active structure;
forming a second injection electrode electrically coupled to the active structure;
forming a control electrode; and
forming an insulator layer between the control electrode and the active structure;
wherein the first injection electrode is configured to inject electrons into the active structure and the second injection electrode is configured to inject holes into the active structure upon application of a potential difference between the first injection electrode and the second injection electrode; and
wherein the control electrode is configured to generate an electric field upon application of a voltage, thereby causing simultaneous accumulation of the electrons and the holes in a region of the halide perovskite layer so that the recombination of the electrons and holes at the region emits light.

20. A method of operating a light-emitting device, the method comprising:
applying a potential difference between a first injection electrode of the light-emitting device and a second injection electrode of the light-emitting device so that the first injection electrode injects electrons and the second injection electrode injects holes into an active structure of the light-emitting device electrically coupled to the first injection electrode and the second injection electrode;
applying a voltage to a control electrode of the light-emitting device, the light-emitting device comprising an insulator layer between the control electrode and the active structure, to generate an electric field thereby causing simultaneous accumulation of the electrons and the holes in a region of an emissive halide perovskite layer comprised in the active structure, wherein the halide perovskite layer comprises a halide perovskite material, so that the recombination of the electrons and the holes at the region emits light.

* * * * *